United States Patent
Cheng et al.

(10) Patent No.: US 7,622,779 B2
(45) Date of Patent: Nov. 24, 2009

(54) INTERCONNECTION ARCHITECTURE AND METHOD OF ASSESSING INTERCONNECTION ARCHITECTURE

(75) Inventors: Chung-Kuan Cheng, San Diego, CA (US); Hongyu Chen, La Jolla, CA (US); Bo Yao, La Jolla, CA (US); Ronald Graham, La Jolla, CA (US); Esther Y. Cheng, San Diego, CA (US); Feng Zhou, Shanghai (CN)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/526,523

(22) PCT Filed: Sep. 9, 2003

(86) PCT No.: PCT/US03/28620

§ 371 (c)(1),
(2), (4) Date: Mar. 1, 2005

(87) PCT Pub. No.: WO2004/025734

PCT Pub. Date: Mar. 25, 2004

(65) Prior Publication Data

US 2006/0049468 A1    Mar. 9, 2006

Related U.S. Application Data

(60) Provisional application No. 60/410,011, filed on Sep. 10, 2002, provisional application No. 60/410,396, filed on Sep. 11, 2002.

(51) Int. Cl.
H01L 29/76 (2006.01)

(52) U.S. Cl. .................. 257/401; 257/758; 257/776; 716/12; 716/13

(58) Field of Classification Search .............. 257/758, 257/401, 706, 216, 776, 206, 211; 716/12–14
See application file for complete search history.

(56) References Cited

U.S. PATENT DOCUMENTS

| | | | |
|---|---|---|---|
| 5,475,611 A | 12/1995 | Nagase et al. | |
| 5,578,840 A | 11/1996 | Scepanovic et al. | |
| 5,742,086 A * | 4/1998 | Rostoker et al. | 257/300 |
| 5,822,214 A * | 10/1998 | Rostoker et al. | 716/10 |
| 5,831,863 A | 11/1998 | Scepanovic et al. | |
| 6,407,434 B1 | 6/2002 | Rostoker et al. | |
| 6,597,362 B1 * | 7/2003 | Norman | 345/505 |

FOREIGN PATENT DOCUMENTS

JP    357143844 A  *  9/1982

OTHER PUBLICATIONS

RD 339051 A, Jul. 1992.*
International Technology Roadmap for Semiconductors: 2001 Edition — Interconnect (22 pp.).

(Continued)

*Primary Examiner*—Thinh T Nguyen
(74) *Attorney, Agent, or Firm*—Greer, Burns & Crain, Ltd.

(57) ABSTRACT

A multi-celled chip. The chip includes a plurality of hexagonal cells arranged in an array. A plurality of interconnects including Y's connect the cells in clusters of three cells each, so that each of the cells is interconnected.

12 Claims, 72 Drawing Sheets

OTHER PUBLICATIONS

Betz, V. and Rose, J., "Effect of the Prefabricated Routing Track Distribution on FPGA Area-Efficiency," in IEEE Trans. On VLSI, 6(3), pp. 445-456 (Sep. 1995).

Chen, H., Yao, B., Zhou, F. and Cheng, C., "The Y-Architecture: Yet Another On-Chip Interconnect Solution," Proc. of the Asia South Pacific Design Automation Conference, pp. 840-846, 2003.

Cheng, E., Zhou, F., Yao, B., Cheng, C., and Graham, R., "Balancing the Interconnect Topology for Arrays of Processors between Cost and Power," International Conference in Computer Design, Freiburg, Germany (Sep. 2002).

Dally, W. and Towles, B., "Route Packets, Not Wires: On-Chip Interconnection Networks," IEEE Proc. of the 38th Design Automation Conf. pp. 684-689, 2001.

Garg, N. and Konemann, J., "Faster and Simpler Algorithms for Multicommodity Flow and other Fractional Packing Problems," In Proc. of the 39th Annual Symposium on Foundations of Computer Science, pp. 300-309, 1998.

Igarashi, M., Mitsuhashi, T., Le, A., Kazi, S. Lin, Y., Fujimura, A. and Teig, S., "A Diagonal-Interconnect Architecture and Its Application in RISC Core Design," 2002 IEE International Solid-State Circuits Conference, Session 12/TD: Digital Directions/12.8.

Karmarkar, N., "A New Polynomial-time Algorithm for Linear Programming." Combinatorica, 4(4), pp. 373-395, 1984.

Khalid, M. and Rose, J.,"Experimental Evaluation of Mesh and Partial Crossbar Routing Architectures for Multi-FPGA Systems," in IFIP IWLAS '97, Grenoble, France, pp. 119-127 (Dec. 1997).

Leiserson, C., "Fat Trees: Universal Networks for Hardware—Efficient Supercomputing," IEEE Trans. On Computers, vol. C-34, No. 10, pp. 892-901 (Oct. 1985).

* cited by examiner (a) ⊥ Type  (b) Y Type (a)

(b)

```
Setup_Y_tree(C)
{
 sub-tree1 = Create_leaf(0,1);
 sub tree2 = Create_leaf(-1,0);
 sub-tree3 = Create_leaf(1,0);
 Tree=Compose_tree(sub-tree1,sub-tree2,
    sub-tree3,C(1));
 z = 2/3; x = 1, y = 1/3;
 for i=2:n
  {
   if (i is even)
    { z = z * 3; y = y * 3; }
   else
    x = x * 3;

case C(i)
    "up":
     { x1= x; x2= -x; x3=  0;
       y1= y; y2=  y; y3= -z; }
    "left":
     { x1= z; x2= -x; x3= -x;
       y1= 0; y2=  y; y3= -y; }
    "down":
     { x1= 0; x2= -x; x3=  x;
       y1= z; y2= -y; y3= -y; }
    "right":
     { x1= x; x2= -z; x3=  x;
       y1= y; y2=  0; y3= -y; }

Copy(sub-tree1,Tree);
   Copy(sub-tree2,Tree);
   Copy(sub-tree3,Tree);
   /* Copy Tree to sub-trees */
   Shift(sub-tree1, x1, y1);
```

FIG. 5A

```
    Shift(sub-tree2, x2, y2);
    Shift(sub-tree3, x3, y3);
    /* Shift the coordinates of every leaf in
       Tree by x(k) and y(k) respectively */
    Tree=Compose_tree(sub-tree1,sub-tree2,
       sub-tree3,C(i));
  }
}

Create_leaf(x,y)
{
 Create_tree_node(leaf);
 leaf->x = x;
 leaf->y = y;
 return(leaf);
}

Compose_tree(sub-tree1,sub-tree2,sub-tree3,
      orientation)
{
 Create_tree_node(new_root);
 new_root -> child1 = sub-tree1;
 new_root -> child2 = sub-tree2;
 new_root -> child3 = sub-tree3;
 new_root -> orientation = orientation;
 return(new_root);
}
```

```
Merge(A,B)
{
 /* Complement every bit in sequence B */
 BI = Bit_wise_complement(B);
 Bh = Reverse_bit_order(BI);
 do
   {
     /* Find the sub-sequences in A and Bh such
        that the two sub-sequences have the same
        pattern */
     if(Find_next_match(A,Bh,*(&sub) == false);
       break;

/* Judge if the result satisfies the
        requirements */
     if(Accept(A,Bh,sub == true)
       {
         /* Rewrite sequence A and B */
         Rewrite sequence A = (A1)(sub)(A2);
         Rewrite sequence B = (B1)RevFlip(sub)(B2);

/* Determine the sequences A12 and B12, which
            are the portions of A and B in the merged
            polygon C, respectively */
         Calculate A12 = ModMerge(A1, A2);
         Calculate B12 = ModMerge(B1, B2);

/* Merge A12 and B12 and get C */
         C = (A12)(B12);
         Output(C);
       }
   }
}

RevFlip(Sub)
{
   /* Sub1 is the bit-wise complement of sequence Sub */
   Sub1 = Bit_wise_complement(Sub);
   /* Sub2 is the sequence of reversing the bit order
      of Sub1 */
   Sub2 = Reverse_bit_order(Sub1);
   Return Sub2;
}

ModMerge(S1, S2)
{
   /* S3 is the sequence of S2 followed by S1 */
   S3 = (S2)(s1);
   S4 = Complement_the_first_bit(S3);
   S5 = Delete_the_last_bit(S4);
   Return S5;
}
```

FIG. 9

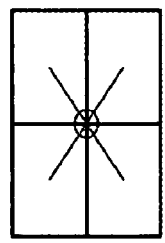
*FIG. 19A*
PRIOR ART
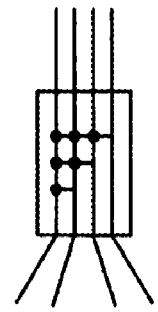
*FIG. 19B*
PRIOR ART
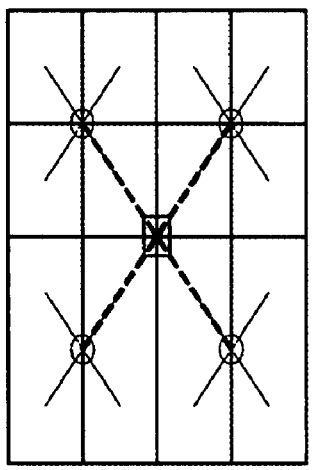 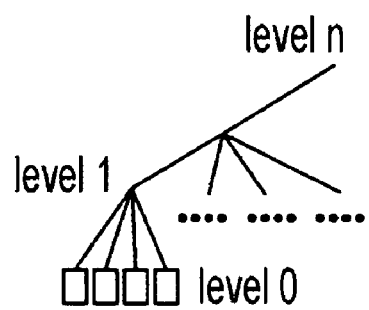
(c)
*FIG. 19C*
PRIOR ART

| $L_X$ | $D_X$ |
|---|---|
| $L_1 = 2\sqrt{2}$ | $D_1 = 6\sqrt{2}$ |
| $L_n = 4L_{n-1} + 2^{3n-2}\sqrt{2}$ | $D_n = 4D_{n-1} + 6 \cdot 2^{4n-4}\sqrt{2}(2^n-1)$ |

*FIG. 20*

Recursive form solutions for $L_Y$ and $D_Y$

| $L_Y$ |
|---|
| $L_1 = \sqrt{3}\,a$ <br> $L_n = 3L_{n-1} + 3^{\frac{3n}{2}-1} a$ |
| $D_Y$ |
| $D_1 = 2\sqrt{3}\,a$ <br> $D_n = 3D_{n-1} + (3+\sqrt{3})(3^{\frac{n}{2}}-1)\,3^{2n-2}\,a$ |

*FIG. 21*

| Model | L | D | M |
|---|---|---|---|
| a | $\dfrac{3n^2 - 2n}{8}$ | $\dfrac{n(n+1)(n-1)}{6}$ | $\dfrac{n^2(3n-2)(n-1)(n+1)}{48}$ |
| b | $\dfrac{n^2}{4}$ | $\dfrac{n(n+1)(n-1)}{6}$ | $\dfrac{n^3(n-1)(n+1)}{24}$ |

| Model | L | D | M |
|---|---|---|---|
| a | 8 | 8 | 64 |
| b | 5 | 8 | 40 |
| c | 4 | 10 | 40 |
| d | $4 + 2\sqrt{2}$ | $4 + 2\sqrt{2}$ | $24 + 16\sqrt{2}$ |
| e | $2\sqrt{2}$ | $6\sqrt{2}$ | 24 |
| f | 4 | 10 | 40 |

FIG. 26

| Model | L | D | M |
|---|---|---|---|
| Y | $\sqrt{3}$ | $2\sqrt{3}$ | 6 |
| Δ | 3 | 3 | 9 |

FIG. 28

| m | ΔL | ΔD | I |
|---|---|---|---|
| 0 | 32 | -1952 | 61 |
| 1 | 32 | -3840 | 120 |
| 2 | 128 | -14848 | 116 |
| 3 | 128 | -28672 | 224 |
| 4 | 512 | -106496 | 208 |
| 5 | 512 | -196608 | 384 |
| 6 | 2048 | -655360 | 320 |
| 7 | 2048 | -1048576 | 512 |
| 8 | 8192 | -2097152 | 256 |

| Type | L |
|---|---|
| With dead cells | $L_1 = \sqrt{3}$<br>$L_n = 3L_{n-1} + 6^{n-1}\sqrt{3}$ |
| Without dead cells | $L_1 = \sqrt{3}$<br>$L_n = 3L_{n-1} + 3^{n-1}\sqrt{3}^n$ |

| Type | D |
|---|---|
| With dead cells | $D_1 = 2\sqrt{3}$<br>$D_n = 3D_{n-1} + 2\sqrt{3}(2^{n-1} - 1)9^{n-1}$ |
| Without dead cells | $D_1 = 2\sqrt{3}$<br>$D_n = 3D_{n-1} + (\sqrt{3} + 3)(\sqrt{3}^n - 1)9^{n-1}$ |

Algorithm
For all $e \in E$, set $d_e = constant$
Repeat
For $j := 1$ to $k$ do  //k: number of distinct flow demands
  Begin
  Set $d(j) = \sigma$
  While $d(j) \neq 0$ do
    Begin
      Find shortest path $P$ for commodity flow demand $j$.
      Route $f = min\{c, d(j)\}$ units of flow along $P$, where $c$ is the capacity of the minimum capacity edge on this path.
      $d(j) = d(j) - f$
      Update $\{d_e\}$.
    End while
  End for
Find $\{C_1, C_2, ..., C_m\}$, such that $\sum_{e \in R(i)} d_e = \alpha_i$ and $\sum_i \alpha_i C_i = 1$
Update $\{d_e\}$
Until flow solutions converge

FIG. 51

Results of uniform edge capacity mesh

| n | Number of nodes | z |
|---|---|---|
| 2 | 4 | 0.3750 |
| 3 | 9 | 0.3333 |
| 4 | 16 | 0.2343 |
| 5 | 25 | 0.2000 |
| 6 | 36 | 0.1620 |
| 7 | 49 | 0.1429 |
| 8 | 64 | 0.1229 |
| 9 | 81 | 0.1111 |
| 10 | 100 | 0.0990 |

*FIG. 57*

Results of fixed total edge capacities

| N | Number of nodes | z | Improvement on z (%) |
|---|---|---|---|
| 2 | 4 | 0.375 | 0.00 |
| 3 | 9 | 0.333 | 0.00 |
| 4 | 16 | 0.281 | 20.01 |
| 5 | 25 | 0.240 | 20.00 |
| 6 | 36 | 0.208 | 28.57 |
| 7 | 49 | 0.185 | 28.56 |
| 8 | 64 | 0.169 | 33.32 |
| 9 | 81 | 0.148 | 33.35 |
| 10 | 100 | 0.134 | 36.36 |

FIG. 59

Optimal capacities for vertical edges in 6 by 6 mesh

| Col<br>Row | 1 | 2 | 3 | 4 | 5 | 6 | Sum |
|---|---|---|---|---|---|---|---|
| 1 | 0.60 | 0.74 | 0.79 | 0.79 | 0.74 | 0.61 | 4.28 |
| 2 | 0.95 | 1.19 | 1.27 | 1.28 | 1.19 | 0.96 | 6.85 |
| 3 | 1.07 | 1.34 | 1.44 | 1.44 | 1.34 | 1.07 | 7.71 |
| 4 | 0.95 | 1.19 | 1.27 | 1.27 | 1.19 | 0.96 | 6.85 |
| 5 | 0.60 | 0.74 | 0.79 | 0.79 | 0.74 | 0.60 | 4.28 |

FIG. 60

Results of 45-degree mesh

| N | Number of nodes | z |
|---|---|---|
| 2 | 5 | 0.250 |
| 3 | 13 | 0.250 |
| 4 | 25 | 0.209 |
| 5 | 41 | 0.174 |
| 6 | 61 | 0.147 |
| 7 | 85 | 0.126 |
| 8 | 113 | 0.106 |
| 9 | 145 | 0.101 |
| 10 | 181 | 0.0828 |
| 11 | 221 | 0.0759 |
| 12 | 265 | 0.0673 |

FIG. 62

90-degree routing 90-degree routing

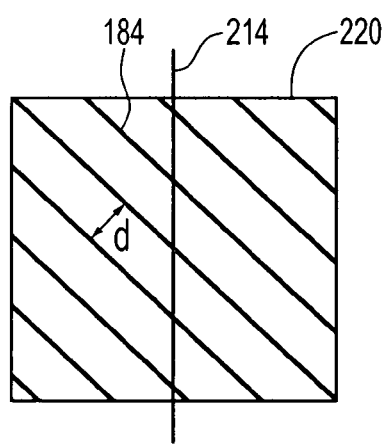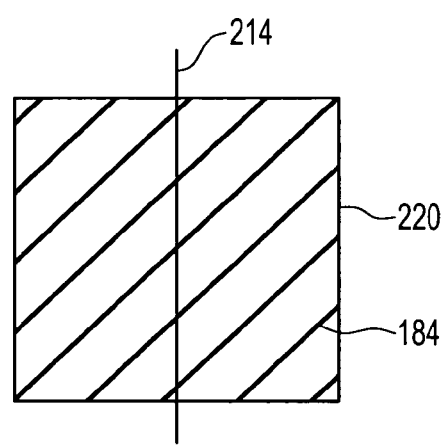
45-degree routing
FIG. 65A
45-degree routing
FIG. 65B

Results of 90-degree and 45-degree mixed mesh

| n | z | Improvement to z (%) | $C_1$ | $C_2$ | $\sqrt{2} \cdot C_2 / C_1$ |
|---|---|---|---|---|---|
| 2 | 0.375 | 0.00 | 1.0000 | 0.0000 | 0.00 |
| 3 | 0.333 | 0.00 | 1.0000 | 0.0000 | 0.00 |
| 4 | 0.245 | 4.85 | 0.2290 | 0.5452 | 3.36 |
| 5 | 0.219 | 9.53 | 0.2577 | 0.5249 | 2.88 |
| 6 | 0.185 | 14.04 | 0.1853 | 0.5761 | 4.39 |
| 7 | 0.166 | 16.01 | 0.2022 | 0.5641 | 3.94 |
| 8 | 0.148 | 20.11 | 0.1614 | 0.5930 | 5.19 |
| 9 | 0.134 | 20.40 | 0.1696 | 0.5872 | 4.89 |
| 10 | 0.120 | 21.31 | 0.1553 | 0.5988 | 5.44 |
| 11 | 0.110 | 21.48 | 0.1608 | 0.5935 | 5.22 |
| 12 | 0.101 | 22.05 | 0.1527 | 0.5992 | 5.55 |
| 13 | 0.094 | 22.14 | 0.1562 | 0.5967 | 5.40 |
| 14 | 0.087 | 22.68 | 0.1510 | 0.6004 | 5.62 |
| 15 | 0.082 | 22.71 | 0.1536 | 0.5986 | 5.51 |
| 16 | 0.076 | 22.95 | 0.1504 | 0.6008 | 5.65 |
| 17 | 0.0723 | 23.02 | 0.1524 | 0.5994 | 5.56 |

FIG. 66

| N | z(I) | z(II) | z(III) | z(IV) |
|---|---|---|---|---|
| 5 | 0.0173 | 0.0147 | 0.0147 | 0.0171 |
| 6 | 0.0102 | 0.0083 | 0.0083 | 0.0101 |
| 7 | 0.0065 | 0.0053 | 0.0051 | 0.0064 |
| 8 | 0.0041 | 0.0034 | 0.0034 | 0.0041 |

*FIG. 68*

| n | #nodes | M-architecture | Y-architecture | | X-architecture | | |
|---|---|---|---|---|---|---|---|
| | | thrpt | n.thrpt | n..thrpt | impr.(%) | n.thrpt | impr. (%) | $\sqrt{2} \cdot C_2/C_1$ |
| 2 | 4 | 2.50E-1 | 2.00 | 2.00 | 0 | 2.00 | 0 | 0.00 |
| 3 | 9 | 8.33E-2 | 2.25 | 2.25 | 0 | 2.25 | 0 | 0.00 |
| 4 | 16 | 3.12E-2 | 2.00 | 2.36 | 18.0 | 2.60 | 29.8 | 3.36 |
| 5 | 25 | 1.67E-2 | 2.09 | 2.40 | 20.1 | 2.68 | 28.1 | 2.88 |
| 6 | 36 | 9.26E-3 | 2.00 | 2.41 | 20.4 | 2.65 | 32.8 | 4.39 |
| 7 | 49 | 5.95E-3 | 2.04 | 2.41 | 20.4 | 2.67 | 31.1 | 3.94 |
| 8 | 64 | 3.90E-3 | 2.00 | 2.38 | 19.1 | 2.69 | 34.6 | 5.19 |
| 9 | 81 | 2.78E-3 | 2.03 | 2.45 | 22.5 | 2.69 | 32.7 | 4.89 |
| 10 | 100 | 1.98E-3 | 2.00 | 2.43 | 21.3 | 2.67 | 33.3 | 5.44 |
| 11 | 121 | 1.51E-3 | 2.01 | 2.46 | 23.1 | 2.70 | 34.4 | 5.12 |
| 12 | 144 | 1.16E-3 | 2.00 | 2.43 | 21.4 | 2.69 | 34.5 | 5.26 |
| 13 | 169 | 9.15E-4 | 2.01 | 2.43 | 21.5 | 2.70 | 34.4 | 5.33 |
| 14 | 196 | 7.29E-4 | 2.00 | 2.43 | 21.5 | 2.69 | 34.5 | 5.62 |
| 15 | 225 | 5.95E-4 | 2.01 | 2.43 | 21.6 | 2.70 | 34.5 | 5.51 |
| 16 | 256 | 4.88E-4 | 2.00 | 2.44 | 22.0 | 2.69 | 34.6 | 5.65 |
| 17 | 289 | 4.08E-4 | 2.00 | 2.45 | 22.5 | 2.70 | 34.6 | 5.56 |

FIG. 70

| Level | #nodes | throughput | Normalized throughput |
|---|---|---|---|
| 1 | 7 | 1.86E-1 | 2.02 |
| 2 | 19 | 1.69E-2 | 2.32 |
| 3 | 37 | 1.15E-3 | 2.48 |
| 4 | 61 | 5.33E-3 | 2.58 |
| 5 | 91 | 2.28E-3 | 2.61 |
| 6 | 127 | 4.41E-4 | 2.61 |
| 7 | 169 | 1.29E-4 | 2.62 |

FIG. 74

| Level | #nodes | Throughput | Normalized throughput |
|---|---|---|---|
| 2 | 29 | 2.31E-2 | 2.34 |
| 3 | 61 | 5.45E-3 | 2.51 |
| 4 | 101 | 3.01E-3 | 2.63 |
| 5 | 169 | 1.36E-3 | 2.74 |
| 6 | 281 | 5.75E-4 | 2.84 |

FIG. 75

| Level | #nodes | Throughput | Normalized throughput |
|---|---|---|---|
| 2 | 5 | 1.25E-1 | 1.78 |
| 3 | 13 | 4.20E-2 | 1.80 |
| 4 | 25 | 1.74E-2 | 2.09 |
| 5 | 41 | 8.71E-3 | 2.23 |
| 6 | 61 | 4.92E-3 | 2.30 |
| 7 | 85 | 3.00E-3 | 2.32 |
| 8 | 113 | 1.89E-3 | 2.36 |
| 9 | 145 | 1.39E-3 | 2.37 |
| 10 | 181 | 9.23E-4 | 2.38 |
| 11 | 221 | 6.90E-4 | 2.38 |
| 12 | 265 | 5.11E-4 | 2.39 |

FIG. 76

INTERCONNECTION ARCHITECTURE AND METHOD OF ASSESSING INTERCONNECTION ARCHITECTURE

PRIORITY CLAIM

Applicants claim priority benefits under 35 U.S.C. § 119 on the basis of Patent Application No. 60/410,011, filed Sep. 10, 2002 and Application No. 60/410,396, filed Sep. 11, 2002.

STATEMENT OF GOVERNMENT INTEREST

This invention was made with Government assistance under NSF Grant No. 9987678. The Government has certain rights in this invention.

TECHNICAL FIELD

The present invention relates generally to the field of chip design and fabrication. The present invention also relates generally to the field of circuit routing.

BACKGROUND ART

With submicron technology, large numbers of processors, elements, or devices can be integrated on microcircuit chips. The processors, elements, or devices are arranged in arrays of cells on one or more layers of a chip. Each of the cells, containing a component of one or more overall circuits, contains one or more terminals for communicating with other cells. To permit the cells to communicate with one another interconnects, such as routing wires or other conductive paths, connect the cells and/or bus segments, which themselves interconnect groups of cells.

The interconnects are arranged in meshes formed in or among one or more interconnect layers (also known as routing layers) of a microcircuit chip. A mesh is a common routing architecture for many reconfigurable computing systems. Both conventional and more recently proposed on-chip multiprocessor systems use mesh networks as communication backbones.

The microcircuit chips typically include a plurality of interconnect layers for interconnection of the cells. Pluralities of layers are often used for individual interconnections due to design constraints, for example. Vias help to route the interconnects between pluralities of layers. Connections are switched by devices such as, but not limited to, metal oxide semiconductor (MOS) devices.

High-performance system-on-a-chip (SoC) requires non-blocking interconnects between the array of cells on the chip. With nonblocking interconnects, when a cell needs to communicate with another cell, a route always exists for communication.

Interconnects have become one of the most precious resources on a chip. Length of connection between cells is a limiting performance factor in terms of power consumption and latency, among other factors. Unreasonable distribution of interconnect resources results in bottlenecks that stall data flow, while leaving other routing resources wasted. Furthermore, it is impractical to resolve this problem merely by enlarging a channel capacity of an entire array.

A long path through interconnects increases power consumption and signal delay. Additionally, a common physical embodiment of multiprocessor arrays is CMOS technology. In CMOS technology, power dissipation is proportional to interconnect capacitance, which in turn is proportional to a distance traveled by a signal. Thus, it is highly desirable to provide an architecture in which interconnection length is minimized. It is also desirable to provide an architecture that includes the shortest totals of route lengths between processors, and not interconnect length alone.

One predominant type of interconnect mesh is Manhattan architecture, so-called because its rectilinear connection arrangement resembles a city street grid. Manhattan architecture, however, requires lengths of interconnects that far exceed actual (Euclidean) distances between individual cells due to, for example, the requirement for orthogonal circuit paths.

More recently, an alternative chip architecture known as X-architecture has been introduced to reduce interconnection lengths versus Manhattan architecture. X-architecture uses tree structures having recursive patterns to interconnect cells in a nonblocking interconnection architecture. The tree structures may take the form of H-shaped patterns or X-shaped patterns, with the cells located at the extremities of each pattern. The interconnects are oriented, for example, in 0°, 45°, 90°, and 135° directions. X-architecture has been disclosed as a solution to address microcircuit chip designs, especially chips with five or more routing layers.

Interconnection between all cells is provided by a specific hierarchical structure. For example, at a level "zero", four cells may be interconnected by an "X". At a higher level, say, level "1", four level "zero" "X's" are interconnected by a larger "X". At a still-higher level ("2"), four level "1" "X's" are interconnected by a still-larger "X", etc. Performance improvement of the X-architecture over the Manhattan architecture has been demonstrated.

DISCLOSURE OF INVENTION

The present invention provides, among other features, a multi-celled chip. The chip includes arrays of hexagonal cells arranged on at least one component layer. A plurality of interconnects including Y's that connect the cells in clusters of three cells each. Each of the Y's has a node and three interconnects connecting the node to respective ones of the cells within a cluster, wherein each Y connects each cell of its respective cell group to the node.

The present invention also provides a number of methods to assess particular interconnection architectures, including providing a cost function and an assessment method based on a multi-commodity flow model. Exemplary embodiments of chips and interconnection architectures are also provided that are selected using the assessment methods provided. Bridges are also provided for directly connecting cells of a chip, and methods are provided for determining optimum locations of the bridges.

BRIEF DESCRIPTION OF DRAWINGS

FIGS. 5A and 5B collectively show an exemplary algorithm for expanding Y-trees according to a preferred method;

FIG. 9 shows an exemplary algorithm for merging two polygons according to a preferred method;

FIGS. 19A-19C show prior art X-architecture model, a switch, and a larger X-tree, respectively, with an illustration of hierarchical levels;

FIG. 20 is a table showing Lx and Dx calculations for the X-architecture of FIGS. 19A and 19B, according to an exemplary cost function of the present invention;

FIG. 21 is a table showing Lx and Dx calculations for a Y-architecture model;

FIG. 24 shows a cost function showing calculation of L, D, and M for the cell structures of FIGS. 22 and 23 according to a method of the present invention;

FIG. 26 is a table showing calculation of L, D, and M for the models of FIGS. 25A-25F;

FIG. 28 is a table showing calculation of L, D, and M for the models of FIGS. 27A-27F;

FIG. 35 is a table showing derivative benefits for bridges of different levels of the architecture of FIG. 30A according to a method of the present invention;

FIG. 41 shows calculations of L and D for possible bridges for the model of FIG. 39;

FIG. 51 shows pseudo-code of a preferred multi-commodity flow (MCF) algorithm according to an embodiment of the present invention;

FIG. 57 is a table showing throughputs of uniform edge capacity meshes according to an embodiment of the present invention according to an embodiment of the present invention;

FIG. 59 is a table showing throughputs of meshes having fixed edge capacities according to an embodiment of the present invention;

FIG. 60 is a table showing optimal capabilities for vertical edges in a 6×6 mesh according to an embodiment of the present invention;

FIG. 62 is a table illustrating results of a 45° mesh according to an embodiment of the present invention;

FIGS. 65A-65B are schematics showing routing layers for 45° routing according to an embodiment of the present invention;

FIG. 66 is a table showing throughputs for 45° and 90° mixed mesh according to an embodiment of the present invention;

FIG. 68 is a table showing throughputs of the multiple routing layer assignments of FIG. 38 according to an embodiment of the present invention;

FIG. 70 is a table showing throughputs of an n×n mesh using Manhattan architecture, Y-architecture, and X-architecture, respectively, according to an embodiment of the present invention;

FIG. 74 is a table showing throughput of symmetrical hexagonal meshes connected using Y-architecture;

FIG. 75 is a table showing throughput of symmetrical octagonal meshes connected using X-architecture according to an embodiment of the present invention;

FIG. 76 is a table showing throughput of symmetrical octagonal meshes connected using Manhattan architecture according to an embodiment of the present invention.

BEST MODE FOR CARRYING OUT THE INVENTION

Figure 1:
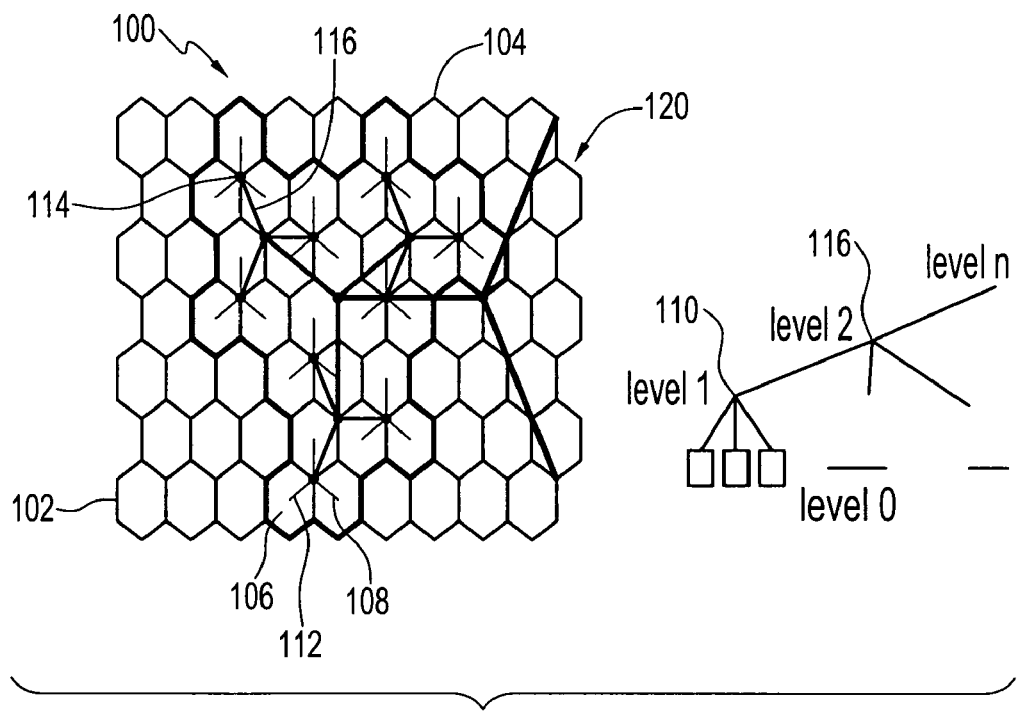
FIG. 1 shows a chip having cells connected by Y-architecture according to a preferred embodiment of the present invention, including a chart showing hierarchical levels of connection.

Interconnections among the cell array reveal themselves as a key problem, as the interconnect becomes one of the most precious resources on a chip. With the advent of deep sub-micron technologies, switches are becoming less costly, yet interconnects such as wires are still expensive. Therefore, optimization efforts according to embodiments of the present invention focus on the interconnect resources.

Traditional Manhattan interconnect architecture organizes interconnects on two orthogonal routing directions, 0° and 90°, for the simplicity of routing embedding and design rule checking. However, this artificial restriction on routing directions adds significant interconnect length compared with the Euclidean optimum, and thus decreases the communication capability of the on-chip interconnects.

One goal of certain embodiments of the present invention is to allocate channel capacities in a mesh routing architecture to improve, or maximize, its communication capability. Communication capability can be measured by the throughput, which is the amount of information that every pair of nodes can exchange simultaneously. Throughput is a function of channel capacity and the dimension of the processor array.

Chips have been disclosed including non-rectilinear interconnects to improve the efficiency of on-chip interconnects. Most of these chips have introduced 45° short jogs to improve routability of the chip in the detailed routing stage. Even in this architecture, however, the majority of the interconnects on the chip have still been routed in directions of either 0° or 90°.

As an alternative to the traditional, Manhattan architecture, Mutrunoi et al. proposed an on-chip architecture known as X-architecture, which is designed to target designs having five or more routing layers. I. Mutsunori, T. Mitsuhashi, A. Le, S. Kazi, Y. Lin, A. Fujimiura, and S. Teig, "A Diagonal Interconnect Architecture and Its Application to RISC Core Design," Proc. ISSCC, pp. 684-689, San Jose, Calif., February 2002. In X-architecture, interconnects are arranged in 0°, 45°, 90°, and 135° directions. This design has been shown to achieve significant chip performance improvement and power reduction over Manhattan architecture.

However, with X-architecture, it is possible for two nodes to be physically adjacent on a chip layer and yet be on different tree structures on the same level. Furthermore, these respective tree structures may be linked to separate tree structures on a higher level, or even a still-higher level, until a level is reached, called a root, that is a common ancestor to the cells. Consequently, a greatly extended path length through interconnects may have to be traversed to interconnect two cells even through they may be physically adjacent. It is desirable to gain still further improvement in performance, including power consumption and speed.

Another constraint on throughput of an active device array is the problem of getting a signal or power from one area, for example a quadrant, of a chip to another. To do so, a middle row or middle column in the interconnect mesh typically must be traversed. Due to the normal distribution of interconnections, a middle row or middle column of the interconnect mesh tends to create a bottleneck effect. Enlarging the congested area will not itself produce better throughput. It is therefore desirable to provide an improved geometry to increase throughput.

According to an embodiment of the present invention, a configuration is provided in which an interconnect architecture includes one or more Y's to connect clusters of cells. A Y is a structural routing model in which interconnects, or legs, extend in three separate directions from a common node. An architecture formed of Y's is termed herein a Y-tree, and allows interconnection among some or all cells in a hexagonal pattern. Groups of Y's routed together form Y-trees. In an exemplary embodiment, individual Y's on a particular level connect clusters of cells, and these Y's are interconnected by Y's on higher levels. In the higher levels, a Y on a next-higher level is preferably rotated with respect to the Y on the next-lower level.

For example, an interconnect mesh having Y-architecture is provided in a multi-element integrated circuit chip array. Interconnects are routed in three directions, e.g. 0°, 60°, and 120°; or 0°, 120°, and 240°. The mesh preferably comprises a plurality of layers. In an additionally preferred aspect, the cells are arranged in a hexagonal array and embodied in a chip having a shape of a convex polygon, such as a hexagonal chip. Individual Y's connect clusters of the hexagonal cells. Diagonal routing technology allows different arrangements of interconnect structure. Methods for fabricating diagonal routing are provided in, for example, I. Mutsunori, T. Mitsuhashi, A. Le, S. Kazi, Y. Lin, A. Fujimiura, and S. Teig, "A Diagonal Interconnect Architecture and Its Application to RISC Core Design," Proc. ISSCC, pp. 684-689, San Jose, Calif., February 2002.

In a preferred embodiment, the hexagonal cell array produces a flow congestion pattern that does not include the center of the hexagonal pattern. However, the benefit of producing a flow congestion pattern that does not include the center of the hexagonal pattern is not a function of any particular values of angles between the legs of individual Y's. Particular angles of the legs are not required; for example, 0°, 60°, and 120°, are merely an exemplary choice for artwork design. However, legs in one cell should be configured to connect with legs in a next cell. Wide tolerances between the specific values of the tree angles are allowed, while providing the same utility of the Y's. For example, a Y having legs at 0°, 150°, and 210° (forming a more traditional "Y" shape) could be provided.

The hexagonal cell array also has the property of hierarchical expansion. An algorithm is provided to set up a hierarchical tree of interconnect, and another algorithm is provided to set up a communication route in the architecture for pairs of processors in the array. It has been determined that the Y-architecture approaches the X-architecture in terms of optimizing wire resources. Additionally, algorithms for the merge of polygons on a hexagonal backbone are provided, which is useful in analysis of very large Y-trees.

According to an additional embodiment of the present invention, a cost function is provided to balance the cost of interconnect resources and the power consumption for the interconnect topology on a cell array. The total interconnect length is used to measure the cost of the interconnect resources, and the length of signal paths is used to evaluate the power consumption, since the power consumption is proportional to the interconnect capacitance, which in turn is proportional to the traveling distance of a signal.

An exemplary application of the cost function is used herein to compare shapes of meshes of cells. Each form of connection can be arranged in differently shaped meshes. For example, Manhattan architecture is most readily arranged in a square mesh; however, it may also be embodied in a diamond-shaped mesh, which may be visualized as a square rotated by 45° from the position in which it rests on a side. Furthermore, the X-architecture lends itself to arrangement in an octagonal mesh, among other mesh shapes. To provide geometry less susceptible to bottlenecks, embodiments of the present invention provide alternative polygonal meshes, which may be formed using dies, for example.

According to an exemplary application of the cost function, the X-type nonblocking architecture ("X-architecture") has been found to have a good tradeoff for a two-dimensional processor array. A significant benefit to X-architecture is that it can be hierarchically expanded. This benefit has been shown to be applicable to Y-architecture as well. The X-architecture and Y-architecture, along with other architectures, can be compared using the provided cost function.

Methods also are provided for determining locations of optimal additional interconnects between certain cells, buses, and/or switches. These methods help to overcome some of the deficiencies in prior architectures, while continuing to require a minimum cost of interconnects and communication resources.

A method for assessing routing architecture is also provided. The Y-architecture of the present invention, having three routing directions, is compared with the Manhattan architecture and the X-architecture (with two and four routing directions, respectively). Using Y-architecture potentially gains a throughput improvement of 33.3% over the traditional Manhattan architecture on a square mesh. The Y-architecture produces nearly the same (2.6%) throughput as the X-architecture on a square mesh, yet using one less routing direction.

Furthermore, the Y-architecture achieves an average of 13.4% interconnect length reduction over Manhattan architecture, and approaches (4.3% less) the reduction of the X-architecture, while providing a simpler design. Still further, making the shape of the chip a convex polygon, and preferably closer to a circle, significantly improves the throughput over the rectangular chip. Using Y-architecture, a hexagonal chip can produce 41% more throughput than a square chip using Manhattan architecture, without causing dead space on the wafer.

The described Y-architecture and other optimization methods are applicable not only to chip design, but to other areas such as, but not limited to, wireless communications. In an exemplary wireless communication design base stations may be seated at the centers of the hexagonal areas in an array, and a route between the base stations may form the main part of the wireless communication route. The high performance solutions to communication among the base stations are quite similar to those of an array of processors on a chip. Therefore, the methods described herein are applicable to optimization of interconnect of base stations to balance cable resources and power consumptions.

Referring now to the drawings, FIG. 1 shows a chip 100 including an array 102 of hexagonal cells 104 (which may include processors or other chip components) interconnected through Y-architecture. The cells 104 have the physical shape of hexagons. Similar to X-architecture, the hexagonal cell array 102 can be expanded hierarchically.

As shown in FIG. 1, the array 104 is divided into clusters 106 of three cells 104. Every three cells 104 within the cluster on a level zero are interconnected with a Y 108 on a first level 110, as described above. Each Y 108 has three legs 112 of interconnects oriented in, for example, 0°, 120°, and 240° (symmetrical) routing directions, respectively, from a preferably central node 114.

As also shown in FIG. 1, clusters of three nodes 114 of individual Y's 108 on the first level 110 are in turn clustered with a second level 116 of Y's. One level of the Y 108 is made up of at lease three routing layers, one for each direction. The number of routing layers for a level of the Y 108 can vary, depending on how many layers are needed for each direction of the Y. Each of the second level 116 of Y's 108 in the embodiment shown is rotated 90° from the Y's of the first level 110. By recursively arranging the Y's 108 in this manner, a hierarchical Y-tree 120 can be provided without empty or dead cells (cells not connected to a remainder of the Y-tree), as shown.

In the Y-tree 120 shown in FIG. 1, three subtrees (lower level Y-shaped trees) are clustered on each level, and the length of the line segment, or leg of a n-th level Y, $T_n = \sqrt{3} T_{n-1}$. At the second level, $3^2$ hexagonal cells are bounded by the dashed line shown.

Figure 2A:
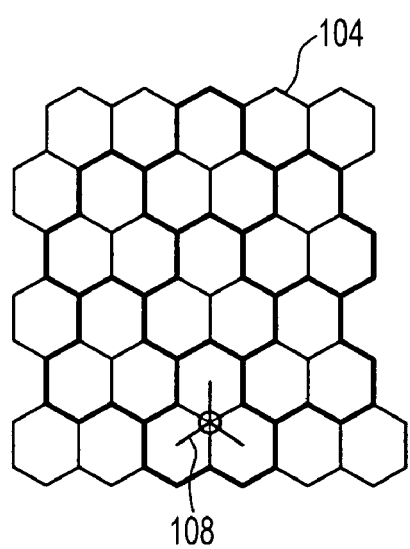
FIGS. 2A and 2B show cells connected by inverted and upright orientations of Ys, according to exemplary embodiments.
Figure 2B:
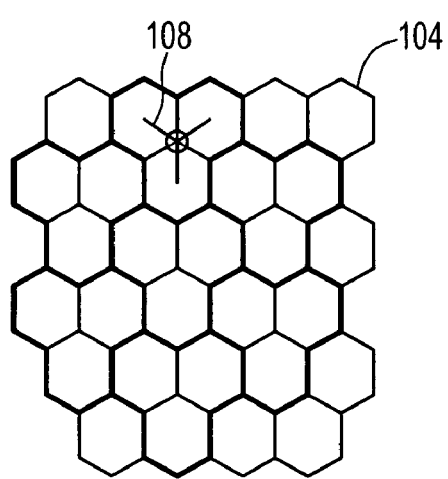

The Y-architecture preferably is routed upon the hexagonal array 102 including a number of rows. This array 102 preferably has the following properties: (1) a ½ grid shift exists between rows; (2) each cell 104 is physically adjacent to two cells in the same row; and (3) each cell is physically adjacent to two cells in the neighboring row above and two cells in the row below. Depending on the orientation, these rules can be respectively applied instead to columns. Thus, groups of three neighboring cells 102 can be clustered to set up individual Y's 108. Exemplary clusters 106 of three cells 104 are shown in bold in the hexagonal array of FIGS. 2A and 2B, in respectively inverted directions.

If each cluster 106 of three cells 104 is regarded as a unit, it can be seen that the hexagonal array 102 composed of such units also has the property of ½ grid shift, but now in the vertical direction (in the orientation shown). Thus, the Y-architecture can be expanded to the second level 116; however, the directions of the individual Y's 108 at the second level 116 have a rotation of 90° compared to the Y's of the first level 110. In a preferred embodiment, this property of ½ grid shift always holds when the Y-architecture is continuously expanded to upper levels. As shown in FIG. 1, for example, respective Y's 108 on higher levels are rotated either by 90° or −90° with respect to a previous (or higher) level.

Figure 3A:
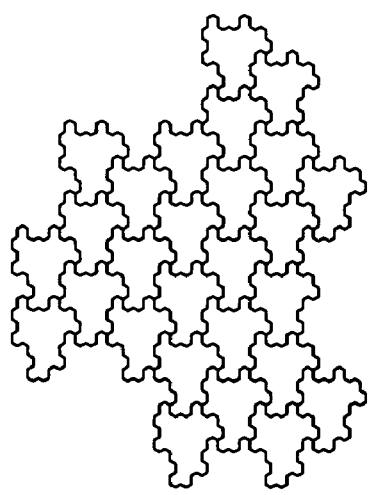
FIGS. 3A and 3B show two examples of six level Y-trees and their respective configurations.
Figure 3B:
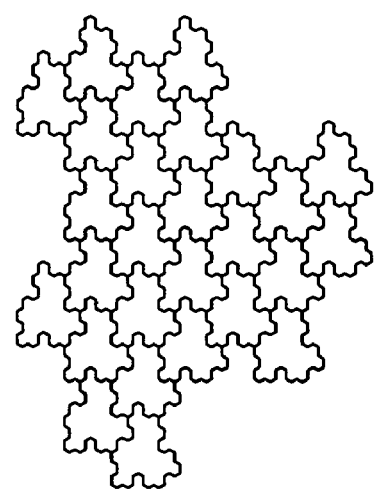

For a Y-architecture of n tree levels, there are 2n combinations of orientations of the n Y's 108 on different tree levels. A combination of Y's 108 is referred to herein as a configuration, which indicates the way the overall Y-architecture grows. The configuration results in a particular boundary for the cells 104 interconnected by the Y-architecture. FIGS. 3A and 3B show two examples 122, 124 of 6-level Y-architectures, together with their configurations.

Figure 4A:
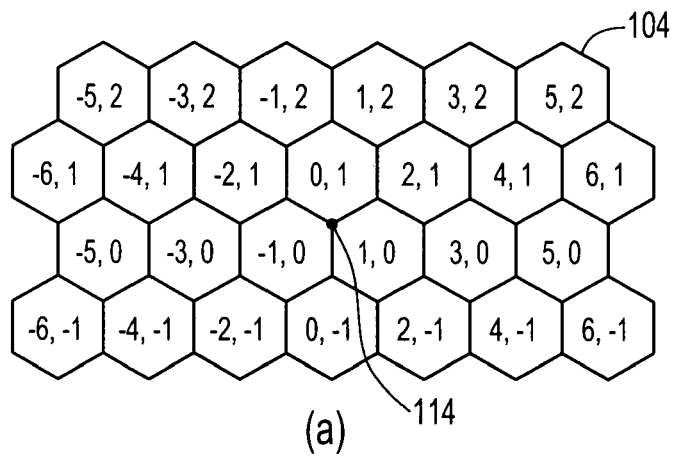
FIGS. 4A and 4B show coordinates for cells in a hexagonal array and orientations for Ys, respectively, according to a preferred formation method.
Figure 4B:
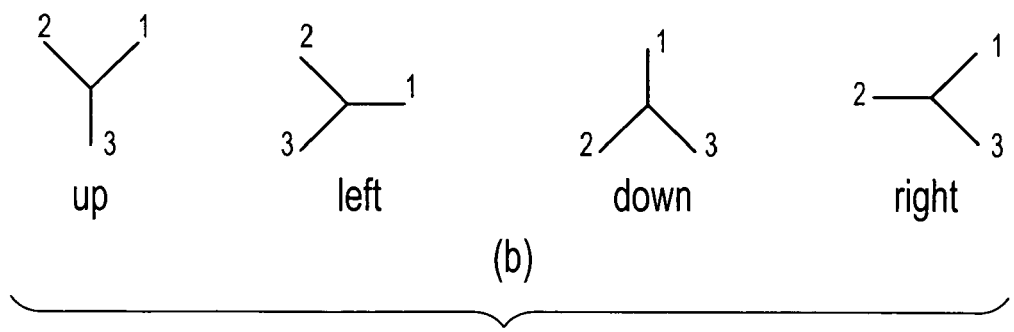

Given a particular configuration, C, a Y-architecture as shown in FIG. 1 can be formed using the following expanding algorithm. The architecture is an ordered one. The first, second, and third subtrees correspond to three orientations as illustrated in FIG. 4B. Every node in the architecture, except the leaves (the nodes at individual cells 104), stores the orientation of the Y 108 with which to organize its three subtrees. C[1] denotes the orientation of the Y 108 on the lowest level, and C[n] denotes the orientation on the highest level. C[m] ∈ {up, down, left, right}. For consistency, but without limiting the scope of the present method, an exemplary configuration is started with an inverted Y. In other words, C[1] is assumed to equal "down". The coordinates shown in FIG. 4A distinguish the cells 104 in the hexagonal array. The center node 114 of the Y 108 at the highest level is shown in FIG. 4A, having coordinates (0, 0). FIG. 5 shows an exemplary algorithm implementing a design of a Y-tree based on these coordinates.

According to the exemplary algorithm Setup_Y_tree shown in FIGS. 5A-5B, the first three steps make subtrees of the first level Y tree from the leaves (i.e., the hexagonal cells 104). The fourth step makes the template Y tree for the first level from three subtrees according to the orientation C(1). Next, the fifth step calculates the coordinate shift base x, y, and z. The sixth step is a loop for all the levels in the Y-tree 120 from 2 to n. Within the loop, for level i, the coordinate shifts for the three subtrees, x1, y1, x2, y2, x3, y3, are calculated according to C(i), which is the orientation of the Y 108 at level i. Then, the template tree at the previous level is copied to be the three subtrees of the current level Y tree by a Copy subroutine. The coordinates of all the leaf nodes in the three subtrees are shifted by a Shift subroutine. Finally, the template tree for the i-th level is built based on the three subtrees and the orientation C(i).

Figures 6A, 6B:
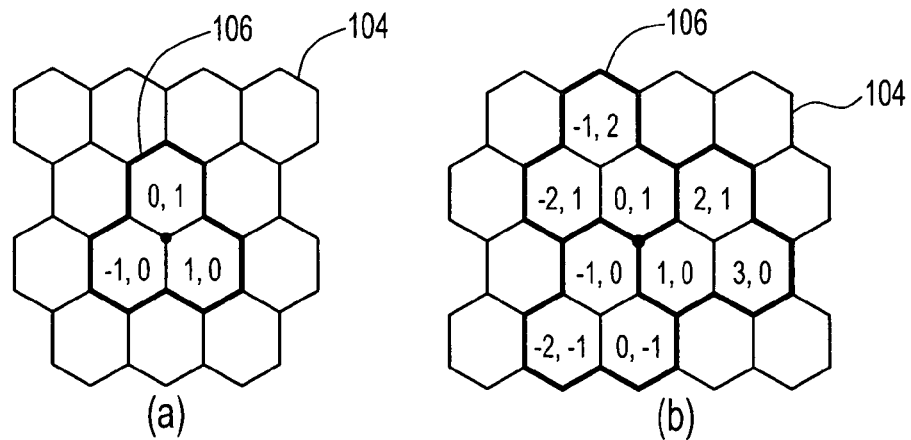
FIGS. 6A-6D show Y-trees formed as a result of the algorithm of FIGS. 5A and 5B and a tree representation for FIG. 6C.
Figure 6C:
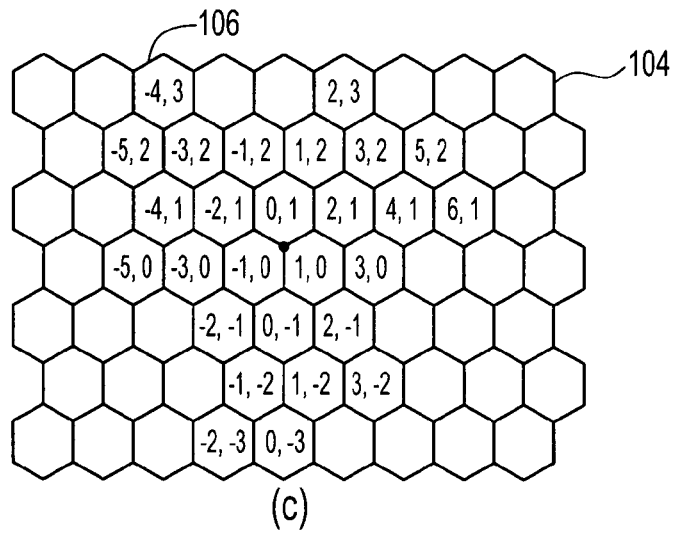
Figure 6D:
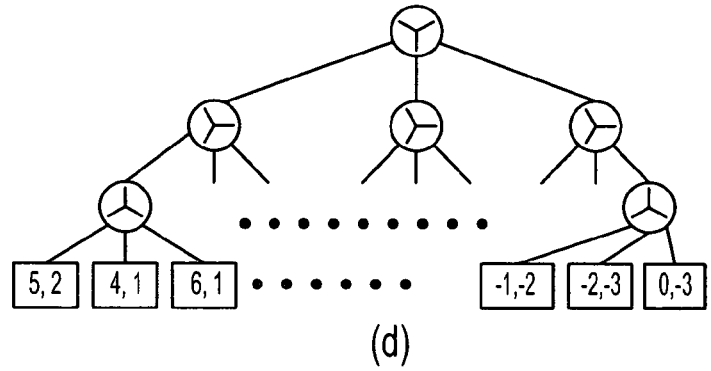

FIGS. 6A-6D show an example for a Y-tree 120 formed by implementing the algorithm of FIG. 5. The configuration is "down, left, up". FIGS. 6A, 6B, and 6C are results for I=1, 2, 3, respectively. FIG. 6D shows a tree representation for the Y-tree shown in FIG. 6C, in which the coordinates in the leaves, from left to right, are:

(5,2)(4,1)(6,1)(2,3)(1,2)(3,2)(2,1)(1,0)(3,0)(−1,2)
(−2,1)(0,1)(−4,3)(−5,2)(−3,2)(−4,1)(−5,0)(−3,0)(2,−1)
(1,−2)(3,−2)(−1,0)(−2,−1)(0,−1)(−1,−2)(−2,−3)(0,3)

From the hexagonal array's 102 properties and the algorithm for setting up the Y-trees 120, it can be shown that: (1) the exemplary algorithm according to an embodiment of the present invention generates Y-tree architecture without cell overlapping; (2) the number of cells covered by the generated Y-tree of n levels is $3^n$; and (3) the length of the trunk at level n is $(1/\sqrt{3})^n$.

In another embodiment of the present invention, a merging algorithm is used to merge two polygons. Then, based on this algorithm, another algorithm for merging polygons to set up a Y-tree without empty cells is provided.

Figure 7:
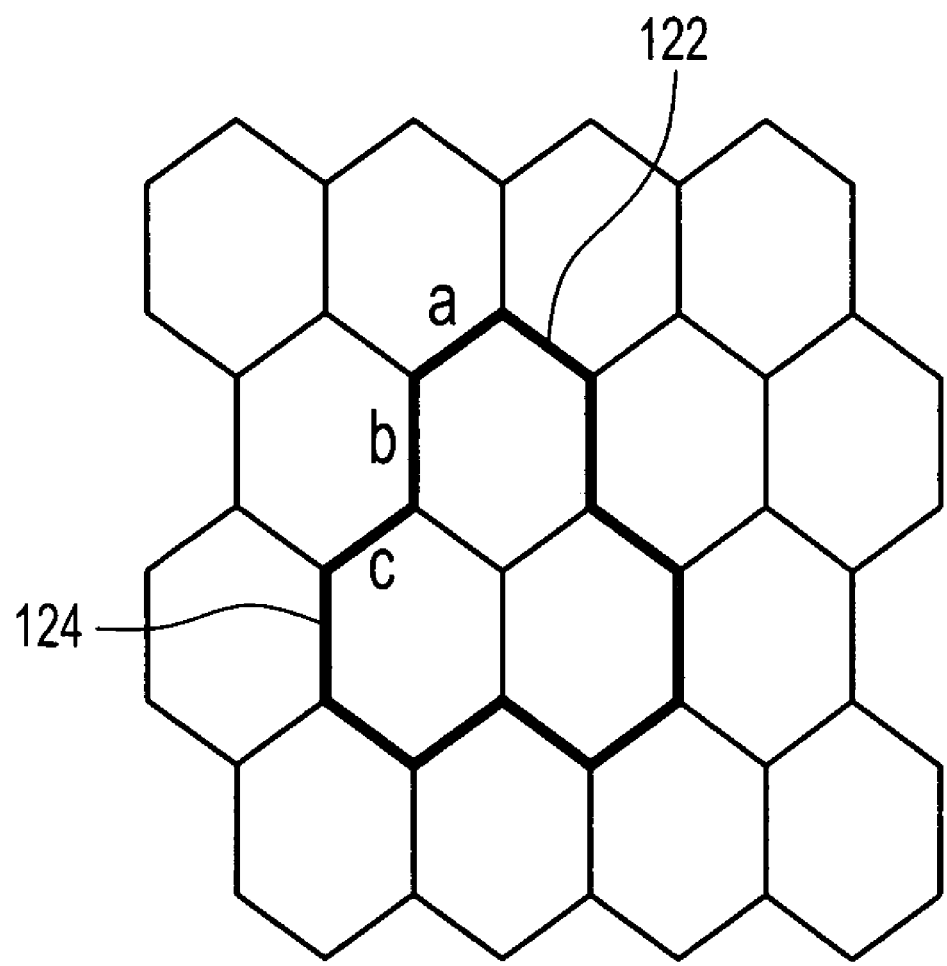
FIG. 7 shows a polygon on the backbone of hexagons, with exemplary coordinates for polygon boundaries.

Suppose there exists a polygon 122 on a backbone of hexagons, as shown in FIG. 7. The polygon 122 can be represented with a sequence of integers, where every integer i ∈ 0, 1. In an exemplary embodiment, the sequence of integers is determined by traversing the boundary of the polygon in a counterclockwise direction. The boundary of the polygon 122 includes a series of adjacent edges 124. Every edge 124 has a rotation of either 120° or −120° with respect to its preceding edge. If an edge A has a rotation of 120° relative to its preceding edge, the edge 124 is considered to have a positive rotation. If the edge 124 has a rotation of −120°, the edge is considered to have a negative rotation. For example, in the polygon 122 shown in FIG. 7, edges a and b have positive rotations, while edge c has a negative rotation.

A sequence, termed herein a hexagonal sequence, can thus be determined to represent the polygon 122. Starting with the edge 124 of the boundary of the polygon and traveling counterclockwise, if the edge 124 has a positive rotation, a 1 is entered into the sequence. If the edge 124 has a negative rotation, a 0 is entered into the sequence. The resulting string represents the hexagonal sequence. If A denotes a hexagonal sequence, then A(i) is defined to refer to the $i^{th}$ element in A, where A(i)∈0,1.

Figure 8:
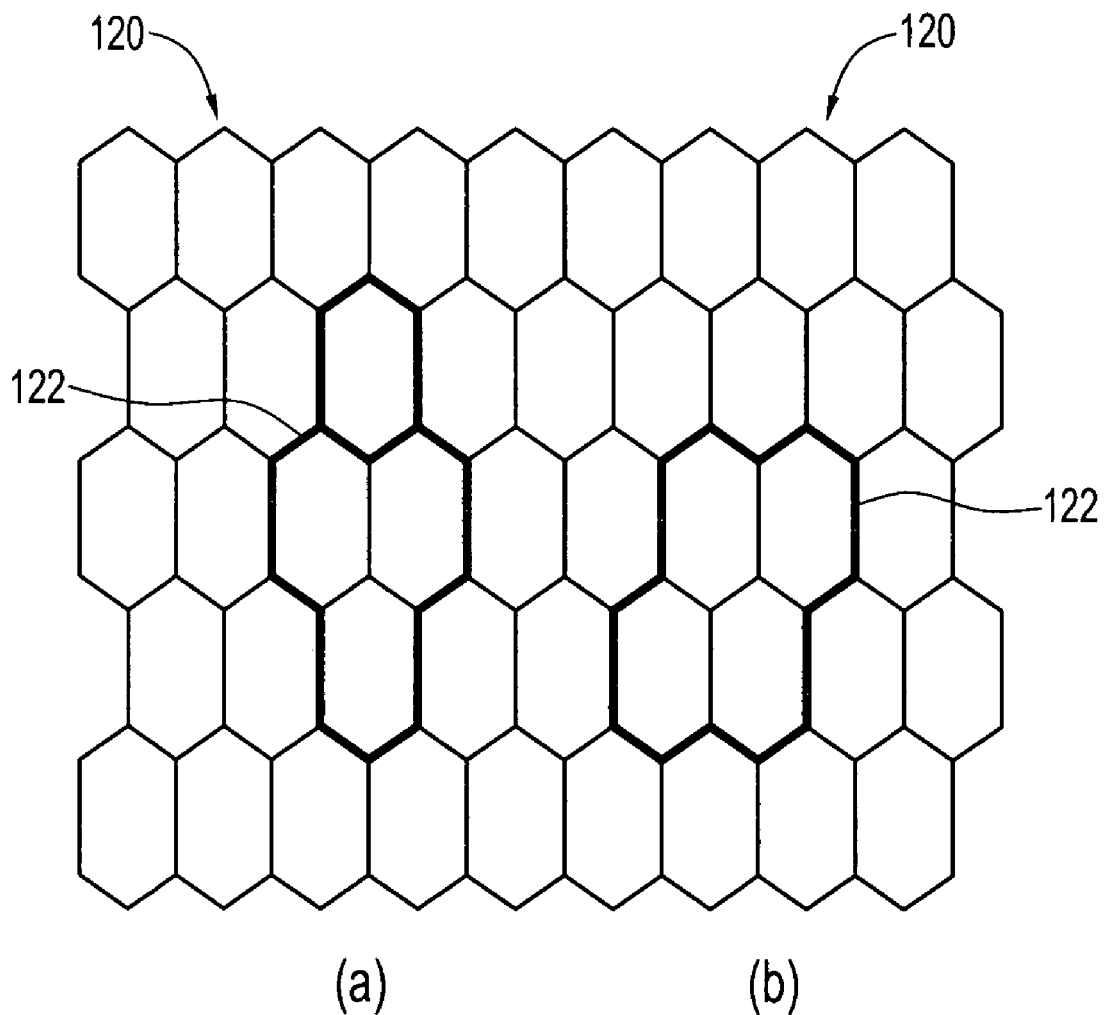
FIG. 8 shows two polygons having different orientations.

For example, the hexagonal sequence of the polygon 122 shown in FIG. 7 is 110111011101, and the hexagonal sequence of each of the polygons a and b shown in FIGS. 8A and 8B is 11011011101101. Although the two polygons 122 have different orientations, the two polygons are considered the same, as direction is not imposed.

It can be seen that one can make any bits barrel-shift (assumed herein, for consistency only, to be leftwards) on a non-oriented hexagonal sequence without changing the corresponding polygon 122. Furthermore, for a correct hexagonal sequence, the number of 1's will be six more than the number of 0's, while for any sub-sequence, the difference between the number of 1's and the number of 0's should not exceed five. It can also be seen that two polygons 122 have the same shape and area (assuming unit size of cells) if they have the same hex-sequence. Additionally, if polygon 122 is flipped, its hex-sequence is also horizontally flipped. Thus, for a symmetric polygon, the hex-sequence should be unchanged if the polygon 122 is flipped.

In an exemplary merging method, if rotations are not permitted for generation of Y-trees 120, a definition is assumed for an oriented hex-sequence. Every edge 124 on the polygon 122 thus has only three possible directions, and an oriented hexagonal sequence is denoted by starting the hexagonal sequence with a vertical edge that is traversed downwardly. Therefore, the oriented hex-sequence for the polygon shown in FIG. 8A is 10110111011011, and the oriented hex-sequence for the polygon in FIG. 8B is 10111011011101.

The direction of each edge 124 can be calculated easily according to the numbers of "1's" and "0's" ahead of the edge. For an oriented hexagonal sequence A, i bits can be made to barrel-shift on the oriented hex-sequence without changing the direction of the polygon 122 if, and only if, the difference between the number of "1's", and the number of "0"s is either zero or five in the subsequence from A(2) to A(i+1).

Given two hex-sequences A and B, an algorithm may be used to provide a new hex-sequence C, which is a merging of polygons A and B. To merge the hex-sequences, it is first assumed that both polygons A and B can be rotated. A preferred embodiment of the algorithm is shown in FIG. 9. In the algorithm, the first step retrieves the bit-wise complement, BI, of the input sequence B. The second step generates the reversed bit order sequence, Bh, of sequence BI. Then, for each common sub-sequence, sub, between Bh and A, if it is acceptable for merging by the Accept function, the following is performed: Rewrite sequence A in the form A=(A1)(sub)(A2); rewrite sequence B in the form B=(B1)RevFlip(sub)(B2), where RevFlip(sub) is an operation on sequence sub to complement every bits followed by a bit order reversing; calculate sequence A12=ModMerge(A1, A2), and B12=ModMerge(B1, B2), where ModMerge(S1, S2) is an operation to merge two sequences S2 and S1 and get sequence S=(S2)(S1), and then to complement the first bit of S and eliminate the last bit of S. The sequence of the merged polygon, C, is the sequence A12 followed by sequence B12.

Figure 10:
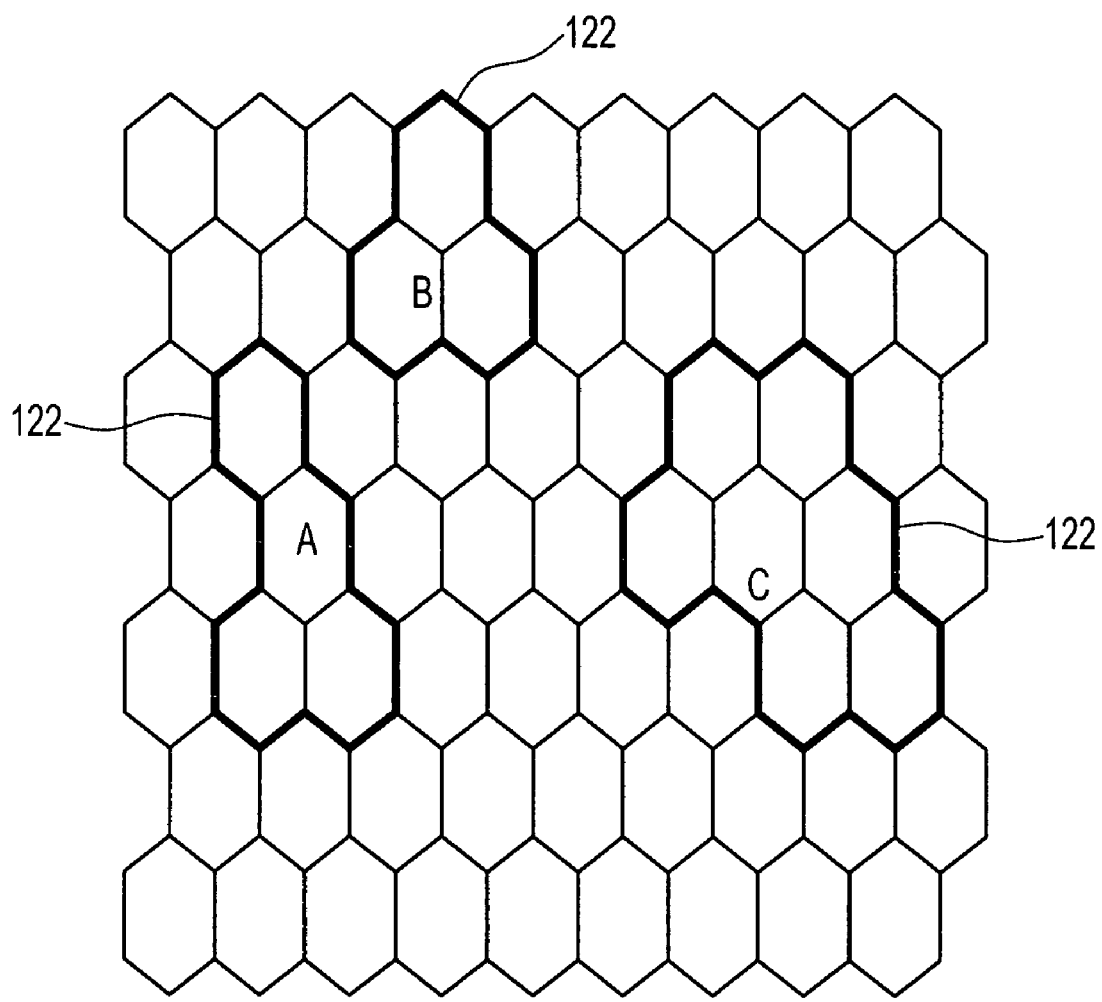
FIG. 10 shows a pair of merged polygons according to the exemplary algorithm of FIG. 9.

FIG. 10 gives an example of merged polygons 122 illustrating use of the algorithm. This example finds the merging with the longest adjacent boundary. For hex-sequence A=110111011101 and B=0011101110101111, BI (Bit-wise complement B)=1100010001010000, and Bh (bit order reversed BI)=0000101000100011, Then:

sub=110; RevFlip(sub)=100
A1=1101;
A2=11101
A12=01101110
B1=1110111010111
B2=empty
B12=011011101011
C=(A12)(B12)=01101110011011101011

Figure 11:
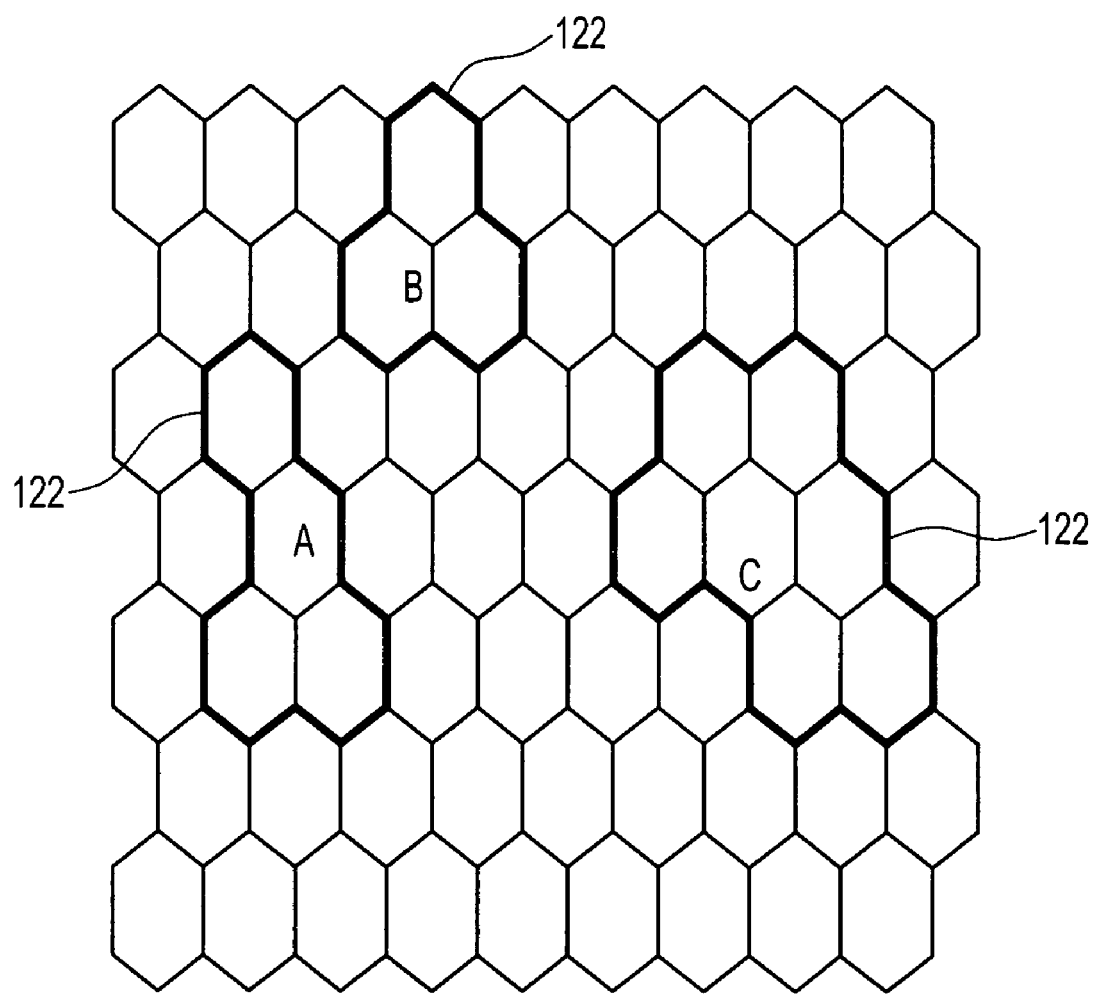
FIG. 11 shows an example of oriented merging of polygons according to another aspect of the present invention.

Next, the situation is considered in which the polygons 122 are not allowed to rotate. In other words, two oriented polygons 122 are merged. The design of the function "Accept" in the algorithm of FIG. 9 should be slightly more complicated. Not only should the two subsequences have the same pattern, but they also should have the same directions for their corresponding edges 124. In addition, if the common sub-sequence happens to involve the first bit of A, or A1 has the only bit 1, the first bit of B is the first bit of the merged polygon C, and the generated hexagonal sequence must be shifted to make it correctively denote the polygon's orientation. It can be shown that the first bits of A and B will not appear in the subsequence simultaneously. A polygon formed by oriented merging is shown in FIG. 11.

In implementing this algorithm, A=1100111011101011; and B=101110111011 (remembering the position of the first bit in B). Thus:

BI=010001000100
Bh=001000100010
sub=100; RevFlip(sub)=110
A1=1
A2=111011101011
A12=011011101011

B1=1̂011101
B2=11
B12=01̂101110
C=011011101011011̂101110 (C needs an orientation adjust)

The final polygon 122 of a complete Y-tree 120 can be obtained by merging the polygons of sub-trees, from the lowest level to the highest. When two polygons 122 are merged, they have a section of common boundary. The two ends of the common boundary may be connected with a line, in which the direction of the line is defined to be the direction of the common boundary.

Given the direction of the first edge 124 of the common boundary and the corresponding sub-sequence, the direction of the common boundary can be easily calculated. Merging of three polygons 122 of sub-trees can be realized, under the orientation configuration of Y at each level, by two steps:

(1) merge two of the three polygons with the following two conditions satisfied: (a) the length of the common boundary is one-sixth the length of the original polygon's boundary; and (b) the direction of the common boundary should be vertical or horizontal, depending on the required orientation of the Y;

(2) merge the polygon generated in step (1) and the remaining original polygon, with the following two conditions satisfied: (a) the length of the common boundary is one-third the length of the original polygon's boundary; and (b) if the common boundary is split into two halves, the directions of the two halves should be opposite to the required orientation of Y.

Figure 12:
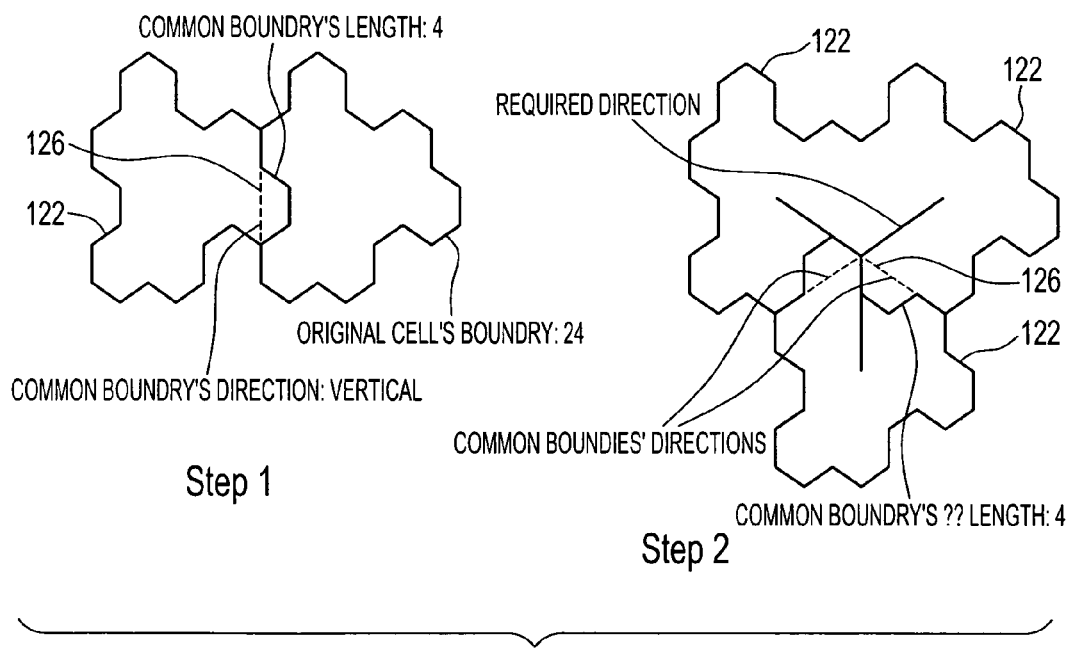
FIG. 12 shows an exemplary inventive method for merging three polygons of subtrees.

For simplicity, one starts from the sub-tree of level 2. A subtree of level 2 includes 9 basic hexagonal cells 104 and has a completely symmetrical polygon regardless of the directions of the Y's on the first and second levels. FIGS. 12A and 12B are illustrations of merged polygons formed by steps (1) and (2) above, respectively. After step (1), a common boundary 126 length is =4, which is one-sixth the boundary of each original polygon. The common boundary's direction 126 is vertical. After step (2), the common boundary's 126 total length is 8 (again, one-third the original polygon size), and as split into two halves, each half of the common boundary has a direction opposite to that of the required orientation of Y for level 2 as shown. By merging the polygons of sub-trees level by level, we get the final polygon 122 of the Y-tree 120. Preferably, the process of merging will not result in empty cells.

In multilayer routing, a via is used to connect interconnects that are disposed on multiple layers. However, the via blocks wire tracks on layers it passes through. According to another embodiment of the present invention, tunnel detours are used to route interconnects around vias.

Figure 13B:
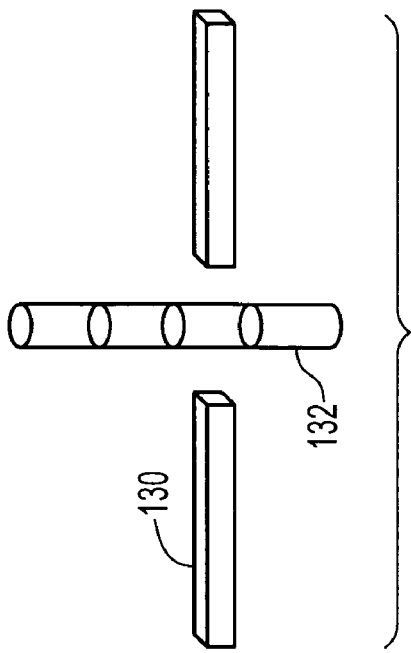
FIGS. 13A and 13B are plan and perspective views of a conventional via arrangement.
Figure 13A:
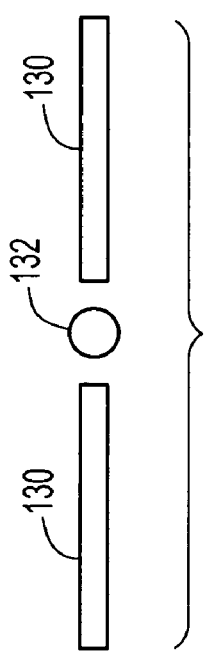
Figure 14B:
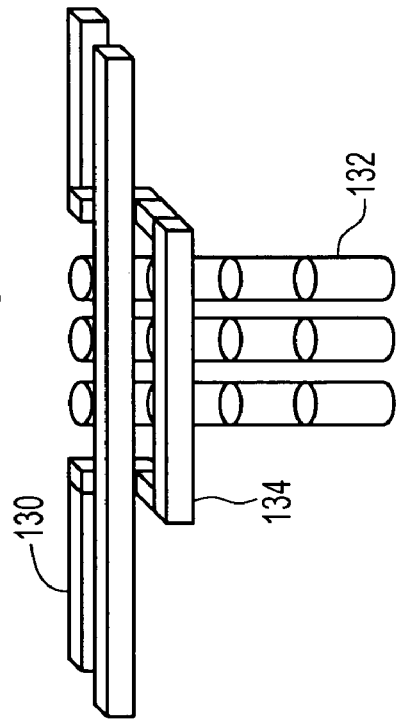
FIGS. 14A and 14B are plan and perspective views of a tunnel arrangement, according to an embodiment of the present invention.
Figure 14A:
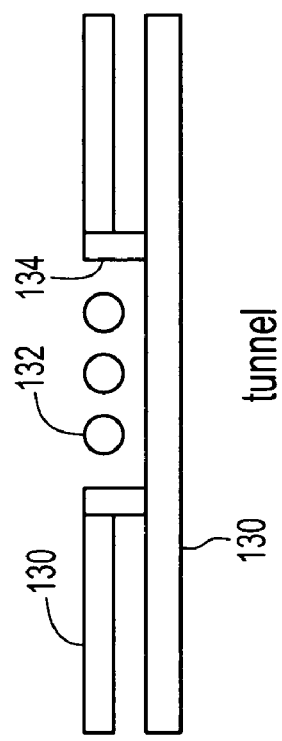

FIGS. 13A and 13B show a horizontal interconnect 130 in a horizontal (x) direction routing layer. A path of the horizontal interconnect 130 is impeded by a gap having a via 132, which extends in a top-to-bottom (z) direction through a number of routing layers. An exemplary structure is shown in FIGS. 14A-14B to address this problem. As shown, the horizontal interconnect is connected to a tunnel 134, which extends in the z-direction down to a lower routing layer, in this case, a y-direction routing layer, so that the tunnel includes another x-direction interconnect spanning the gap, but displaced from it in the y-direction due to a pair of y-direction interconnect. The generally U-shaped tunnel 134, as can be more clearly seen in FIG. 14B, allows the horizontal interconnect to avoid the vias 132 within the gap.

Figure 15:
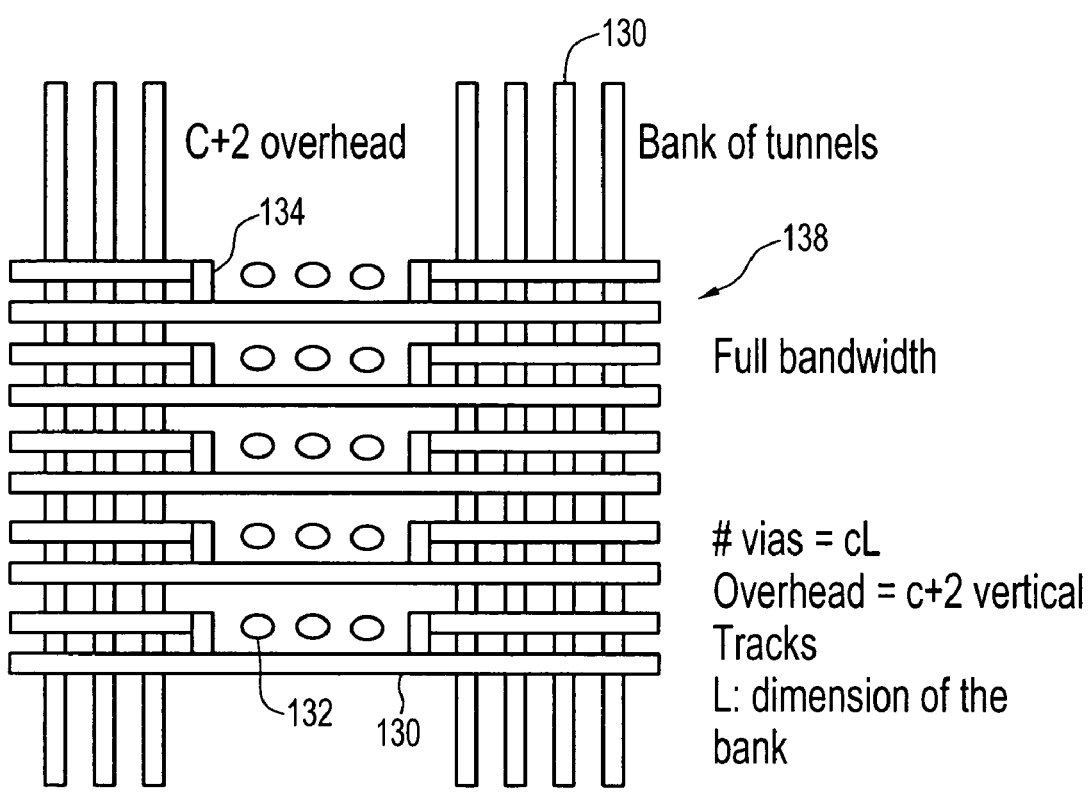
FIG. 15 is a plan view of a bank of tunnels according to a preferred embodiment.

To maximize throughput, a plurality of tunnels 134 preferably forms a bank 138, which is arranged on a lower routing layer along a direction of a plurality of gaps and vias 132. As shown in FIG. 15, suppose L is the dimension of the bank 138 and c is the number of vias 132 in each individual tunnel 134, the number of vias avoided is equal to cL. The top n-k layers in this embodiment are used to distribute signals to the bank 138. In this configuration, on the top n-k layers, c+2 wiring tracks are blocked on each vertical layer while all the wiring tracks on the horizontal layers can be routed without blockage.

Figure 16:
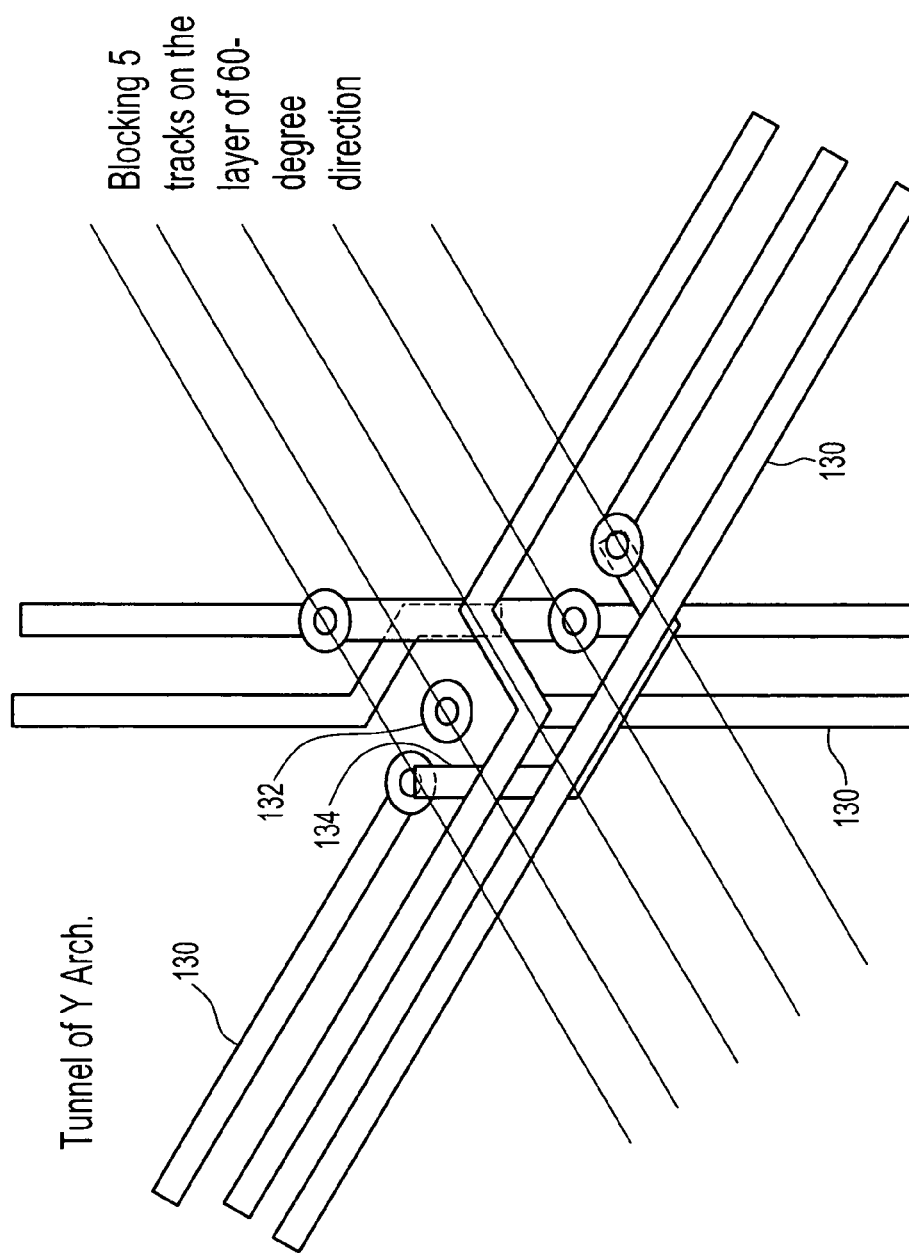
FIG. 16 shows a tunnel used to detour interconnects having a Y-architecture around a via according to an embodiment of the present invention.

FIG. 16 shows an example of a tunnel 134 for Y-architecture. The via 132 blocks tracks on a layer of 60° direction for a plurality of interconnects arranged according to a Y-architecture. As shown, for interconnects 130 in the 90° and 120° directions, via tunnels 134 are provided to detour the interconnects around the via. For example, a first entry 120° interconnect is routed through the tunnel 134 in the 60° layer, passing underneath a third 120° wire, and then exits. Similarly, a first 90° interconnect avoids the via 132 on its own, 90° routing layer, but a second 90° interconnect avoids the detoured first 90° interconnect through another tunnel in the 60° layer.

Figure 17:
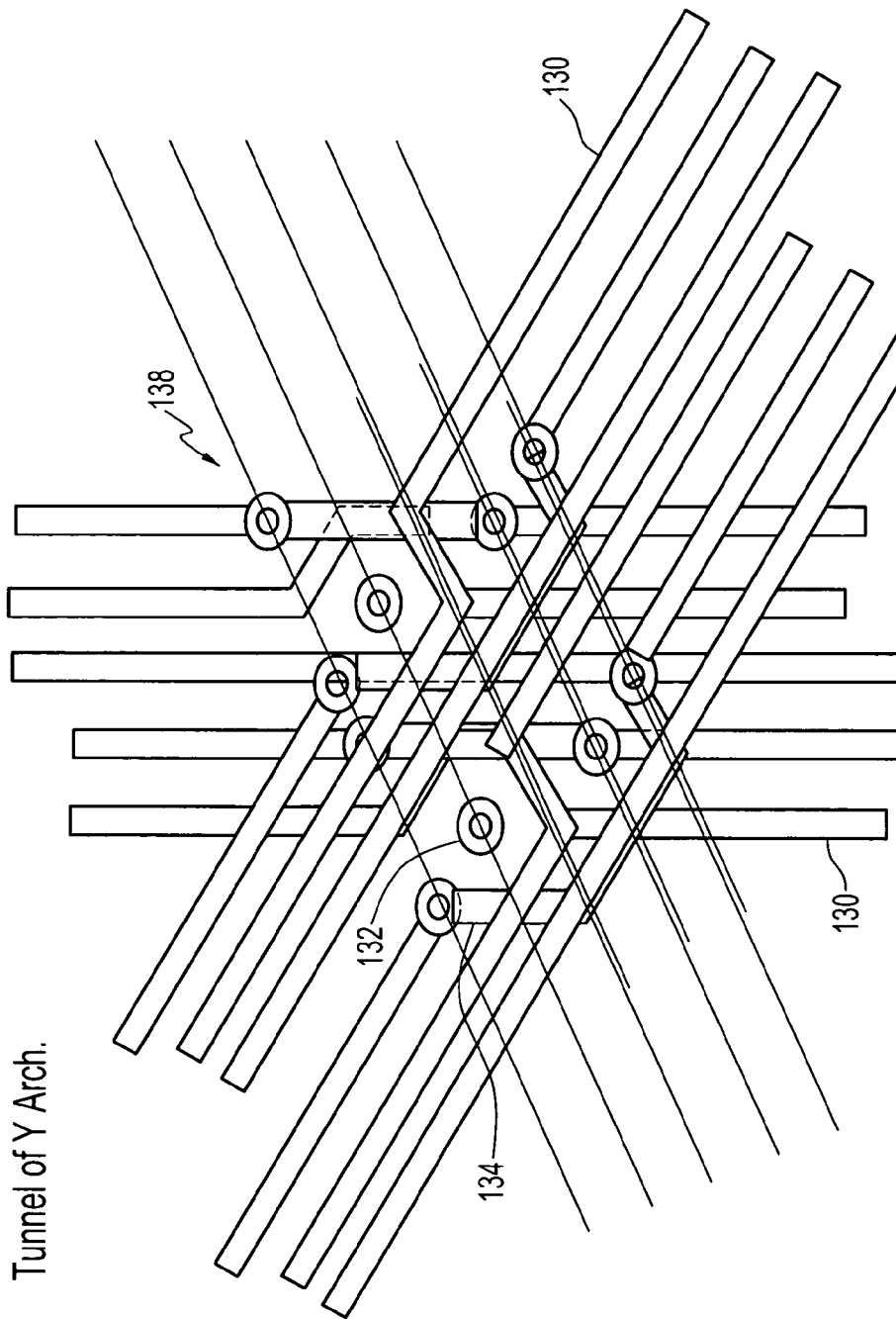
FIG. 17 shows an exemplary bank of tunnels for a Y-architecture.
Figure 18:
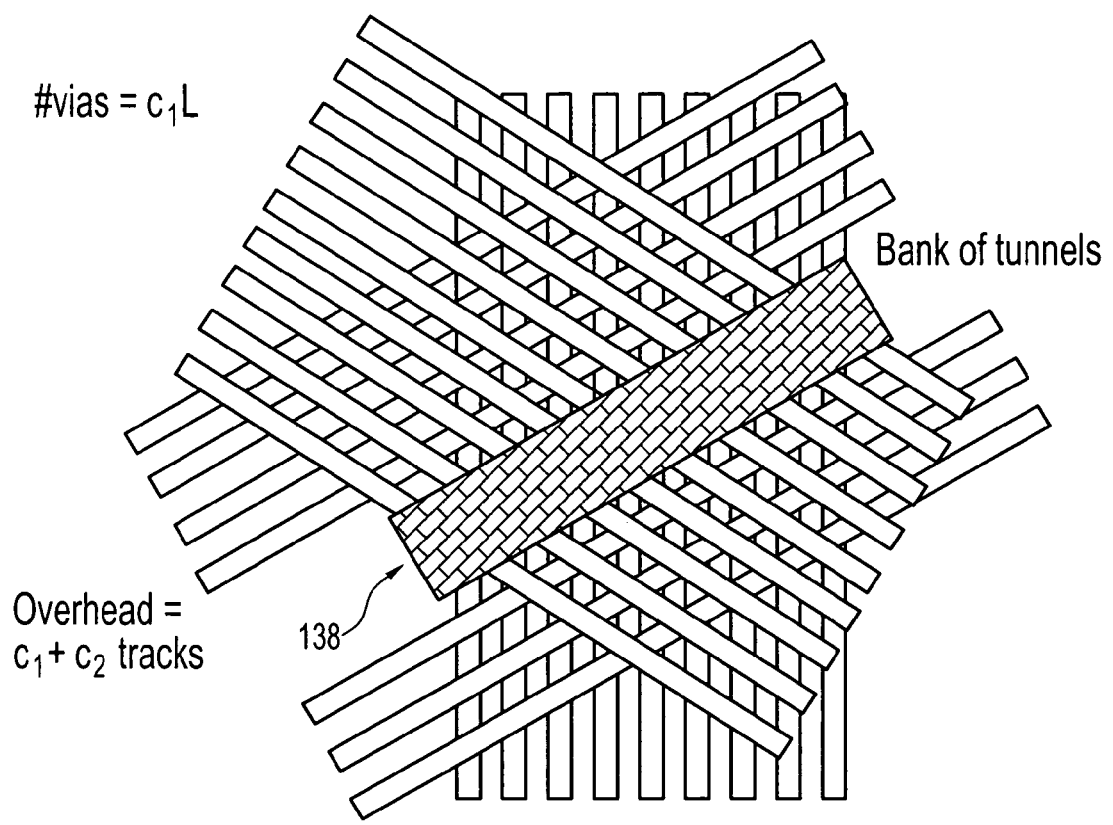
FIG. 18 is a schematic of a plurality of banks of tunnels and interconnects on different routing layers using Y-architecture according to another embodiment of the present invention.

The pattern formed by the five interconnects shown in FIG. 16 with their respective tunnels 134 can be extended to form the bank 138 of tunnels, as in the case of Manhattan architecture. An exemplary bank 138 of tunnels is shown in FIG. 17. A plurality of banks 138 of tunnels is shown in FIG. 18. Again, the bottom k layers are used to perform intra-cell routing, and the top n-k layers are used to distribute signals to the banks 138 of tunnels. If L is the dimension of the bank and $c_1$ is the number of vias 132 in each individual via tunnel 134, the number of vias in this arrangement preferably equals $c_1 L$, and the number of overhead tracks preferably equals $c_1 + c_2$, where $c_2$ is the constant associated with the individual tunnel design. In the exemplary tunnel 134 shown in FIG. 17, $c_1$ and $c_2$ are equal to 1 and 5, respectively. The banks of via tunnels maximize throughput.

The design of early blocking networks focused on minimization of switches. In deep submicron technology, devices are shrunk to very small sizes and are less expensive, while interconnects such as wires and buses are lengthened, resulting in the increase of interconnect resistance and capacitance. Performance such as power consumption and signal delay are significantly deteriorated. Therefore, the length of signal paths is more important than the number of switches in the path regarding delay in circuit processing. However, a large-scale system on a chip (SoC) requires a significant amount of wire resources, so it is not feasible to set up the shortest path for every pair of processors in the array.

Conventionally, bus-based architectures have offered standards for communication interfaces. However, in chip design, a length of connection between cells is a limiting performance factor in terms of power consumption and latency, among other factors. The physical size of long interconnects limits the scalability of the architecture. Also, the contention for the interconnects adds to the latency of the communication. This increase is made more significant by the ever-shrinking size of individual cells and interconnects (in width, for example). Thus, chip designs minimizing connection lengths provide a performance benefit for a particular chip.

The total length may be used to measure the cost of interconnect resources, because the interconnect length typically is proportional to the amount of area taken on the routing layers. In deep submicron technologies, the number of routing layers remains limited. Furthermore, even as the number of routing layers increases, the coupling capacitance due to congestion and the required vias that connect signals to the layers high above make routing area a precious resource. It is also desirable to reduce the power dissipation of the wire interconnects because power consumption has become one of the main concerns in various applications.

According to a preferred method of the present invention, an objective cost function is provided to balance interconnect topology between routing area and power dissipation. This cost function is defined with an emphasis on interconnects as opposed to switches.

A goal of the cost function is to reduce the total traveled distance of the signal communication. Let us assume that each cell has to communicate with the rest of the cells with equal demand. Then, the total power dissipation is measured by the total pairwise distance between the cells. This equal demand model is used for preferred embodiments of the present method because the demand is symmetrical and thus independent of the placement implementation.

It is conceivable that by adding interconnects for the communication, the traveling distance can be reduced. However, the interconnects resources are limited by the physical space. Furthermore, the same resources are needed for other purposes such as, but not limited to, making internal connections within each cell, or for testing. Thus, the product of the total interconnect length and the total power distribution is chosen as a metric to balance design. Moreover, the derivative of this product provides an additional metric to further analyze the interconnect architecture.

A preferred method for determining benefit of a particular tree structure thus includes minimization of a cost function, as shown below.

$$\text{Min } M = L*D$$

$$\text{Where, } L = \sum \text{Length of each wire}$$
$$D = \sum_{i \leq i \leq \leq P} d_{i,j}$$

In this definition, $d_{i,j}$ is the shortest route length between processor (i) and processor (j). P is the total number of processors.

In conventional hierarchical interconnection architectures, either L or D of the cost function above has been minimized at the expense of increasing the value of the other parameter. The Y-structure of the present invention, on the other hand, helps to minimize or substantially reduce M. In a preferred integrated circuit design method of the present invention, the cost function is utilized for various configurations, and a configuration that minimizes M may thus be selected for design of an integrated circuit.

For rectangular cells, X-architecture provides optimal performance according to the above cost function. FIG. 19A shows an X-architecture model in which an X 142 having four legs of interconnects connect each of a 2×2 array of cells 140. The center of the X 142 includes a switch box 144, which has the internal structure shown in FIG. 19B. As shown in FIG. 19B, the switch box 144 includes six switches 146 that may connect the four intersected interconnects. Every two of the four cells 140 covered by the X-architecture can set up a communicating route through the switch box 144.

The interconnects from the four cells 140 are also bundled together, forming a new interconnect going to a higher level, as shown in FIG. 19C. A higher level X-tree 148 also includes a larger switch box 144 (indicated by a larger circle) lying at higher levels, which has a similar structure of the switch box of FIG. 19B, except that the bus width grows four times for every expansion to a higher level. This architecture guarantees that whenever two processors in the array need to communicate, a route always exists.

Assuming the distance between the cells 140 is equal to one, the table of FIG. 20 shows application of the above-described cost function to the X-architecture of FIGS. 19A-19C. N denotes the highest level of the X-architecture as shown in the X-tree 148 of FIG. 19C. It is preferred that the tree 148 grows recursively, and that the topology of each level remains identical, with certain rotations allowed. The total number of cells 140 covered by the X-tree 148 preferably is equal to $k^n$, where k is the number of the subtrees clustered on each level of the X-architecture. The length of the trunk at level n, $T_n$, preferably is equal to $\sqrt{k}T_{n-1}$. It is also preferred that no "holes" or "empty cells" exist within the array. In other words, it is preferred that the cells 140 in the array form a continuous region bounded by a closed curve.

Assuming that the distance between the centers of adjacent cells 140 is equal to $\alpha$, the key results of the cost function as applied to the Y-architecture are shown in the table of FIG. 21.

Figure 22:
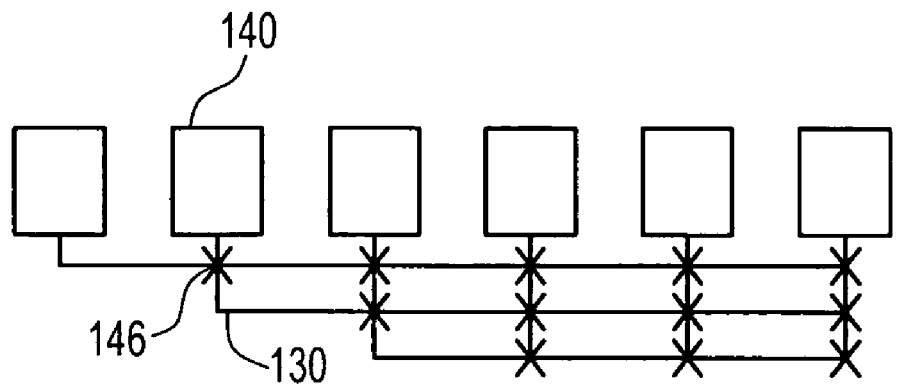
FIG. 22 is a schematic of cell structures in one dimension connected using fewer switches.

In an exemplary method comparing Y-architecture to X-architecture, it is assumed that the cells 140 in the two architectures have one unit area. Thus, the distance between the centers of adjacent cells 140 in X-architecture is one, and the distance between the centers of adjacent cells in the Y-architecture, $\alpha$ in the table of FIG. 21, is $3^{-1/4} \cdot 2^{1/2}$. FIG. 22 demonstrates functions of $M_X$ and $M_Y$ with respect to n, the highest level of the architecture. In FIG. 22, $M_X$ and $M_Y$ are normalized with $A^4$, where A is the number of cells 140 that the tree covers.

To make a comparison for greater n levels, we neglect the lower order items of $M_X$ and $M_Y$:

$$M_X \approx (6 \cdot 2^{4n-4} 2^n \sqrt{2})(2^{3n-2}\sqrt{2}) = 6 \cdot 2^{8n-5}$$

$$M_Y \approx 3^{n-1}\sqrt{3^n}(3+\sqrt{3})(3^{\frac{n}{2}}-1)3^{2n-2}\alpha^2 = 2(1+\sqrt{3})3^{4n-3}$$

To compare the respective performance of the trees mathematically, we assume that the trees 120, 148 cover the same number of cells 140. This results in:

$$n_X = \log_4 A \quad n_Y = \log_3 A$$

$$M_X = \frac{6}{2^5}A^4 \quad M_Y = \frac{2(1+\sqrt{3})}{3^3}A^4$$

$$\frac{M_X}{M_Y} \approx 0.93$$

A is the number of cells 140, 104 in the X- or Y-tree. As shown, there is just a slight difference between $M_X$ and $M_Y$. Therefore, the two architectures have similar performance. If A is close to some order of four, X-architecture is a preferred solution, while if A is close to some order of three, Y-architecture is preferred.

The derivative form of the cost function may also be used to further analyze the interconnect architecture, and is given by:

$$\frac{\Delta M}{\Delta L} = \frac{(L+\Delta L)(D+\Delta D) - L*D}{\Delta L}$$

$$= \frac{\Delta D}{\Delta L}L + \Delta D + D$$

$$\approx \frac{\Delta D}{\Delta L}L + D$$

The last equation is based on the assumption that $L/\Delta L$ is much larger than one. To identify the most cost-effective incremental improvement due to the change of L, a derivative benefit is provided. The derivative benefit I is:

$$I = -\frac{\Delta D}{\Delta L}$$

A negative sign is used because D is expected to decrease when L increases.

Based on examples of the cost function, one-dimensional, two-dimensional, and three-dimensional nonblocking interconnect architectures can be compared, and preferred structures can be selected. An embodiment of the present invention provides, among other things, a hierarchical interconnection architecture in which bridges are provided between physically proximate nodes that may otherwise be distant via interconnect routing. The bridge is preferably placed between nodes on the same level. A method is provided to select an optimum level on which to provide a bridge. Making a bridge between nodes perturbs the tree structure, and an optimal solution is derived in terms of derivative benefit.

Figure 23:
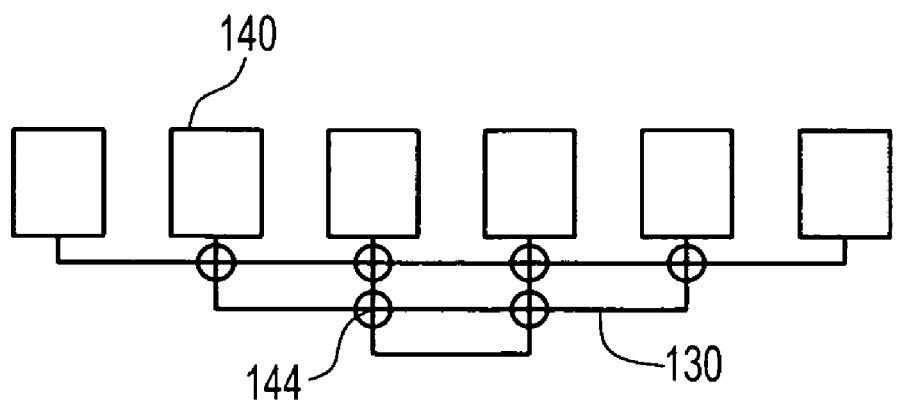
FIG. 23 are schematics of cell structures in one dimension connected using a greater number of switches, respectively.

FIGS. 22 and 23 show an array of cells 140 arranged along a straight line and connected by interconnects 130 in the form of buses. In FIG. 22 switches 146 are shown (by an "x") between pairs of crossing horizontal and vertical interconnects 130. When the switch 146 is on, the vertical interconnect connects to the horizontal interconnect. Otherwise, the two interconnects are not connected. In FIG. 22, groups 144 of six switches 146 (shown as non-filled circle) represents connect six possible pairs of the four ports. Thus, the architecture of FIG. 23 requires more switches, but less wire resources, than the architecture of FIG. 22.

Applying the above cost function to the architectures of FIGS. 22 and 23, the results for L, D, and M are shown in FIG. 24, assuming that the distance between adjacent cells 140 is 1. Thus, using the cost function, the architecture of FIG. 23 is preferred for one-dimensional non-blocking architecture, because it has the minimum number of interconnects necessary to connect the two parts separated by the cutline, and because, for every pair of cells, the shortest signal route is provided.

Similarly, the cost function can be applied to two-dimensional architectures. FIGS. 25A-25F show a number of non-blocking interconnect architecture models including rectilinear interconnects (also referred to as "Manhattan interconnects") and/or diagonal interconnects connecting a 2×2 array of cells 140, and their associated switches 146. The models shown in FIGS. 25A-25C have a mesh structure, the models shown in FIGS. 25E-25F have a tree structure, and the model shown in FIG. 25D has a mixture of mesh and tree structures. FIG. 26 shows cost function values from each of the models shown in FIGS. 25A-25F.

Figure 25A:
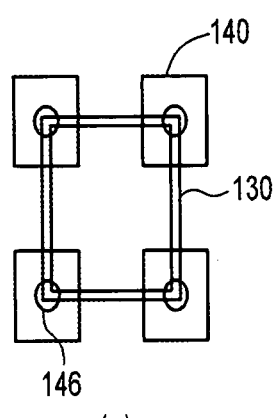
FIGS. 25A-25F show exemplary models of basic interconnect architectures.
Figure 25B:
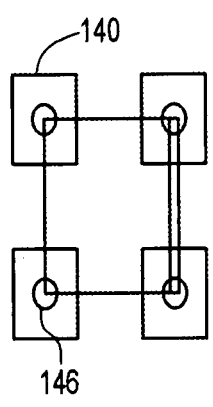
Figure 25C:
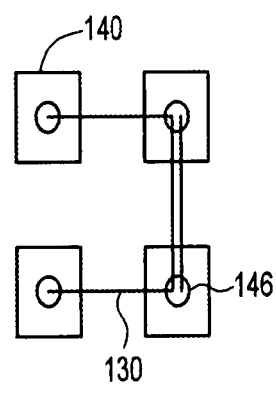

Though the model shown in FIG. 25B is a subset of the interconnect set of the architecture in FIG. 25A, FIG. 26 shows that the total pairwise distance D is the same. The set of interconnects of the model of FIG. 25C is a subset of that of the model of FIG. 25B. However, the model of FIG. 25C has a total pairwise distance D longer than that of the model of FIG. 25B. The quality of the two models is equal in terms of the cost function.

Figure 25D:
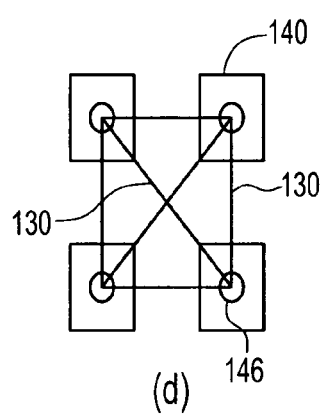
Figure 25E:
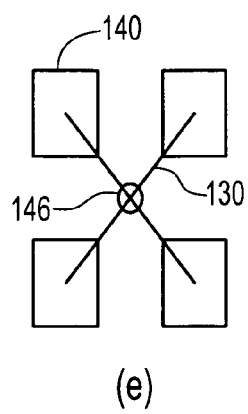

Models of FIG. 25D and FIG. 25E both adopt 450 interconnects. The model of FIG. 25D has less total pairwise distance D than that of the model of FIG. 25E. However, the model of FIG. 25D requires a much longer length of interconnects. Thus, according to the cost function, the model of FIG. 25D is worse than that of FIG. 25E.

Figure 25F:
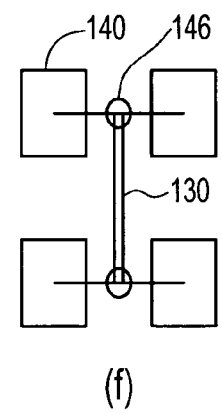

The model of FIG. 25F uses an H-tree topology. Since the interconnects are forced to follow a Manhattan pattern, the quality of the model of FIG. 25F is worse than that of FIG. 25E. Finally, the model of FIG. 25D has the minimum pairwise distance D, for it provides the shortest signal route for any pair of cells 140, but the model of FIG. 25E consumes the fewest overall interconnect resources, and is the preferred model of those shown in FIGS. 25A-25F according to the cost function.

Figure 27A:
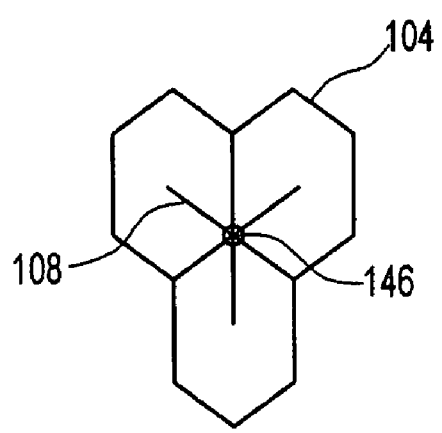
FIGS. 27A-27B show clusters of hexagonal cells connected using a Y and a triangular connection scheme, respectively, according to an embodiment of the present invention.
Figure 27B:
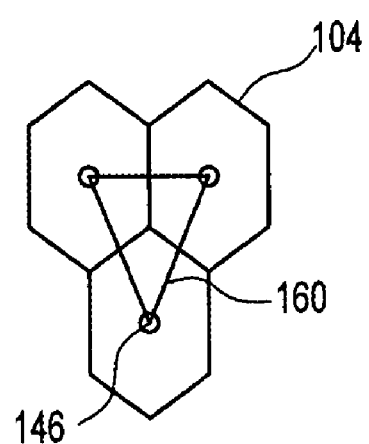
Figure 28:
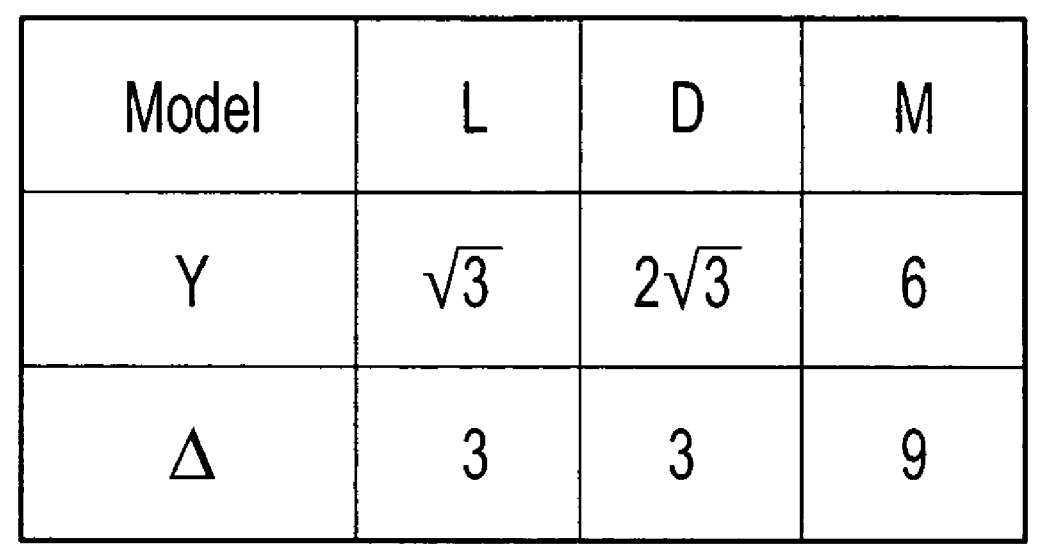

FIGS. 27A and 27B both show an architecture model for a physical layout of hexagonal cells 104. The model of FIG. 27A shows an interconnection of a Y-type, in which each of the group of three cells 104 is connected to a central switch node by diagonal interconnects. The model of FIG. 27B, by contrast, has a triangular architecture, in which each of the cells 104 are not connected to a central point, but rather at the nodes at each cell by a triangle 160. Assuming that the distance between the centers of neighboring cells 104 is 1, by employing the cost function, results of which are shown in—FIG. 28, it is apparent that the model for using the Y 108 is preferred to the model of the alternative triangular architecture based on the objective function, as it has a significantly lower overall wire length M.

Figure 29A:
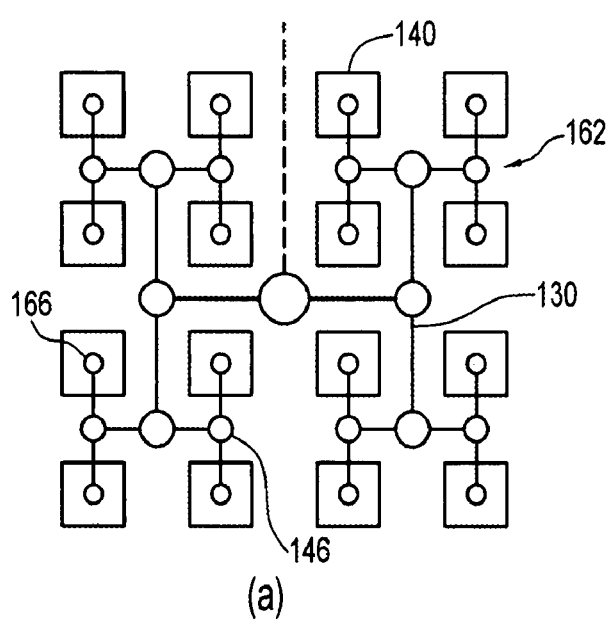
FIGS. 29A-29B show interconnect construction and a level diagram using the model of FIG. 25F.
Figure 29B:
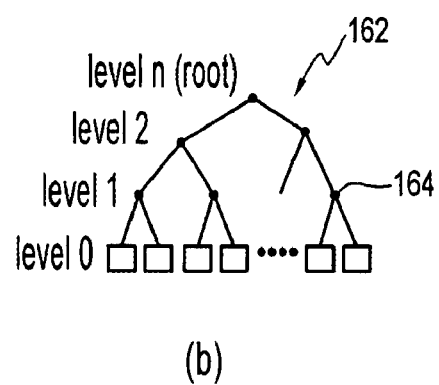
Figure 30A:
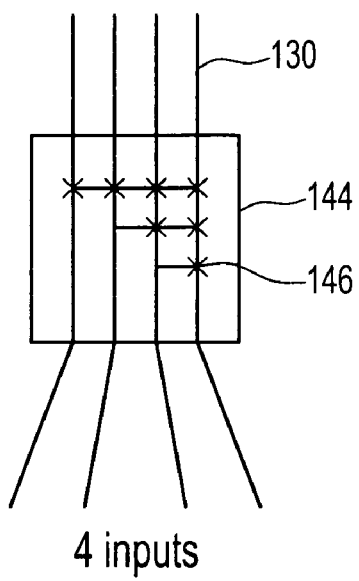
FIGS. 30A and 30B show exemplary switches of the present invention having four and two inputs, respectively.
Figure 30B:
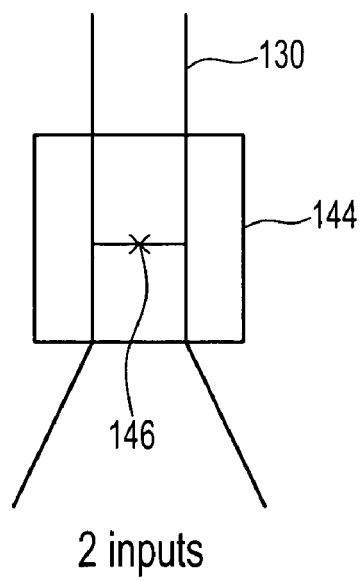

According to certain embodiments of the present method, the cost function described above can be applied to improve particular interconnection architectures. For example, FIGS. 29A-29B illustrate an H-tree 162 based on the H-architecture model shown in FIG. 25F. As shown in FIG. 29A, the cells 140 are connected by interconnects 130 and switches 146, and in addition, two interconnects of the same level are bundled together to form a new interconnect connection to the level above. Switch groups 144 are shown in FIG. 30 for four and two inputs, respectively. The interconnection width doubles for every expansion to a higher level. The expansion continues until the root of the tree is reached. FIG. 29B describes the hierarchy of the tree structure and the definition of levels 164 for the tree 162. To form a square array, the number denoting the tree's 162 top level, n, must be even. The number of cells 140 covered by the tree with 162 n levels is equal to $P_n=2^n$.

Figure 31:
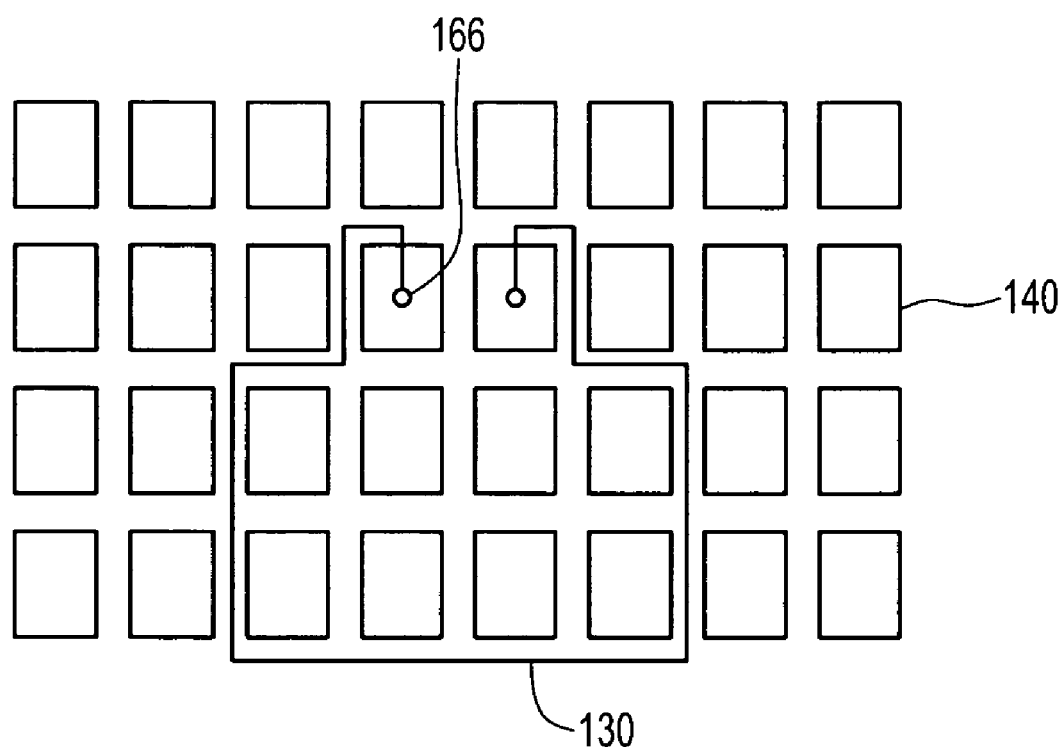
FIG. 31 shows a detoured routing between adjacent cells according to an embodiment of the present invention.

A principal shortcoming of this structure is the extra detouring problem. An extreme example of this is depicted in FIG. 31. Two cells 140 may be close in geometric distance, but their actual interconnection route can be much longer if their lowest common ancestor of a hierarchical tree structure is the root.

Figure 32:
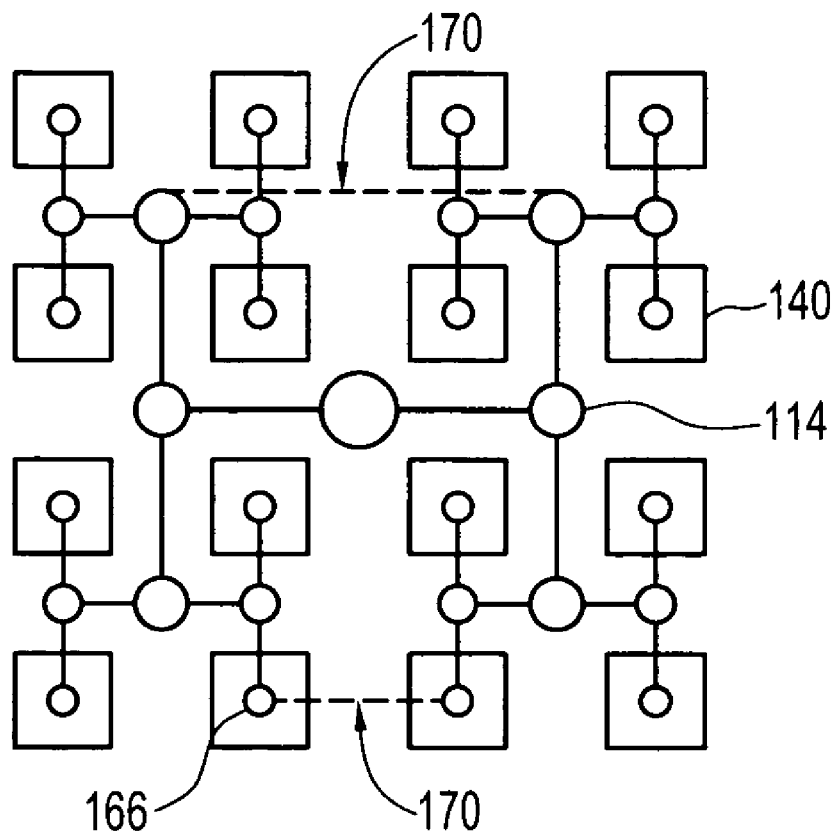
FIG. 32 shows the architecture of FIG. 30A with potential additional bridges according to an embodiment of the present invention.

To reduce this shortcoming, and according to an embodiment of the present invention, interconnections referred to herein as bridges 170 are added to connect (bridge) nodes of the same level. As shown in FIG. 29A, the terminals 166 of each of the cells 140 and the switches 146 at the interconnects are potential nodes for interconnection. The communication between the bridged nodes can thus bypass the detour of going toward upper levels by taking advantage of the bridge 170. FIG. 32 shows exemplary locations of bridges 170 between pairs of nodes.

A preferred method of choosing optimum locations of the bridges 170 is provided. Given an n-level tree structure, for each integer m ($0 \leq m < n$), the incremental improvement of level-m nodes is stated as follows.

(1) Two level-m nodes (the T joints of the H tree) are considered physically adjacent if the Euclidean distance between the pair is the closest among all level-m nodes.

(2) A pair of level-m nodes is connected if the nodes in the pair are physically adjacent and if their lowest common ancestor of the tree structure is the root. Level-m nodes are linked with $2^m$ buses.

Figure 33:
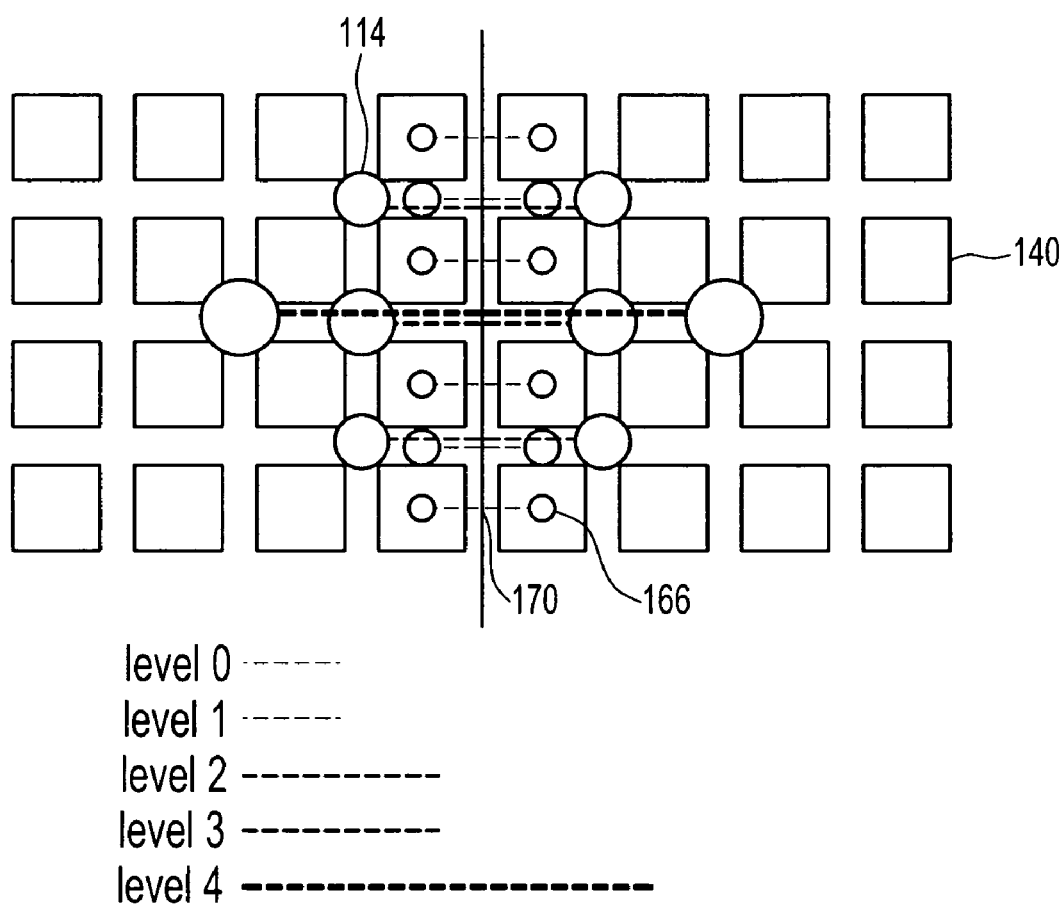
FIG. 33 shows alternative additional bridges at five levels for the architecture of FIG. 30A.

FIG. 33 illustrates the alternative bridges at five levels using an array of 8×8 cells 140 as an example. Only the upper half array is shown. In FIG. 33, the tree structure depicted in FIG. 29A is eliminated to clarify the illustration. The additional wires are symmetrical with respect to the central vertical line that divides the cell array into halves.

A question is then presented as to the level for establishing the bridges 170 to obtain the largest benefit. To resolve this, a derivative benefit function is derived according to the derivative benefit defined above. Given a tree of level n, and the level investigated m:

$$\Delta D(n,m)=A(n,m)*B(n,m)$$

In this equation, A (n, m) represents the number of pairs of cells 140 that will benefit from the addition of the bridges 170, and B (n, m) represents the route length saved due to the bridges. Thus, if m is odd:

$$A(n, m) = 2^{\frac{n+3m-1}{2}}$$

$$B(n, m) = -\left(2^{\frac{n+2}{2}} - 2^{\frac{m+3}{2}}\right)$$

$$\Delta L(n, m) = 2^{\frac{n+2m-2}{2}}$$

$$I(n, m) = 2^{\frac{n+m+3}{2}} - 2^{m+2}$$

For example, in the architecture of FIG. 29, if m=n−1, I=0 because B (n, n−1)=0. If m is even:

$$A(n, m) = 2^{\frac{n+3m}{2}}$$

$$B(n, m) = -\left(2^{\frac{n+2}{2}} - 3*2^{\frac{m}{2}}\right)$$

$$\Delta L(n, m) = 2^{\frac{n+2m}{2}}$$

$$I(n, m) = 2^{\frac{n+m+2}{2}} - 3*2^m$$

For any even $m(0 < m < n)$:

$$I(n, m) - I(n, m) = 2^{\frac{n+m+2}{2}} - 3*2^m - 2^{\frac{n+m+2}{2}} + 2^{m+1}$$
$$= -2^m < 0$$

From the above inequality, it can be shown that I (n, m)<I (n, m−1). Hence, in this example, only the odd levels are inspected for maximum derivative benefit. For a continuous variable function:

$$I(n,x) = 2^{\frac{n+x+2}{2}} - 3*2^x,$$

we calculate that when x=n−1, the derivative benefit is maximized, $I(n,n-3)=2^{n-1}$.

Figure 34:
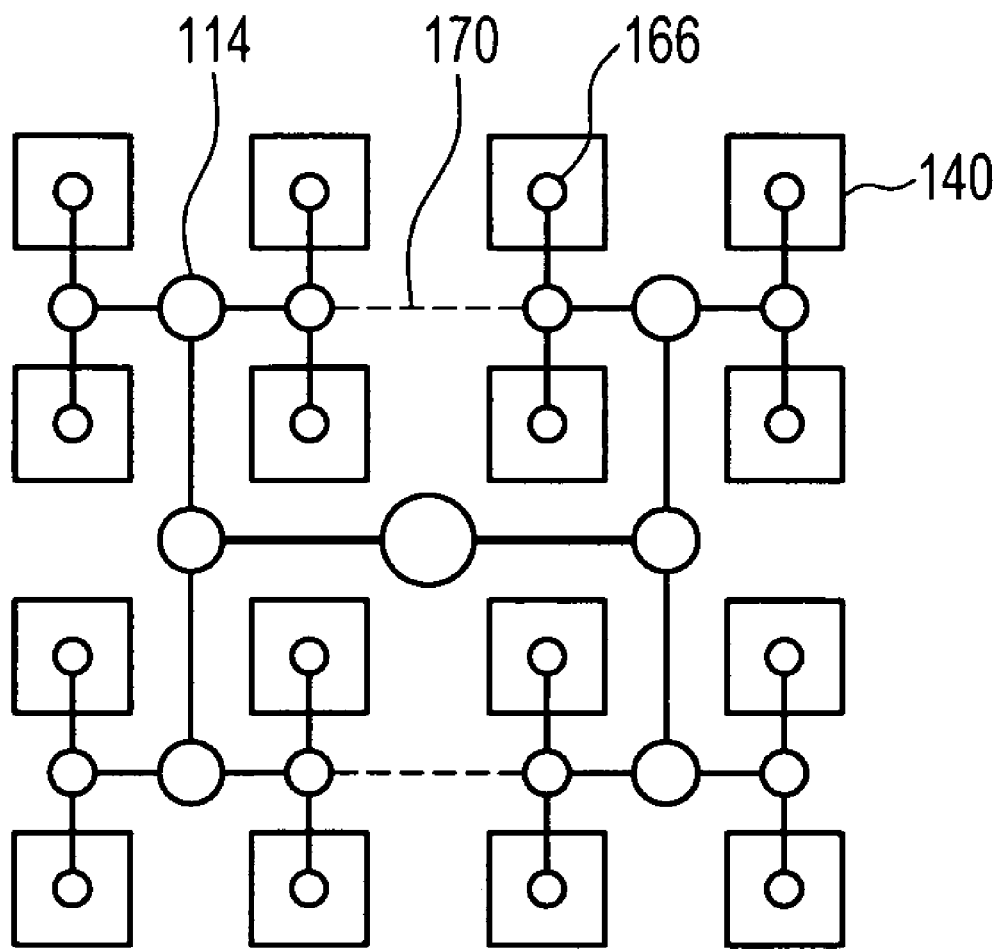
FIG. 34 shows optimal bridges for the architecture determined according to a method of the present invention.

Thus, for an H-tree architecture, level m=n−3 gives an optimal derivative benefit for bridges 170: $I_{max}=2^{n-1}$. FIG. 34 shows a number of optimally placed bridges 170, shown in dashed lines. FIG. 35 shows the derivative benefits for different levels (values of I (n, m)). As shown, the best solution is neither at the highest level nor at the lowest level.

Figure 36A:
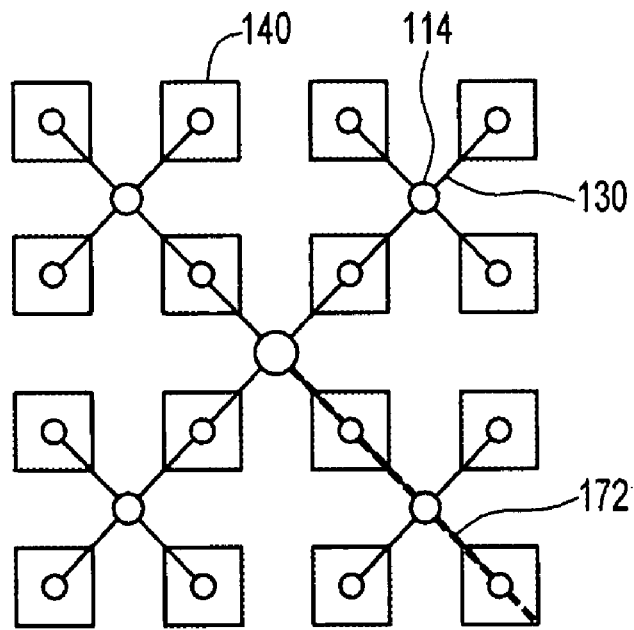
FIGS. 36A-36B show a construction of a prior art X-tree using the model of FIG. 25E.

In another example, the bridges 170 are added to the X-tree architecture model according to FIG. 25E. The hierarchical extension is shown in FIG. 36A. The bus width expands four times for every migration to a higher level. The dashed line 172 represent a connection to the similar arrays in the chip 100. For the case in which the tree's root lies at the n-th level, the number of processors is $P_n = 4^n$.

Figure 36B:
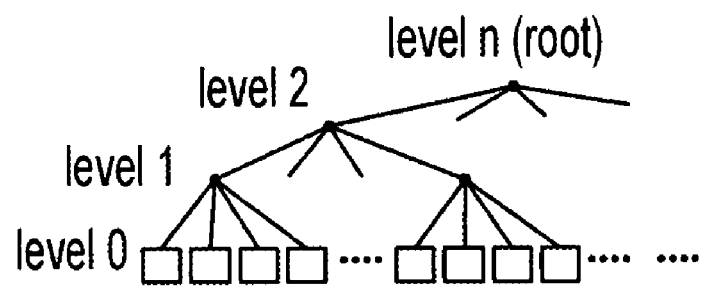
Figure 37:
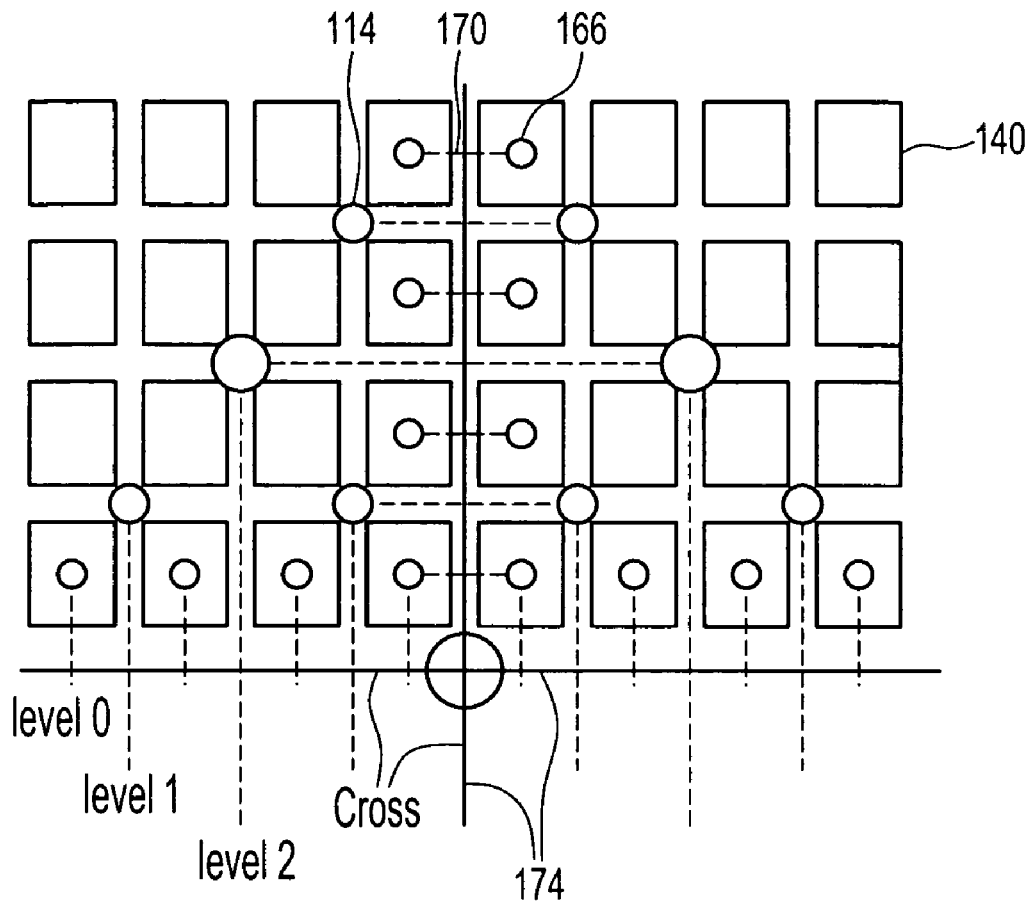
FIG. 37 shows possible bridges for the model of FIG. 36A according to a method of the present invention.
Figure 55:
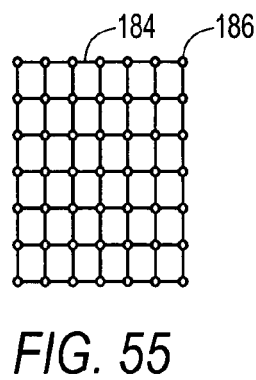
FIG. 55 is a graph representation of the communication mesh of FIG. 54 being connected by interconnects having Manhattan architecture.

The bridges 170 are added to the architecture of FIG. 36. FIG. 37 is a top portion of an 8×8 cell array according to the architecture of FIG. 36, illustrating exemplary alternatives for bridges 170 at different levels. Again, the X-tree architecture of FIG. 36 has been removed from FIG. 55 for clarity. The additionally connected nodes 114 are preferably all symmetrical with respect to the large cross that divides the entire cell array into four parts.

Given an n-level X-tree structure, and using the method described above, incremental improvements are considered by using the bridges 170 to link nodes 114 at different levels. For each level m: $0 \leq m < n$, pairs of level-m nodes 114 are connected if the pairs are physically adjacent and their lowest common ancestor in the X-tree is the root. Level-m nodes 114 are linked with $4^m$ interconnects 130. The derivative benefit is derived as follows:

$$A(n, m) = 4 * 2^{n-m-1} * 4^m * 4^m = 2^{n+3m+1}$$

$$B(n, m) = -\left(\sqrt{2} * \sum_{i=m}^{n-1} 2^i - 2^m\right)$$

$$\Delta L(n, m) = 4 * 2^{n-m-1} * 2^m * 4^m = 2^{n+2m+1}$$

$$I(n, m) = \sqrt{2} * 2^{n+m} - 2^{2m} * (\sqrt{2} + 1)$$

For the continuous variable function: $I(n,x) = \sqrt{2} * 2^{n+x} - 2^{2x} * (\sqrt{2}+1)$, there exists an $x_0 = 1 < n - x_0 < 2$, such that $I(n, x_0)$ has a maximum value. Further calculation shows that $I(n, n-2) > I(n, n-1)$. Therefore, it is preferred that, for an X-tree architecture, level m=n−2 gives the best derivative benefit for additional interconnects: $2^{2(n-2)}[2^{5/2} - (\sqrt{2}+1)]$.

Figure 38A:
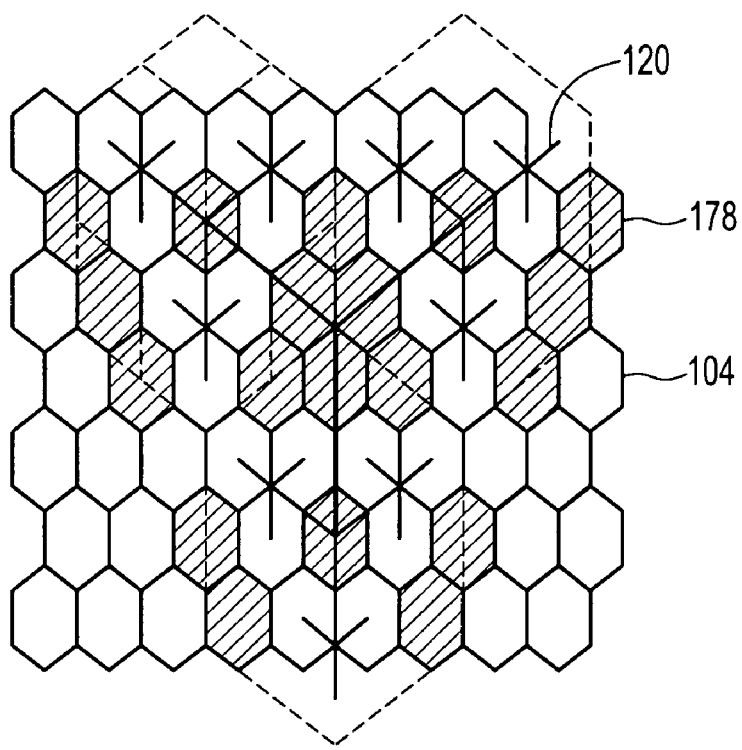
FIGS. 38A-38B show a Y-architecture construction from hexagonal cells, having empty cells according to an embodiment of the present invention.
Figure 38B:
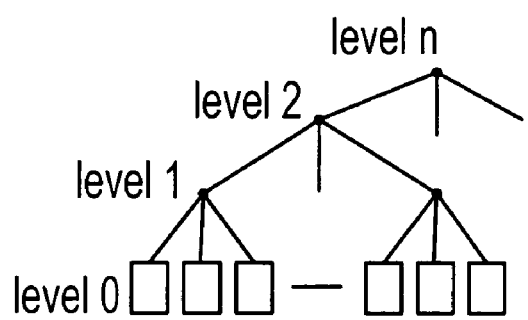
Figure 56:
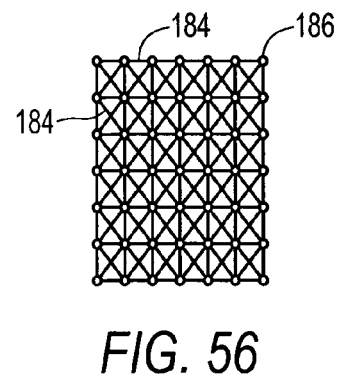
FIG. 56 shows a conventional seven-by-seven interconnect mesh using X-architecture.

Another example of providing the bridges 170 is given with respect to Y-architecture. FIG. 38 shows one type of Y-tree architecture. In the Y-tree architecture of FIG. 38, each of the Y-trees 120 is oriented in the same direction. As shown, there is a plurality of dead cells 178 (shaded in FIG. 56), indicating that some cells are excluded from the wire interconnect covered by the Y-tree.

Figure 39:
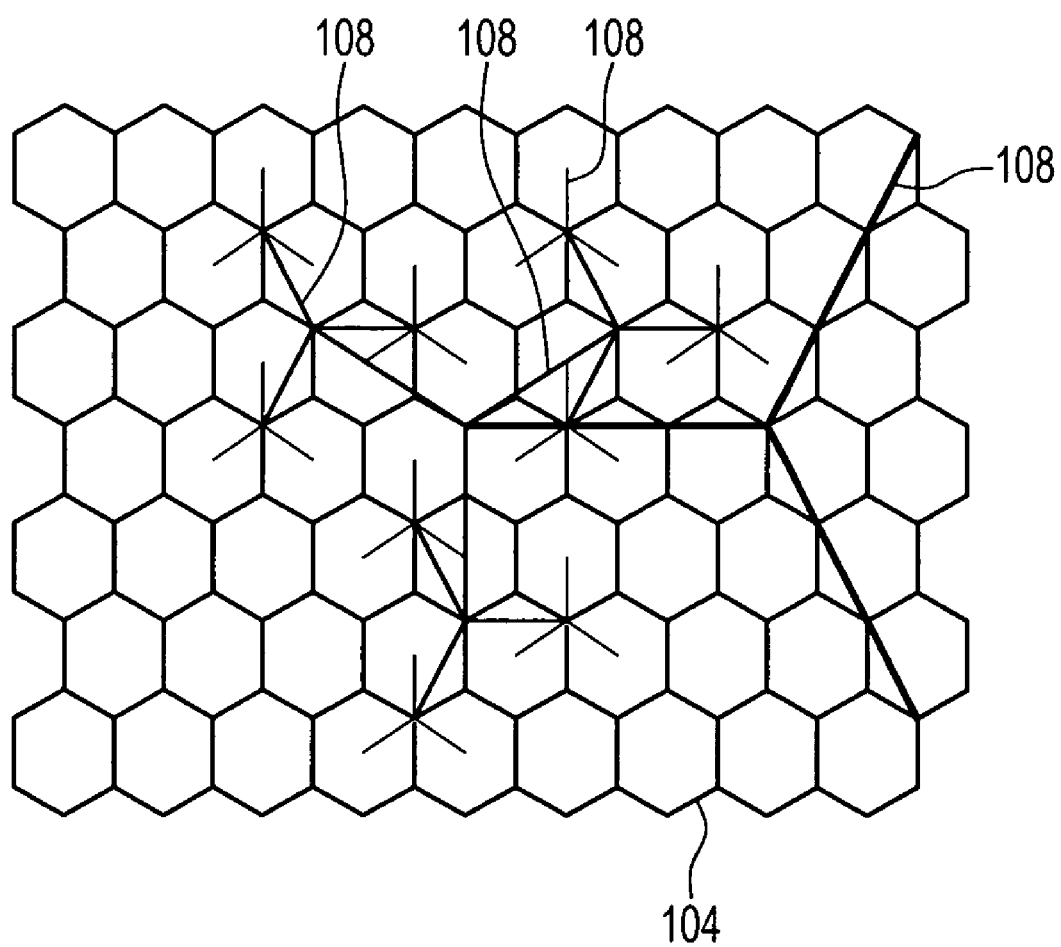
FIG. 39 shows a Y-architecture construction without empty cells, according to a preferred embodiment of the present invention.
Figure 40:
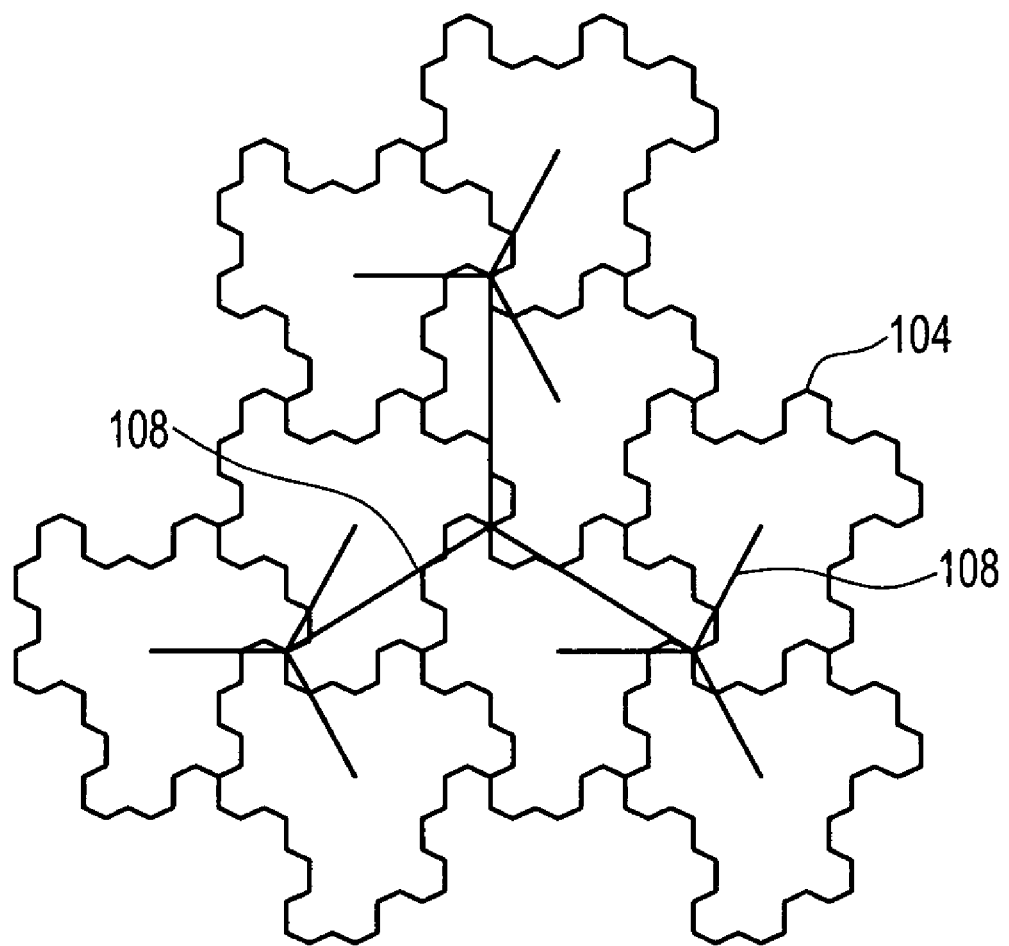
FIG. 40 shows construction from a group of hexagonal cells, without empty cells, according to a preferred embodiment of the present invention.

FIGS. 39 and 40 show levels 0-3 and 4-5, respectively, of an example of another type of Y-tree architecture, in which there are no dead cells, but the orientations of Y's 108 are rotated with each increase of tree levels. The table of FIG. 41 shows values of L and D for Y-trees 120 with n levels. For a large n, $M_{no\_empt}$ (FIG. 39) has a smaller value than $M_{with\_empt}$ (FIG. 38), and is thus preferred.

Figure 42A:
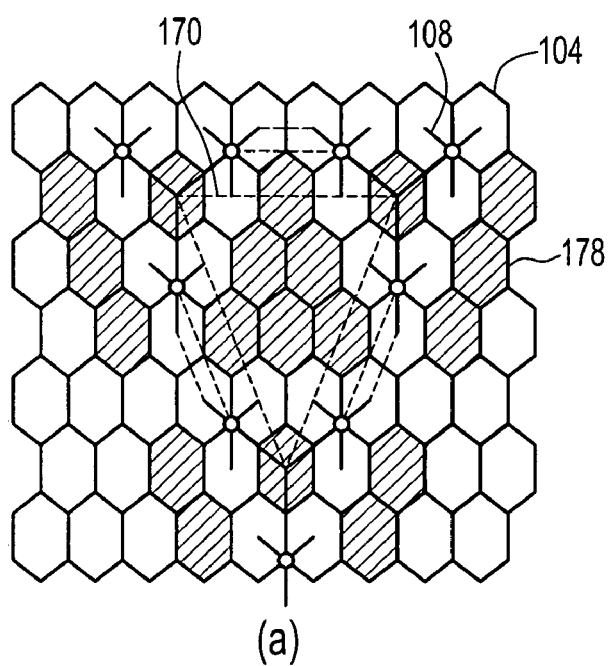
FIGS. 42A-42B show locations of possible bridges for the model of FIG. 39.

However, the rotation of Y's 108 presents additional difficulty for adding bridges 170. The interconnection architecture that is shown in FIG. 42A indicates examples of bridges 170 on the Y-architecture of FIG. 38. Regardless of the level considered, the number of possible bridges 170 was the same, all equaling three. The possible bridges 170 connect adjacent nodes 114 that otherwise are connected only at the root.

The optimization method described above can be used to determine the derivative benefit for a Y-architecture with dead cells 178.

$$A(n, m) = 3^m * 3^m * 3 = 3^{2m+1}$$

$$B(n, m) = -\left(\frac{2}{\sqrt{3}} * \sum_{i=m}^{n-1} 2^i - 2^m\right)$$

$$\Delta L(n, m) = 3^{m+1} * 2^m$$

$$I(n, m) = \sqrt{3} * 3^{m-1} * (2^{n-m-1} - 2) - 3^m$$

The optimal level on which to put the bridges 170 is level n−2, with the maximum incremental benefit: $I(n, n-2) = (2\sqrt{3} - 1) * 3^{n-2}$.

Figure 42B:
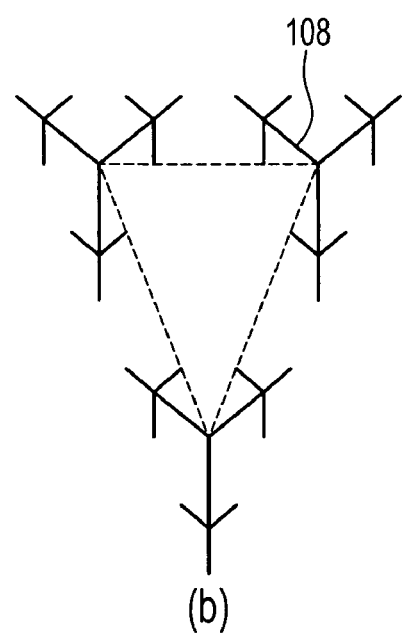

If, instead, the bridges 170 are placed on level n−1, the top level Y 108 can be removed, as shown in FIG. 42B. Then, $\Delta L$ becomes $3^n * 2^{n-1} - \sqrt{3} * 6^{n-1}$, resulting in the incremental benefit of $\frac{1}{2} * 3^{n-1}(\sqrt{3} - 1)$. However, this is still less than 1 (n, n−2).

Figure 43A:
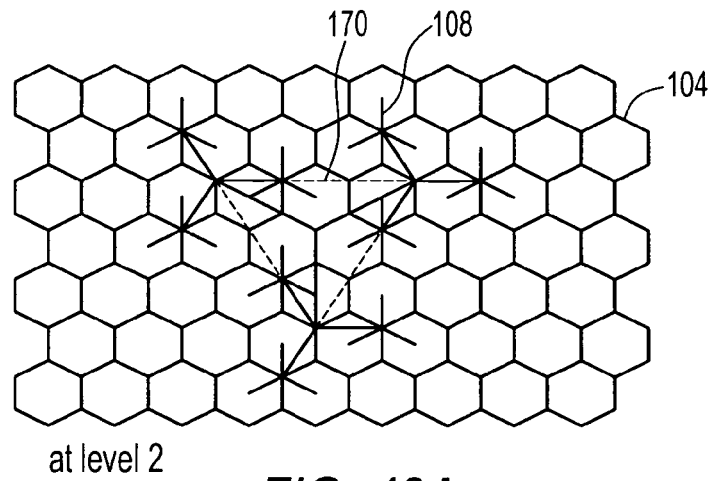
FIGS. 43A-43C show possible bridges for Y-architectures without empty cells on levels 2, 1, and 0, respectively.
Figure 43B:
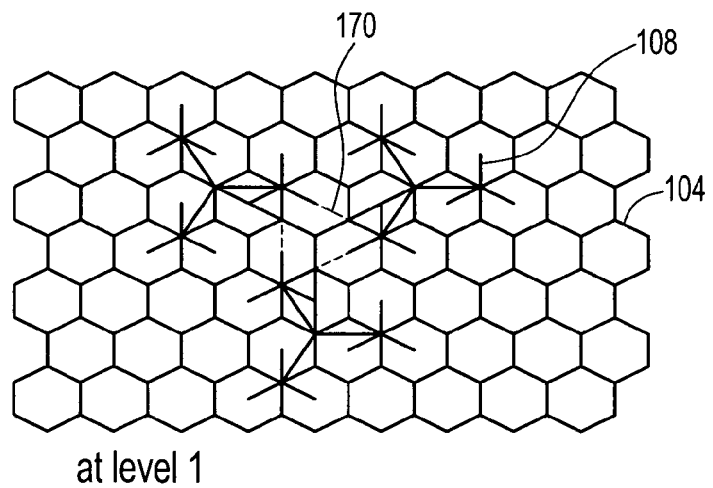
Figure 43C:
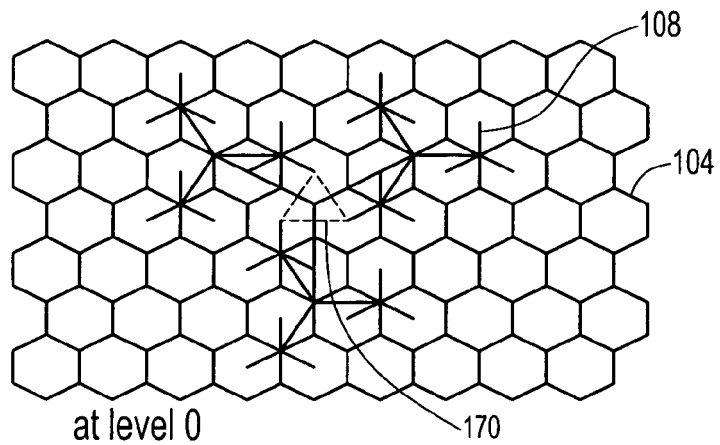

FIGS. 43A-43C show exemplary bridges 170 on a Y-architecture without dead cells, at levels 2, 1, and 0, respectively. Using the optimizing function:

$$A(n, m) = 3^m * 3^m * 3 = 3^{2m+1}$$

$$B(n, m) = -\left(\frac{2}{\sqrt{3}} * \sum_{i=m}^{n-1} \sqrt{3^i} - \sqrt{3^m}\right)$$

$$\Delta L(n, m) 3^{m+1} * \sqrt{3^m}$$

$$I(n, m) = 3^m \left(\frac{2}{3 - \sqrt{3}}\left(\sqrt{3^{n-m}} - 1\right) - 1\right)$$

Again, the maximum incremental benefit is provided at level n−2. Accordingly, for Y-tree architecture with or without the dead cells 178, it is preferred that level m=n−2 is used for a location of the bridges to provide the best derivative benefit for the bridges. $I_{max} = 3^{n-2}(2\sqrt{3} - 1)$ for the architecture with dead cells 178, and $I_{max} = 3^{n-2}(2\sqrt{3} + 3)$ for the architecture without dead cells.

Thus, in an exemplary implementation of the cost function and derivative benefit, it can be determined that, when adding the bridges 170 to X, H, and Y tree structures, the incremental improvement connecting nodes at 2, 3, and 2 levels, respectively, below the root are optimal.

It is advantageous for chip design optimization to focus on the interconnect resources. In the future, significantly greater numbers of routing layers (for example, twelve or more) will be available in high performance circuit designs. Thus, it is desirable to consider various ways to organize on-chip routing resources. However, the prohibitive cost of actually designing and manufacturing a chip with new interconnect architectures makes it difficult to implement and test new interconnect architectures individually. Thus, it is highly desirable to develop a quantitative framework to evaluate the efficiency of different interconnect architectures.

In prior methods of evaluating efficiency, the interconnect length reduction was studied by allowing more routing directions, but all of these methods concentrated on the Steiner cost of a single signal net. Competition over routing resources between different nets is typically ignored using these methods.

According to another aspect of the present invention, an assessment method for determining a benefit of a particular structure is provided. This method adopts a multi-commodity flow (MCF) approach to model the on-chip communication traffic. MCF is a natural way to model communication network traffic. For example, MCF has been used to study wide area communication network traffic. However, due to the high computing complexity of MCF, most uses of this approach adopt heuristic methods to approximate an MCF solution.

A preferred embodiment of the present assessment method extends the MCF algorithm to solve various MCF problems and provides improved chip routing design methods. Solution of MCF finds the optimal throughput for a given routing architecture.

According to a preferred method of the present invention, stated generally, a mesh structure is assumed having uniform communication demand; that is, the routing demand is equal for every pair of nodes. The MCF throughput of the mesh structure is used to measure communication capability of different interconnect architectures. This method is independent of particular test cases, and is independent of placement and routing. The extended MCF according to a preferred assessing method can reflect the exact communication bottlenecks on the chip or network, and it can provide a feasible upper bound of communication.

Algorithms involving this type of MCF can be solved fairly efficiently using, for example, the methods described in N. Garg and J. Koneman, "Faster and Simpler Algorithms for Multicommodity Flow and other Fractional Packing Problems," In Proc. Of the 39$^{th}$ Annual Symposium on Foundations of Computer Science, pp. 300-309, 1998.

Figures 44, 45:
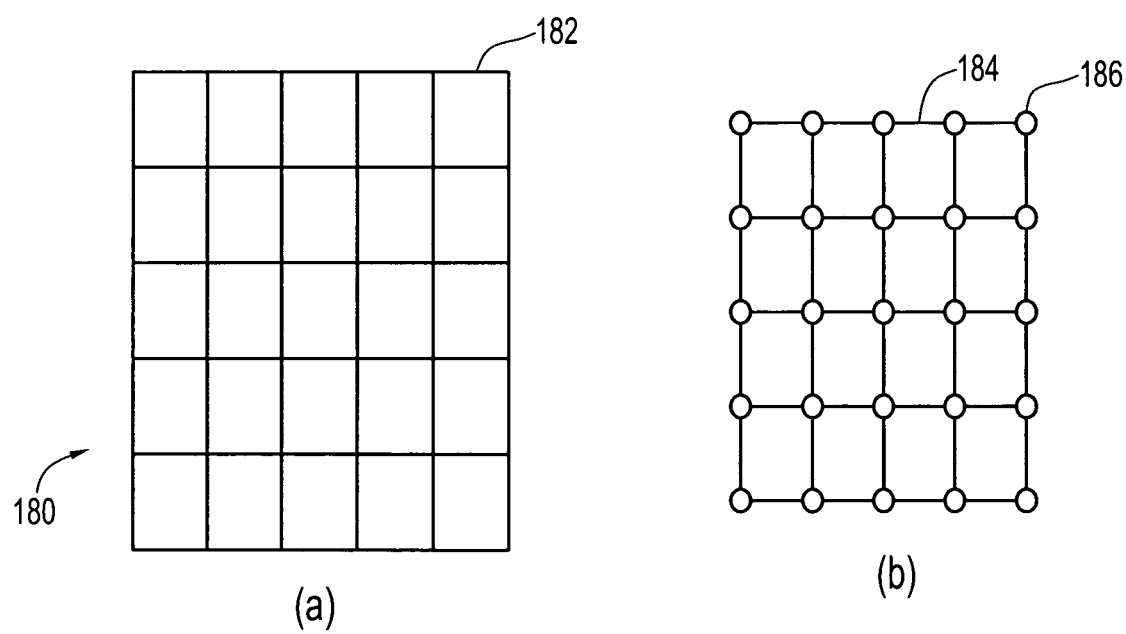
FIG. 44 is a schematic plan view of a conventional five-by-five communication mesh.
FIG. 45 is a graph representation of the communication mesh of FIG. 44 according to an embodiment of the present invention.

Turning now to an exemplary assessment method, FIG. 44 shows a five-by-five communication mesh 180 connected using Manhattan architecture. For Manhattan architecture, communication resources for a group of cells are decomposed into an array of n×n slots 182. Each slot 182 contains a communication terminal, for example, a processor. The mesh 180 of FIG. 44 is an example of a 90-degree mesh structure with twenty-five slots 182. The slots 182 are aligned in rows and columns. Each square tile represents a slot. The mesh structure 180 can be mapped to a graph G={V, E}, as shown in FIG. 45, according to the following rules:

(1) Each slot 180 i corresponds to the node 186 i in the graph.

(2) The adjacency between two slots 182 (i, j) is represented by an edge 184 e=(i, j) in the graph.

(3) The edge capacity c (e) is proportional to the length of the line segment separating the adjacent slots 182, and the number of routing layers.

A uniform communication requirement is assumed; that is, every pair of nodes 186 communicates with an equal demand. All communications are assumed to happen at the same time. The model can be extended to various other communication demands as well such as, but not limited to, Poisson distribution, Rents rule, etc., depending on specific applications. For simplicity and for generalness, the example of uniform pairwise communication is adopted for the description herein. Uniform pairwise communication demand also provides an unbiased symmetry, which makes the solution independent of the test cases, placement, and routing.

Throughput, z, is defined to be maximum amount of communication flow between every pair of nodes 186. The throughput is determined using a MCF model. The flow that starts from node i is defined as "commodity" i. Commodity i starts from node 186 i with the amount of z (N−1), where N=n$^2$ is the number of nodes in the graph, to each of the rest of the nodes with the amount of z. The MCF problem is solved to find the maximum throughput z.

The above MCF problem can be formulated as a linear program in either the node-arc form (LP1), or the edge-path form (LP2). The node-arc form (LP1) of MCF is:

$$\text{Maximize: } z$$

$$S.t. \sum_{j \in neighbor \text{ of } i} (f_{ij}^v - f_{ji}^v) = \begin{bmatrix} -z \cdot (n^2 - 1) & \text{if } i = v \\ z & \text{otherwise} \end{bmatrix} \text{ for all nodes } v, i \in V$$

$$\sum_{v \in V} (f_{ij}^v + f_{ji}^v) \le c_{ij} \text{ for all edges } (i, j) \in E$$

In this linear program flow variable f$^v_{ij}$ represents the flow amount of commodity v on edge 184 (i, j). The edge capacity c$_{ij}$ represents the flow capacity of edge 184 (i, j), in a uniform mesh using X-architecture, and c$_{ij}$ is set to be unitary for all (i, j). The flow injecting to a node 186 is set to be positive and the flow ejecting from a node is set to be negative.

This linear program includes two sets of constraints. The first constraint describes the flow conservation of each commodity v at each node 186 i. The second constraint denotes that the total amount of flow on each edge 184 is no more than the capacity of that edge.

The edge-path form of MCF (LP2) is as follows:

$$\text{Maximize: } z$$

$$S.t.: \sum_{p \in P_{ij}} f(p) - z \ge 0 \text{ for nodes } i, j \in V, i \ne j$$

$$\sum_{p \in P_e} f(p) \le c(e) \text{ for all edges } e \in E$$

In linear program LP2, P$_e$ denotes the set of all paths p containing the edge 184 e, and P$_{ij}$ denotes the set of all paths between nodes 186 i, j. The flow variable f(p) represents the flow amount of path p.

The number of linear constraints in linear program LP1 is |V|$^2$+|E|. Thus, the linear program LP1 can be solved in polynomial time using any polynomial time linear program solver, such as that disclosed in N. Karmarkar, "A new polynomial-time algorithm for linear programming," Combinatorica, 4(4):373-395, 1984. However, when n increases, the number of linear constraints significantly increases (at the rate of n$^4$ for an n×n mesh). Thus, for large cases, it may be impractical to solve the MCF using linear programming.

A combinatorial (1+ϵ)-approximation approach has been proposed to solve the MCF problem. An example of this combinatorial approach is disclosed in N. Garg and J. Konemann, "Faster and Simpler Algorithms for Multicommodity Flow and other Fractional Packing Problems," In Proc. of the $39^{th}$ Annual Symposium on Foundations of Computer Science, pp, 300-309, 1998.

In an embodiment of the present invention, the approach of this approximation algorithm is extended to incorporate edge capacities as variables. This approach adopts the primal-dual structure of the linear program LP2.

Generally stated, a preferred algorithm according to the present invention assigns a nonnegative shadow cost to each edge 184, according to the congestion level at that edge. Initially, all of the shadow costs are set to be equal. Then, the algorithm proceeds in iterations. In each iteration, a fixed amount of flow is rerouted along the shortest path for every commodity. At the end of each iteration, the capacity of every edge 184, and its shadow cost, is adjusted according to the dual linear program.

For every given error tolerance $\epsilon$, a preferred embodiment of this MCF algorithm can find a $(1+\epsilon)$ approximation of the throughput in $$O\left(\frac{1}{\varepsilon'}\log_{1+\varepsilon'}\frac{n}{1-\varepsilon'}n^4\log n\right) \text{time, where } \varepsilon = 1-(1+\varepsilon)^{\frac{1}{3}}.$$

In a preferred embodiment of the approximation method, all fractional flows are used. The throughput, $\hat{z}$, of the fractional flow model, is an upper bound of the throughput, $\tilde{z}$ of the integer flow model. However, networks such as a packet switching network in RAW and Smart Memories, do not require that the flow be an integer. For wire switching networks in FPGA's, the flow amounts can be interpreted as the number of wires, which need to be integers.

In R. Motwani and P. Raghavan, Randomized Algorithms, Cambridge University Press, 1995, pp. 79-83, it was shown that by randomized rounding, with the probability of $1-\epsilon$, one can find $\hat{z}$ approaches $\tilde{z}$ with inequality $\hat{z} \geq \tilde{z}/(1+\Delta^{30} (1/\hat{z}, \epsilon/2N))$, where N is the number of nodes in the mesh, $\epsilon$ is any real number between 0 and 1, and $\Delta+(1/\hat{z}, \epsilon/2N)$ is the value of $\delta$ such that $$[e^{\delta}/(1+\delta)^{1+\delta}]^{1/z}=\epsilon/2N.$$

The MCF algorithm described above will now be used by example to compare throughput of a number of different mesh structures: the 90° mesh 180, a 45° mesh 190, and the 90° and 45° mixed mesh 192. Results show that the 45° mesh 190 can achieve better throughput than the 90° mesh 180. Moreover, 90° and 45° mixed mesh 192 can further improve throughput.

In a first set of examples of a preferred assessment method, a number of routing algorithms are constructed having different capacities and routing orientations. The first three structures are 90° meshes 180 with different edge capacities. In the first architecture, every edge 184 has a unitary capacity. In the second architecture, edges 184 on the same row or column have equal capacity. In the third architecture, edge capacities are flexible, but the sum of the capacities of all of the edges 184 is fixed. The fourth architecture is a 45° mesh 190 where interconnections are routed at 45° angles. The fifth architecture is a mixture of 90° and 45° mesh 182. The sixth architecture is a mixed 90° and 45° mesh 192 with different routing direction assignments.

For the model of uniform edge capacity, all the edge capacity is set to a unit, that is, $c_{ij}=1$ for all edges 184 (i,j) in the graph. This case is used as a basis. It is assumed that the n×n array of slots 182 is evenly distributed in a square area.

In the second interconnection structure, edge capacities $c_{ij}$ are set as variables. However, the capacities of edges 184 in the same row are set to be equal. Likewise, the vertical capacities of edges 184 in the same column are set to be equal. The sum of the vertical edge capacities in a row is set to be n, and the sum of the horizontal edge capacities in a column is set to be n. In other words, the height and width of the array remain n.

Let $c_{Hi}$ be the capacity of horizontal edges 184 in the i-th row, and $c_{Vi}$ be the capacity of vertical edges in the i-th column. We add the 2n variables, $c_{H1}, c_{H2}, \ldots, c_{Hm}, c_{V1}, c_{V2}, c_{Vm}$, to the linear program. The height and width constraints of the array can be expressed as:

$$\sum_{i=1}^{n} c_{Hi} = n \text{ and } \sum_{k=1}^{n} c_{vk} = n$$

For this structure, it is assumed that one can adjust the row height and the column width of the array of processors.

For the third structure we give the program more freedom to choose the best edge capacities. We require only that the total capacity of all edges be a constant. This structure represents the best edge capacity we can allocate for a 90° mesh. The resultant throughput is an upper bound of a 90° mesh architecture.

We set the edge capacities, $c_{ij}$, as variables. The total capacity constraint is expressed as:

$$\sum_{foralledgesi,j} c_{i,j} = 2 \cdot (n^2 - n)$$

Note that $2 \cdot (n^2-n)$ is the number of edges 184 in an n×n mesh. For this structure, we assume that the area of each slot 182 is flexible. We adjust the height and width of each individual slot so that the total area remains the same.

Figure 46:
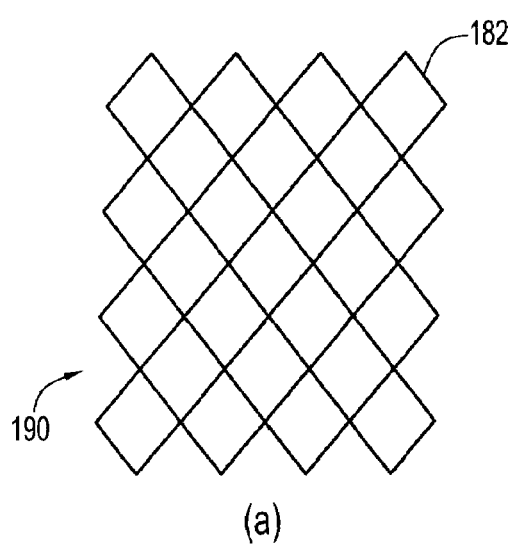
FIG. 46 is a schematic of a 45° mesh according to an embodiment of the present invention.
Figure 47:
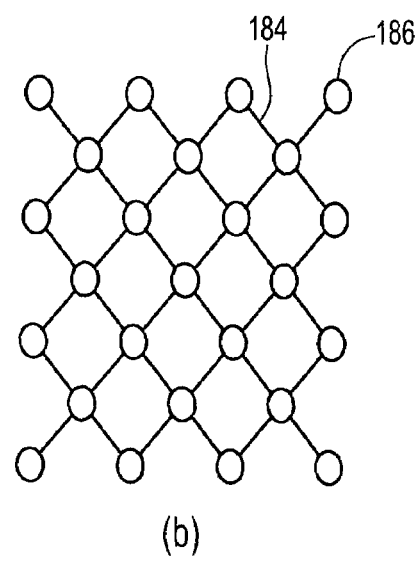
FIG. 47 is a schematic of a communication graph for the mesh of FIG. 25 according to an embodiment of the present invention.

The fourth structure adopts the 45° mesh 190. All interconnects are oriented in 45° or 135° directions. The size of the mesh 190 increases with n. For a 45° mesh 190 of n, the number of nodes 186 is $n^2+(n-1)^2$, and the number of edges 184 is $4(n-1)^2$. FIG. 46 shows an example of 45° mesh 190 of n=5. FIG. 47 illustrates the graph corresponding to the mesh 190. In this structure, we assume that the slots 182 are shaped in diamonds (a square rotated by 45°) and are aligned in 45° and 135° directions. Thus the edge capacity remains a unit; that is, $e_{ij}=1$.

Figure 48:
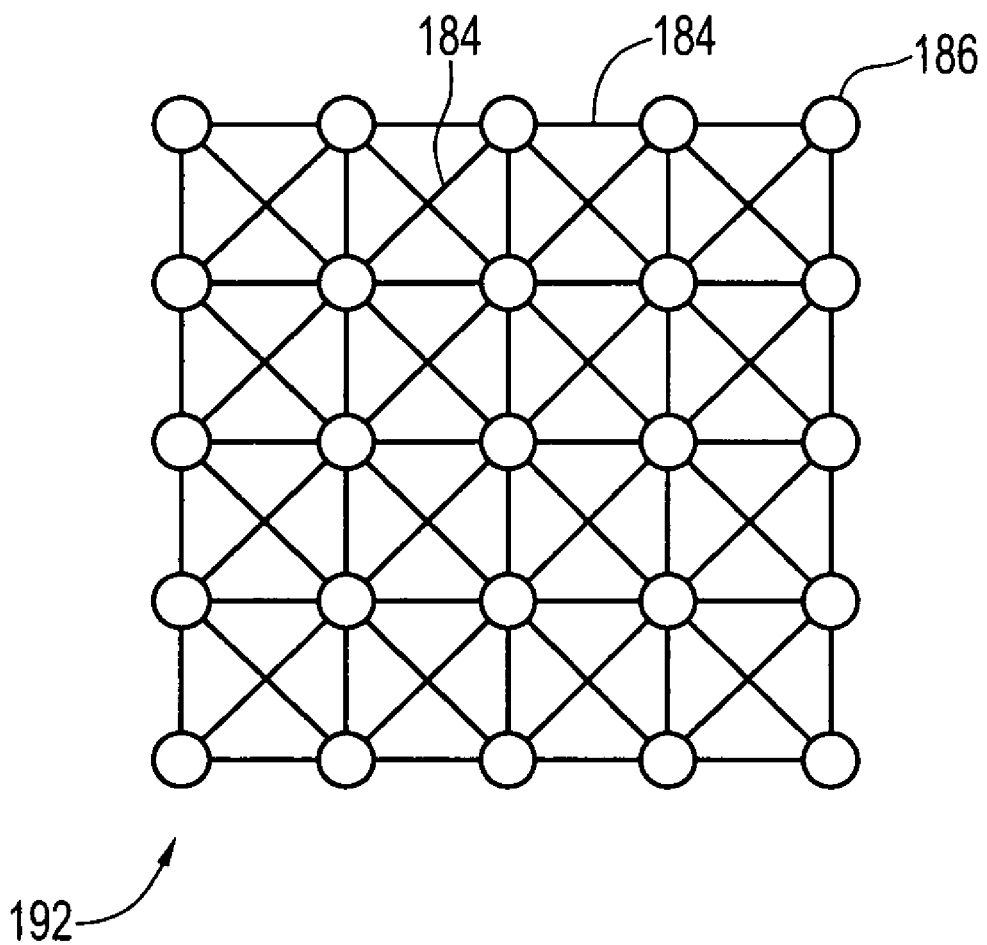
FIG. 48 is a graph representation of the communication mesh of FIG. 2, with 45° interconnects added.

In the fifth structure, we add diagonal edges; that is, 45° edges and 135° edges, to the 90° mesh 180 of Manhattan architecture to form the structure represented by the communication graph shown in FIG. 44. FIG. 48 illustrates an example of the mixed mesh 192 for n=5. FIG. 44 shows the slot arrangement. Mixed 90° and 45° meshes 192 allow more freedom on routing directions. For an n×n mixed mesh, the number of nodes 186 is $n^2$ and the number of edges 184 is $2(n-1)^2+2(n^2-n)$.

As shown in FIG. 48, the edges 184 are oriented in 0°, 90°, 45°, or 135° angles. All nodes 186 are aligned in rows and columns. Thus, all rectilinear edges 184 in the 45° and 135° directions have the same capacity, and all of the diagonal edges in the 0° and 90° directions have the same edge capacity. The length of the diagonal edge 184 in the 45° direction or 135° direction is $\sqrt{2}$ times that of the rectilinear edge in the 0° or 90° directions. Thus, if routing a number of interconnects on one of the rectilinear edges 184 consumes one unit of routing area, then routing the same number of interconnects on the diagonal edges would consume $\sqrt{2}$ units of routing area.

In other words, for a pair of routing layers, if a capacity of x can be allocated to the rectilinear edges 184, only a capacity of $x/\sqrt{2}$ can be allocated to the diagonal edges. If we let $c_1$ be the capacity of the rectilinear edges 184 and $c_2$ be the capacity of the diagonal edges, the area constraints can be expressed as $c_1+\sqrt{2}c_2=1$. In this way, the total area is equal to the constant area of uniform structure.

Figure 49:
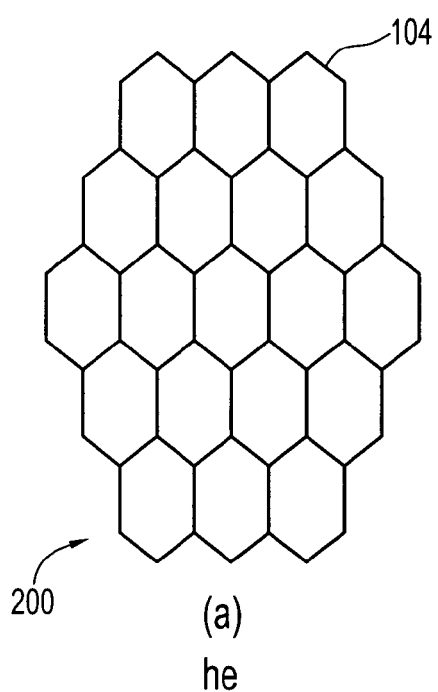
FIG. 49 is a schematic plan view of a communication mesh having a hexagonal architecture according to an embodiment of the present invention.
Figure 50:
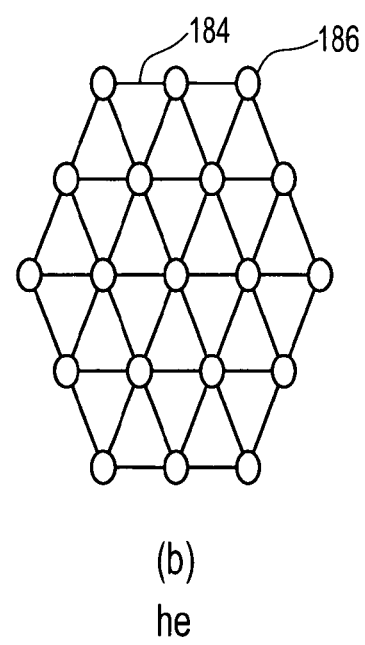
FIG. 50 is a graph representation of the communication mesh of FIG. 49 being connected by routing wires having a Y-architecture according to an embodiment of the present invention.

FIG. 49 shows a hexagonal mesh 200 including a number of hexagonal cells 104 according to a chip embodiment incorporating an alternative, triangular embodiment of Y-architecture. FIG. 50 shows a corresponding communication graph. In FIG. 50, all of the edges 184 are symmetrically oriented in 0°, 60°, and 120° directions, and every edge has the same length. Accordingly, the routing area constraint for this embodiment of Y-architecture can be expressed as $c_1+c_2+c_3=2$, where $c_1$, $c_2$, and $c_3$ are the edge capacity for edges 184 oriented in 0°, 60°, and 120° directions, respectively.

The above routing area constraint can be added into the linear programs LP1 or LP2, treating the edge capacities as variables. The optimal solution of the linear program produces an optimal routing resource allocation for different routing directions. The routing resource allocation problem can be formally formulated in the following way:

Input: communication graph G=(V, E), k different routing channels $\{R_1, \ldots, R_k\}$, where $$\bigcup_i R_i = E \text{ and } \bigcap_i R_i = \Phi;$$

edge capacity $c_1$ for every edge in the routing channel $R_i$ and area constraints $$\sum_i \alpha_i C_i = 1$$

Output: a routing resource allocation $\{c_i\}$, such that the communication graph G=$\{V, E\}$ has maximum throughput.

The routing resource allocation problem can be written as the following linear program:

$$\text{Min: } \sum_i \alpha_i C_i$$

$$S.t. \sum_{p \in P_{i,j}} f(p) \geq 1 \quad \text{for all distinct vertices pair } i, j \in V$$

$$\sum_{p \in P_e} f(p) \leq C_i \quad \text{for all edges } e \in R_i$$

This linear program finds the minimum routing area that can satisfy the unit pairwise communication demand. The dual program of this linear program is:

$$\text{Max: } \sum_{ij} \lambda_{i,j}$$

-continued $$S.t. \ \lambda_{i,j} \leq \sum_{e \in P_{i,j}} d_e \quad \text{for all distinct vertices pair } i, j \in V$$

$$\sum_{e \in R_i} d_e \leq \alpha_i \quad \text{for all routing channel } R_i$$

The dual program assigns a nonnegative shadow cost de to each edge 184 e, such that the sum of the shortest distances between every distinct pair of nodes 186 is maximized. The constraints in the above equations denote that the total shadow costs of all edges 184 in a routing channel are smaller than or equal to the area coefficient of that routing channel.

By extending the combinatorial (1+$\epsilon$)-approximation scheme as described above, the routing resource allocation problem can be solved. In a preffered method, a shadow cost is determined by the flow congestion level on each edge 184. Let $g(e)=(f(e))/(c_e)$ be the congestion level of edge 184 e, where f(e) is the total flow amount going through edge e, and $c_e$ is the capacity of e. The shadow cost d(e) is computed using:

$$d(e) = \frac{\exp(\beta(g(e)-g))}{\sum_{e' \in E} \exp(\beta(g(e')-g^*))}, \text{ where}$$

$$g^* = \max\{g(e) \mid e \in E\}, \text{ and } B \text{ is a}$$

constant related to desired approximation error $\epsilon$.

Initially, all of the shadow costs are set to be equal. Then, the algorithm proceeds in iterations. In each iteration, a fixed amount of flow is rerouted along the shortest path for every commodity. At the end of each iteration, the capacity of every edge 184 and its shadow cost is adjusted according to the dual linear program. FIG. 51 shows exemplary pseudo-code of the routing resource allocation algorithm.

The assessment algorithm will now be used to compare the Manhattan architecture, the Y-architecture, and the X-architecture for both rectangular and symmetrical chip designs. Vias 132 become an important concern when the number of routing layers increases. An embodiment of the present invention provides a network flow model that considers the vias 132. The basic assumption made is that each via 132 will block one routing track. For each slot 182, we set an upper bound on the total number of vias 132 and interconnects across the node 186.

Figure 52:
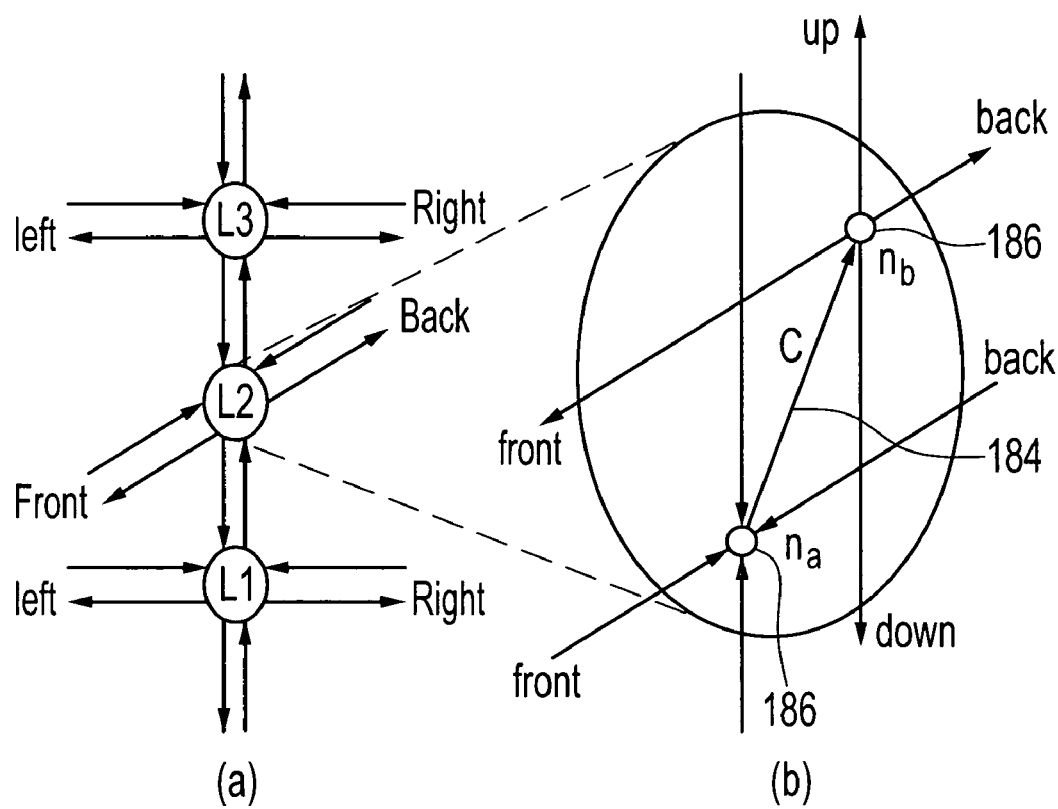
FIG. 52 shows a network flow model for multilayer routing according to an embodiment of the present invention.

For example, suppose there are k routing layers. Each slot 182 is now represented by k routing cells as shown in FIG. 52. Each routing cell includes two nodes 186: $n_a$ and $n_b$. Node na takes all of the incoming edges from the neighboring routing cells, and node $n_b$ ejects edges to neighboring routing cells. An edge 184 with capacity c directs from node $n_a$ to node $n_b$. This edge 184 is used to restrict the total number of vias 132 and interconnects crossing the routing cell. Using this flow model, we compare the communication throughputs with different routing layer assignments using the MCF model.

To assess performance of the above-described MCF method, we used Matlab's linear program package on a Sun Ultra10 workstation to compute MCF solutions. For a case with 100 nodes, the run time exceeds 24 hours. We then implemented the MCF algorithm and the above-described routing resource allocation algorithm using C programming language. The implementation derived the MCF solutions for cases with up to 289 nodes within 12 hours.

Figure 53A:
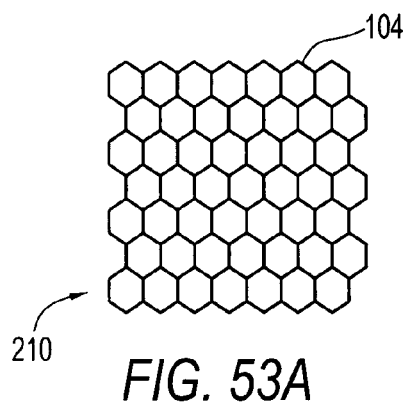
FIG. 53 is a graph representation of a seven-by-seven communication mesh being connected by interconnects having a Y-architecture, according to an embodiment of the present invention.
Figure 53B:
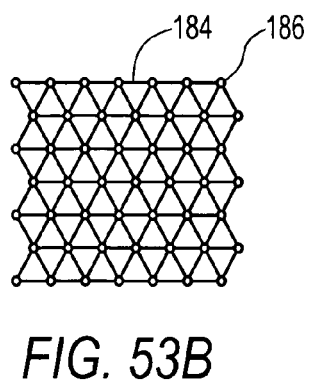
Figure 54:
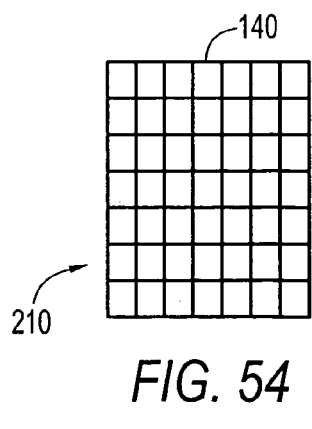
FIG. 54 shows a conventional seven-by-seven interconnect mesh using Manhattan architecture.

Using the present routing resource algorithm, we compared the throughput of n×n meshes 210 using Manhattan architecture, Y-architecture, and X-architecture. FIG. 53 shows a seven-by-seven mesh using hexagonal cells 104, and FIG. 54 shows an interconnection graph of the mesh of FIG. 53 using Y-architecture. FIGS. 55A and 55B show a seven-by-seven mesh 210 and interconnection using a rectilinear mesh and Manhattan architecture, and FIGS. 56A and 56B show a seven-by-seven mesh and interconnection using a rectilinear mesh and X-architecture. For an n×n mesh, the enclosing box of the slots 182 is close to a rectangle. The throughput of an n×n mesh using a particular interconnect architecture demonstrates the communication ability of that interconnect architecture on a rectangular chip.

For an n×n mesh with Y-architecture, there are $3n^2-4n+1$ edges; for an n×n mesh 210 with Manhattan architecture, there are $2n^2-2n$ 0° and 90° edges; and for an n×n mesh with X-architecture, there are $2n^2-2n$ edges on 0° or 90° edges and $2(n-1)^2$ edges in the 45° or 135° direction. To fairly compare the throughput of meshes with different interconnect architectures, the same amount of routing resources should be allocated to meshes having the same size.

FIG. 57 shows the results of uniform edge capacity meshes with n =2 to 20. The table shows the number of nodes 186 and throughput z. From this result, at least the following conclusions can be drawn:

The throughput is 1/n when n is odd and $(n^2-1)/n^3$ when n is even.

Figure 58A:
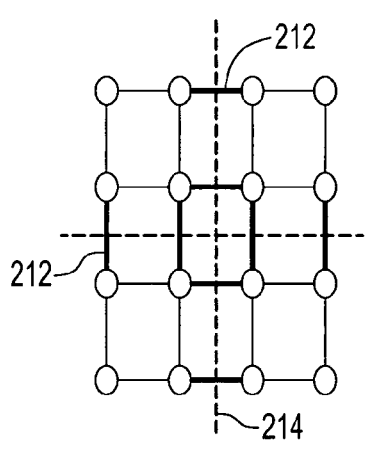
FIGS. 58A and 58B are graphs of n=4 and 5 meshes, respectively, showing bottlenecks of communication flow.
Figure 58B:
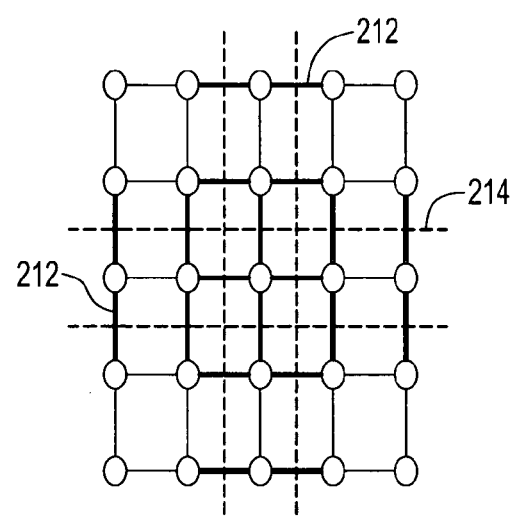

The throughput is limited by edges 184 on the middle column and row. When n is an even number, edges in the central row and column form the bottleneck of the flow. When n is an odd number, the two columns and two rows form the bottleneck. FIGS. 58A and 58B show the bottleneck of communication flow for n=4 and 5, respectively. The congested edges 212 are marked with bold lines. Note that the bottlenecks form the horizontal and vertical cut sets. The cut lines 214 are shown in FIGS. 58A and 58B as dashed lines.

For example, for equal n, the throughput of a 90° mesh with uniform row and column capacities is exactly the same as that of the 90° mesh with fixed edge capacities. No throughput improvement is obtained because the total capacity of the edges in each column and row is fixed.

For n=2 to 10, FIG. 59 shows the results of 90° mesh with fixed total edge capacities. The fourth column provides the throughput improvement compared to that of 90° mesh with uniform edge capacity. As the total capacity of each row or column is no longer limited, the average throughput improves 29.7% from n=4 to 10.

Figure 61:
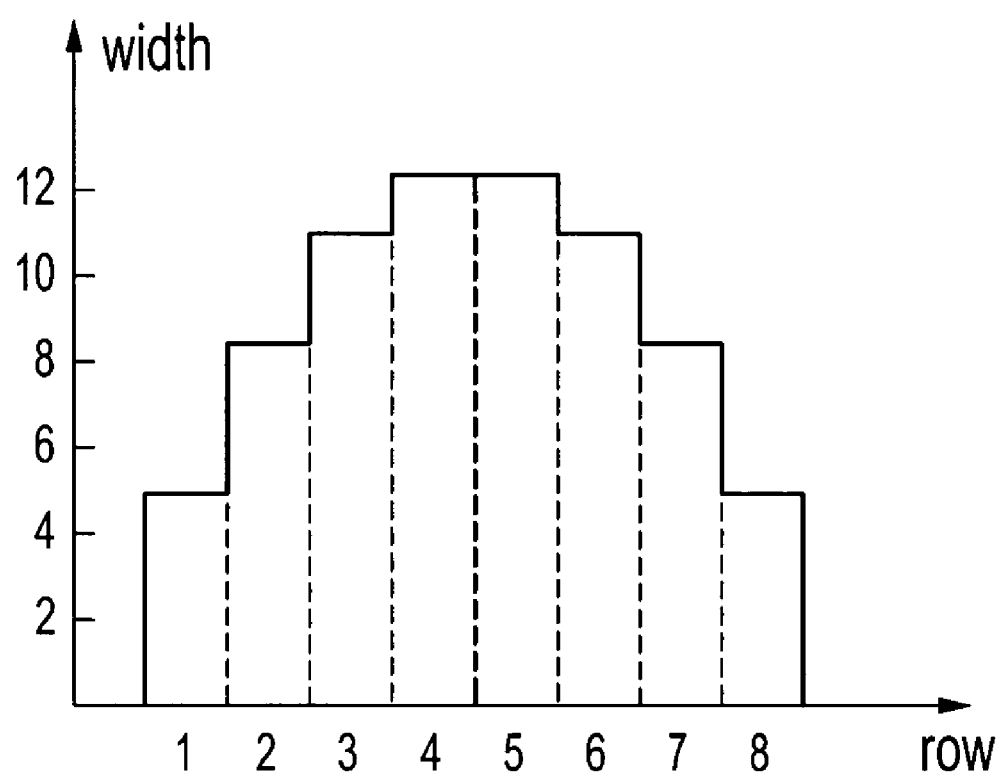
FIG. 61 is a graph illustrating optimal sums of rows in a 9×9 mesh.

The results also show that all edges 184 are congested. The optimal edge capacity is no longer uniform. The capacity is larger for the edges in the middle row and middle column. FIG. 60 shows the optimal edge capacities for all the vertical edges in a 6×6 mesh. The sum of all the capacities in each row is listed. FIG. 61 illustrates the optimal sums of the rows in a 9×9 mesh. Note that there are eight rows of vertical edges in a 9×9 mesh. Thus, the chip area is no longer a square, but a convex area.

FIG. 62 shows the results of a 45° mesh for n=2 to 12. To compare the results in FIG. 62 and FIG. 57, we use the cases with almost the same number of nodes 186. For example, both the case of n=4 in FIG. 62 and the case of n=5 in FIG. 57 contain 25 nodes. The case with 45° mesh achieves the throughput of 0.209, which gains a 4.18 percent improvement. Also, we compare the case of n=7 in FIG. 62 with the case of n=9 in FIG. 57. The case in FIG. 62 contains 85 nodes, which has 4 more nodes than the case in FIG. 57. The throughput of the 45° mesh case is 0.1260, which is 13.16% more than that of the 90° mesh case.

Figure 63A:
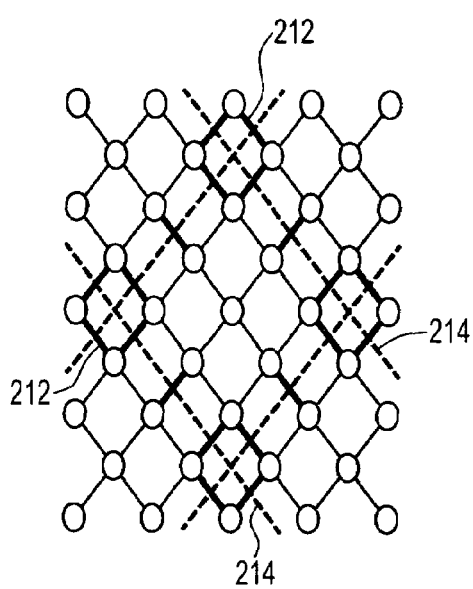
FIGS. 63A-63B are interconnect graphs showing flow congestion for 45° mesh structures, for n=5 and n=6, respectively according to an embodiment of the present invention.
Figure 63B:
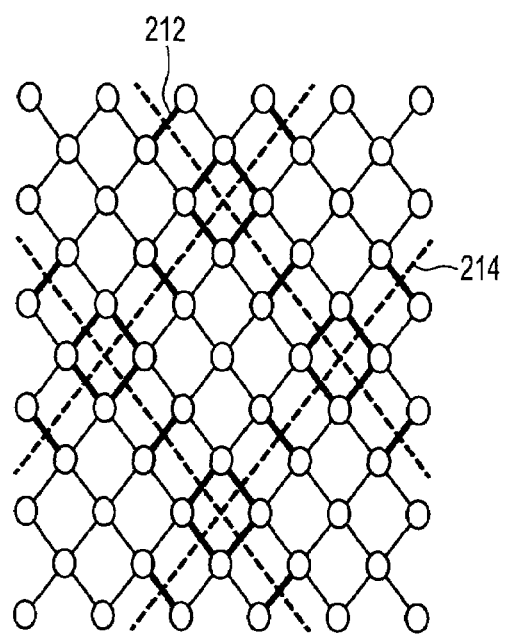

As shown in FIGS. 63A and 63B, the congested edges 212 also present a different pattern, in that they form four cut sets at four corners. FIGS. 63A and 63B show the flow congestion in 45° mesh for n=5 and n=6, respectively. The congested edges 212 are in bold lines, and the cut lines 214 are in dashed lines.

Figure 64A:
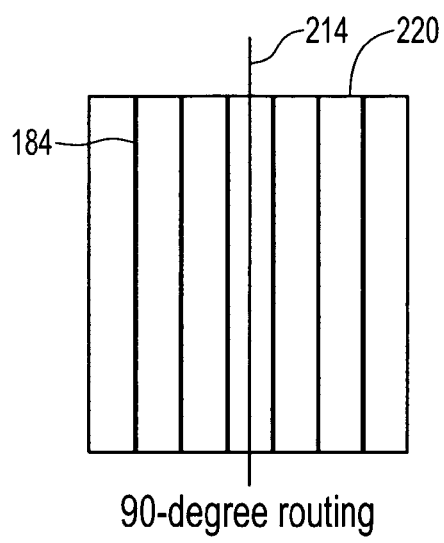
FIGS. 64A-64B are schematics showing vertical and horizontal routing layers for 90° routing according to an embodiment of the present invention.
Figure 64B:
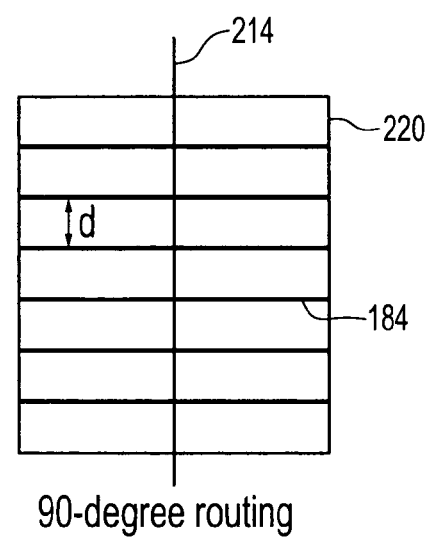

FIGS. 64A-64B and FIGS. 65A-65B illustrate why 45° routing is preferred to 90° routing. Assume that we have a square-shaped chip 220 with two routing layers. FIGS. 64A-64B illustrate the case of 90° routing and FIGS. 65A-65B depicts the case of 45° routing. A cut line 214 is shown for the horizontal congested edges in FIGS. 64A-64B. Only the interconnects on the horizontal routing layer could cross the cut line and the number of interconnects across the cut line is d/D, where d is the interconnect pitch and D is the dimension of the chip 220. A similar cut line 214 is drawn in FIGS. 65A-65B. The number of edges 184 across the cut line in each layer is $d/\sqrt{2}D$. The total number of interconnects crossing the cut line for the two layers in FIGS. 65A-65B is $\sqrt{2}d/D$. Thus, the upper bound of throughput increases to $\sqrt{2}=1.414$. However, the throughput is now limited by the cut edges at four corners.

FIG. 66 depicts the results from the 90° and 45° mixed mesh structure. Column 2 lists the throughput z. Column 3 lists throughput improvements over the 90° meshes with uniform edge capacity. Columns 5 and 6 list the best capacity for horizontal and vertical edges, $c_1$, and the best capacity for 45° edges, $c_2$, respectively. Column 7 lists the normalized capacity ratio of the diagonal edges to the Manhattan edges.

At least the following observations can be made with regard to FIG. 66:

The throughput of the mixed mesh 192 is better than the 90° mesh 180, given the equal communication resource. The improvement in the throughput is up to 20.04% for a large number of nodes. The improvement is also better than 45° mesh 190 in terms of throughput.

With n increasing, the optimal ratio for the capacity of the 45° edge to the 90° edge approaches 5.6.

Figure 67:
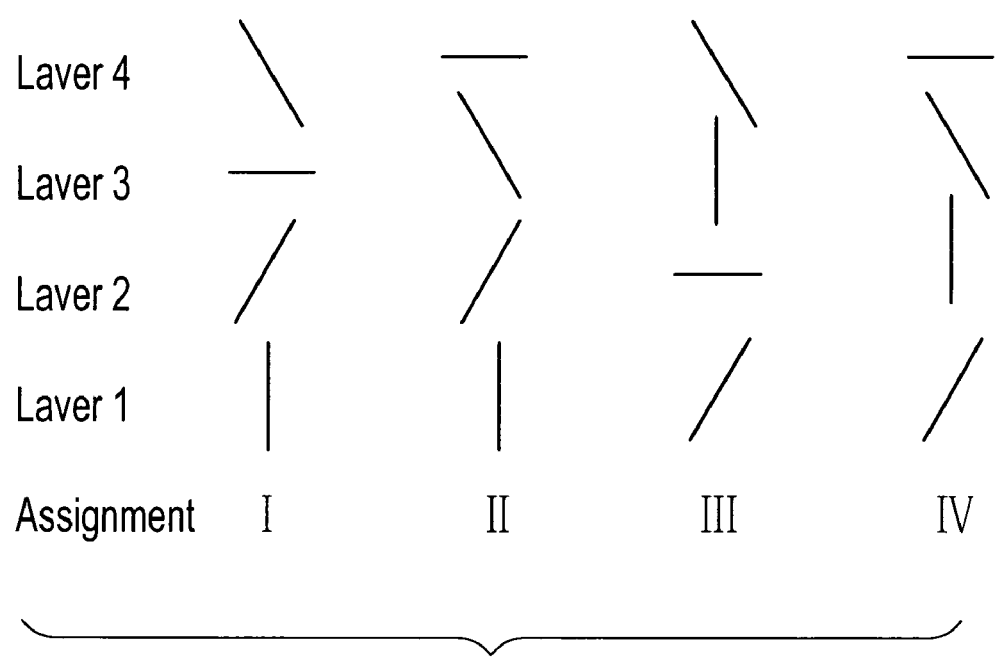
FIG. 67 is a schematic showing multiple routing layer assignments for a mixed 45° and 90° set of routing layers according to an embodiment of the present invention.

Using the MCF model in FIG. 52, one can compute the optimal routing direction assignment for mixed 45° and 90° routing. Assume that there are four routing layers, and each of them is assigned to a different routing direction. FIG. 67 shows four different routing layer assignments. The throughputs under four different assignments are listed in FIG. 68. As shown, the throughputs with assignments IV and I are about 16% larger than the throughputs with assignments II and III.

Figure 69:
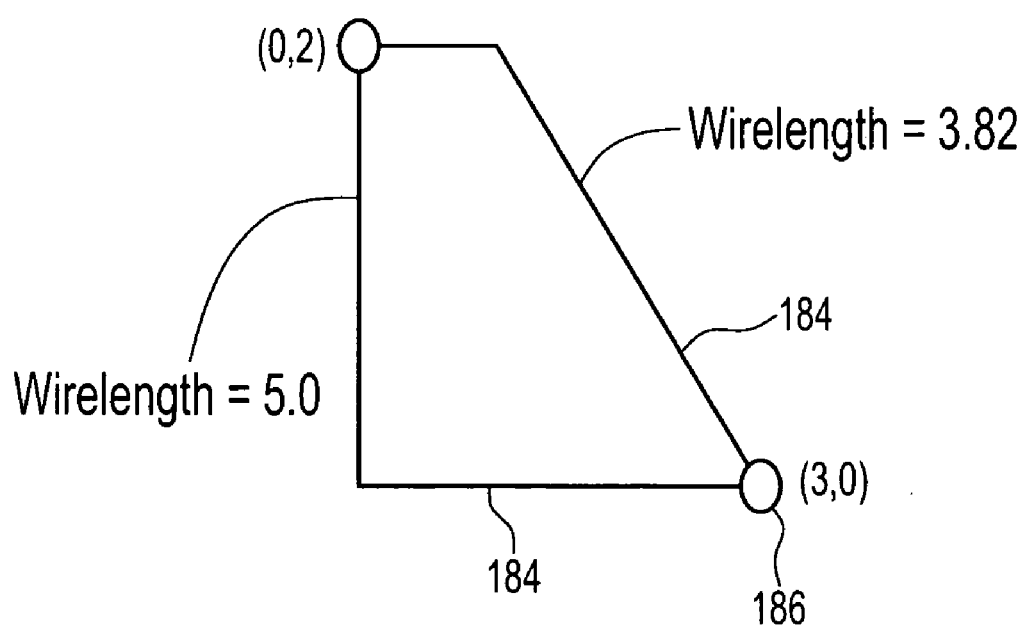
FIG. 69 is an illustration of routing layers between two nodes, showing both Manhattan and diagonal routing directions according to an embodiment of the present invention.

FIG. 69 illustrates why interleaving the Manhattan routing layers and diagonal routing layers can produce better throughput. As shown in FIG. 69, given two points (nodes 186) on the plane, the shortest way to connect them is always a Manhattan line plus a diagonal line. Thus, if the Manhattan routing layer and the diagonal routing layer are interleaved, the interconnects can go along the shortest paths without a cost of more vias. This will produce better throughput.

In an exemplary comparison, the sum of all edge capacities is set to be equal to $2n^2-2n$ for all n×n meshes, and the routing resource algorithm is used to find the optimal allocation of edge capacities. FIG. 70 shows throughputs of n×n meshes for Manhattan architecture, Y-architecture, and X-architecture, respectively, for n from 2 to 17. The throughput was normalized using a factor $m^{0.5}(m^{-1})$, where m is the number of nodes in the mesh. By doing so, the total amount of communication demand and total edge capacities are kept independent of the dimensions of the mesh. The third and fourth columns of FIG. 70 show throughput and normalized throughput of meshes using Manhattan architecture. The fifth and seventh columns depict the normalized throughput of meshes using Y-architecture and X-architecture, respectively. The sixth and the eighth columns list the determined throughput improvement achieved by Y-architecture and X-architecture, respectively, over the Manhattan architecture.

As shown in FIG. 70, for n from 10 to 17, Y-architecture provides an average improvement of 30.7% for an n×n mesh, and X-architecture achieves a 34.5% improvement For a 17×17 mesh, Y-architecture provides a throughput improvement of 31.1% and X-architecture achieves an improvement of 34.6%. Additionally, for Y-architecture and Manhattan architecture, equally distributed edge capacities produce maximum throughput on n×n meshes. For X-architecture, the optimum ratio of the area of diagonal routing edges to that of Manhattan edges 184 is shown in the far right column of FIG. 70. This ratio approaches 5.65 when n increases.

Figure 71:
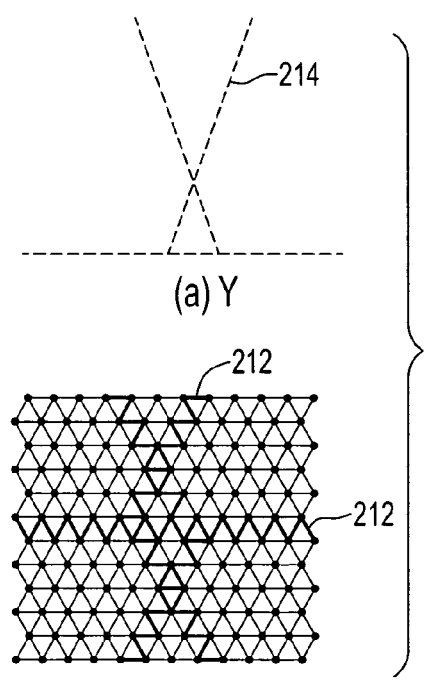
FIG. 71 shows a congestion pattern of a twelve-by-twelve mesh using Y-architecture according to an embodiment of the present invention.
Figure 72:
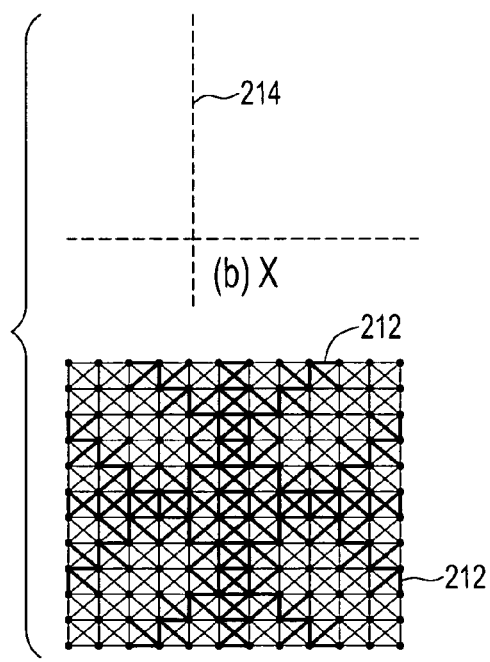
FIG. 72 shows a congestion pattern of a twelve-by-twelve mesh using X-architecture according to an embodiment of the present invention.

FIGS. 71 and 72 show bottlenecks of communication flows for 12×12 meshes using different interconnect architectures. The fully saturated edges 282 are shown using bold lines. As shown, the saturated edges form vertical and horizontal cut sets for both interconnection architectures. The cut lines 214 are shown as a symmetrical half using dashed lines. By summing the capacities of the edges passing across the cut lines 214, a throughput upper bound for n×n meshes with different interconnect architectures can be derived.

For example, for Manhattan architecture, there are n edges 184 crossing each cut line. The total edge capacity is n. For Y-architecture, there are 2n−1 edges 184 passing across each cut line 214, and each edge has capacity ⅔, so that the total edge capacity crossing the cut line is (4n−2)/3. When n approaches infinity, an n×n mesh using Y-architecture can have (4/3−1)−33.3% more flow crossing the cut line 214. Thus, Y-architecture can achieve up to 33.3% throughput improvement over Manhattan architecture on a squared mesh.

For X-architecture, there are 2(n−1) diagonal edges and n Manhattan edges crossing each of the two cut lines 214. To achieve maximum throughput, the ratio of the capacity for diagonal edges and the capacity for Manhattan edges is 5.6. Under this ratio, the edge capacities are 0.1515 and 0.6 for the Manhattan edges and diagonal edges respectively. The total flow amount that can go across the cut line is 1.3535n−1. When n approaches infinity, the throughput improvement bound is thus 35.6%.

For all of the cases that have been tested (n=2 to 17), these kind of central horizontal cut sets were observed using X-, Y-, and Manhattan architectures. Furthermore, in all of these cases, there is no flow passing through the same cut set more than once. If this is true for all n×n meshes, the improvement upper bounds derived are exact throughput improvement rates.

The same analysis was performed on symmetrical chip shapes as described above. A rectangular chip has communication bottlenecks on its respective two middle cut lines. The physical dimension of the middle part of the chip restricts the communication flow, and thus prevents larger throughput. Using a convex-shaped chip, better throughput is possible by allowing more wires to cross the original middle cut lines. This is verified using an embodiment of the routing algorithm of the present invention.

Figure 73A:
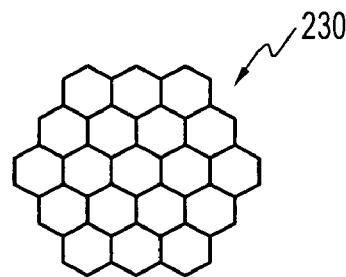
FIGS. 73A-73F show level two symmetrical meshes and communication graphs for Y-architecture, X-architecture, and Manhattan architecture, respectively, according to an embodiment of the present invention.
Figure 73B:
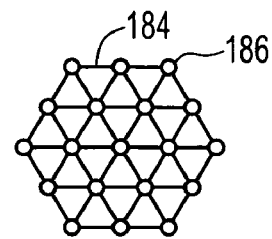
Figure 73C:
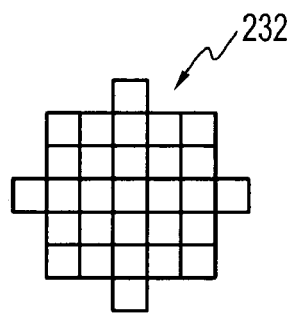
Figure 73D:
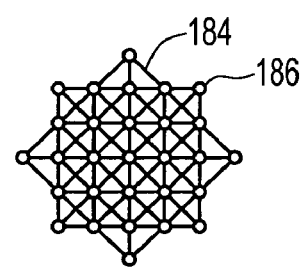
Figure 73E:
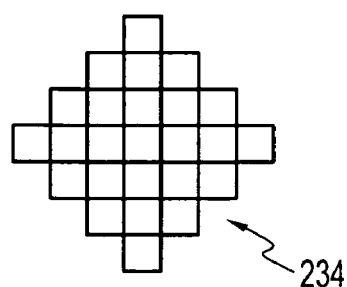
Figure 73F:
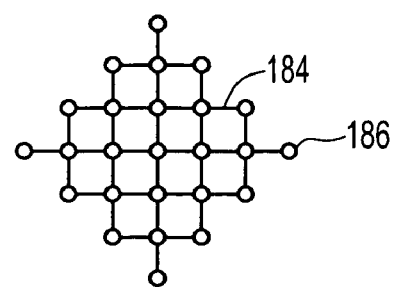

As shown in FIGS. 73A-73F, a shape of the chip 100 is designed to be a convex polygon as close as possible to a circle and symmetrical to all routing directions. The throughput of the different structures was then compared. FIGS. 73A and 73B show a level 2 hexagonal mesh 230, which is the symmetrical structure corresponding to the Y-architecture. FIGS. 73C and 73D illustrate an octagonal mesh 232, which is the corresponding symmetrical structure to the X-architecture. Finally, FIGS. 73E and 73F show a diamond-shaped mesh 234, which is symmetrical to the Manhattan architecture.

Using the above-described routing algorithm, throughput of the symmetrical structures 230, 232, 234 for the Y-architecture, X-architecture, and Manhattan architecture was computed. FIG. 74 shows the throughput of hexagonal meshes 230 from level 1 to level 7. FIG. 75 shows the throughput of octagonal meshes 232 from level 2 to level 4. FIG. 76 shows the throughputs of diamond meshes 234 from level 1 to level 12. Normalized throughputs by total edge capacities are also shown in FIGS. 74-76.

As shown, for Y-architecture, a hexagonal mesh 230 with 169 nodes, for example, produces 17.3% more throughput than a 13×13 rectangular mesh using the same interconnect architecture. For X-architecture, an octagonal mesh with 101 nodes, for example, can achieve 13.4% more throughput than a 10×10 rectangular mesh, which has 100 nodes. For Manhattan architecture, a diamond-shaped mesh 234 with 265 nodes, for example, provides a throughput of 5.61e−4, while a 16×16 mesh using the same interconnect architecture, which has 256 nodes, produces a throughput of 4.88e−4, so that a throughput of diamond mesh 234 over square mesh for Manhattan architecture is determined to be 15%.

Figure 77A:
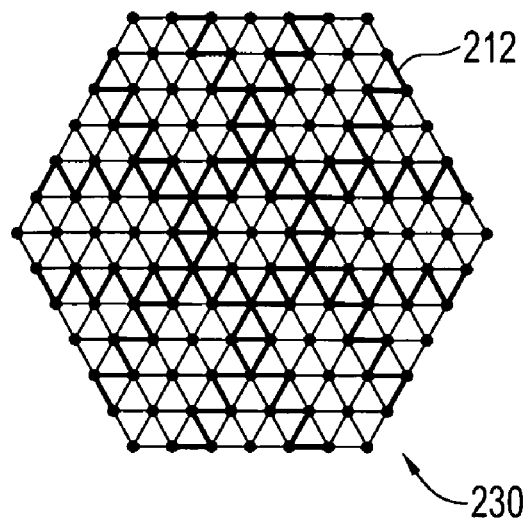
FIGS. 77A-77C illustrate the flow congestion patterns of a level 6 hexagonal mesh, a level 3 octagonal mesh, and a level 8 diamond mesh, respectively, according to an embodiment of the present invention.
Figure 77B:
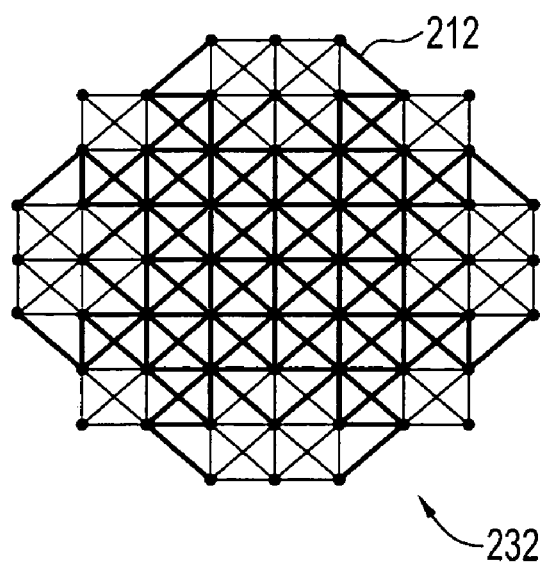
Figure 77C:
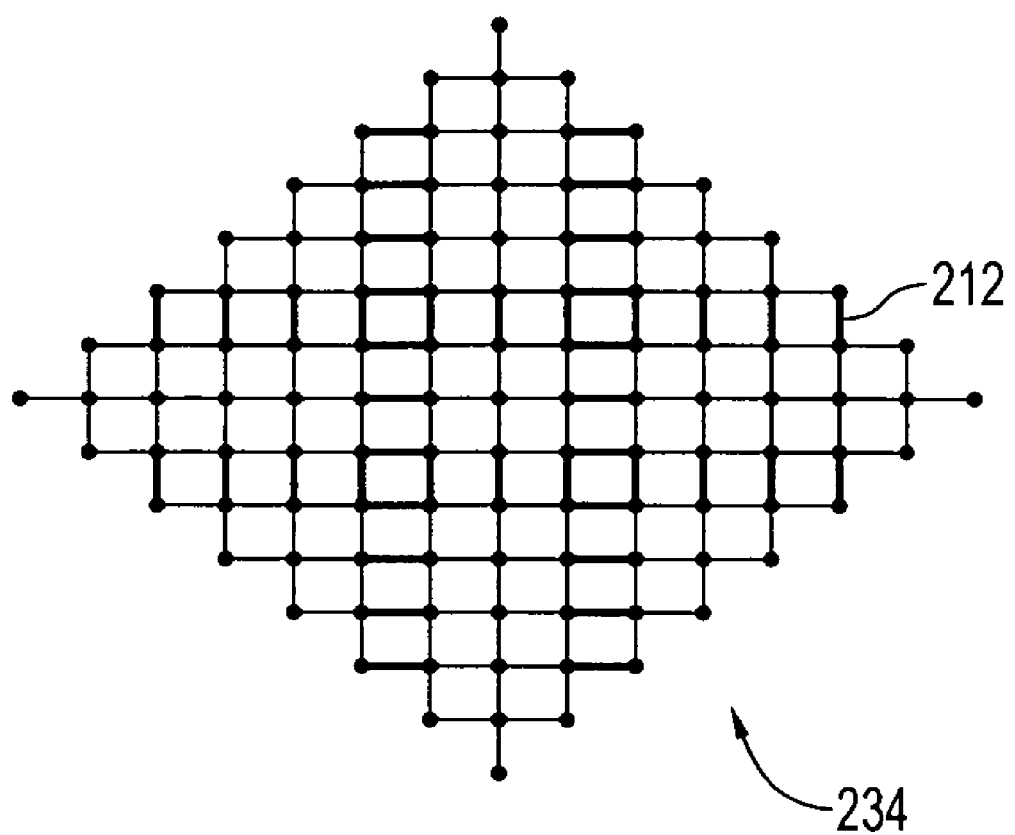

As shown in FIGS. 77A-77C, the meshes with symmetrical structures produce different flow congestion patterns from n×n meshes. FIGS. 77A-77C illustrate the flow congestion patterns of a level 6 hexagonal mesh 230, a level 3 octagonal mesh 232, and a level 8 diamond mesh 234, respectively. The cut edges 212 are marked using bold lines. The symmetrical meshes 230, 232, 234 display a more evenly distributed congestion pattern than n×n meshes. The middle cut lines do not exist any more.

The following exemplary benefits are thus revealed via the MCF algorithm of a preferred embodiment of the present invention:

For uniform capacity mesh, the congested edges 212 lie in the center rows and columns. The total throughput of each node 186 is inversely proportional to the dimension of the mesh.

The re-arrangement of capacities between different columns or rows will not improve the throughput if the total capacity of the columns or rows is kept constant.

A flexible chip shape provides a throughput improvement of about 30% over a square chip of equal area.

A 45° mesh structure 190 produces about 17% more throughput over a 90° mesh 180 for a processor array of 144 nodes.

A mixture of 90° and 45° mesh structures 192 can achieve an additional 30% throughput To achieve maximum throughput, the ratio of resources allocated to the 45° routing layers versus those to the 90° routing layers approaches 5.6 as the number of nodes 186 increases.

In the 90° and 45° mixed routing, interleaving the diagonal routing layer and the Manhattan routing layers can reduce the number of vias and hence increase the communication throughput.

Interconnect length has a significant impact on virtually every-important measure of chip quality. From the physical point of view, decreasing interconnect length directly reduces the resistance and capacitance of the interconnect, thus improving the performance and power consumption of the circuits. From a designer's point of view, shorter total interconnect length produces less routing congestion on the chip, and therefore improving the routability and signal integrity of the design. At the same time, from a manufacturing perspective, shortening the interconnect length can improve the manufacturability and reliability of the chip.

Because of its highly limited freedom for choosing routing directions, Manhattan architecture adds a significant amount of interconnect length versus the Euclidean optimum. Allowing more routing directions has been found to shorten the total interconnect length. Previously, researchers have studied the impact of using different interconnect architecture on the interconnect length. Many of these efforts have involved constructing the Steiner routing trees under different routing direction restriction. However, due to the inherent difficulty of the Steiner minimum tree problem, a significant amount of time has been spent developing heuristics for construction Steiner trees for a randomly generated net, and for statistically calculating the average interconnect length for different interconnect architectures.

An additional embodiment of the present invention derives a quantitative comparison of interconnect lengths needed to connect a two pin net using different interconnect architectures. To generalize the non-rectilinear routing structure, the concept of λ-geometry has been introduced. λ represents a number of possible routing directions. In λ-geometry, interconnects with angles iπ/λ, for all i are allowed, where λ is a positive integer. λ=2, 3, 4 correspond to the Manhattan architecture, Y-architecture, and X-architecture, respectively.

The derivation adheres to the following rules:

(1) In λ-geometry, given two points A and B, if AB are not on any of the x feasible routing directions, then the shortest path connecting AB consists of two segments AC and CB, where the angle between AC and CB is $(1-1/\lambda)\pi$.

(2) Let A, B be any two points on the place, $r_e$ be the Euclidean distance between A and B, and $r_\lambda$ be the length of the shortest interconnect to connect AB in λ-geometry, then $$\max_{A,B} \frac{r_e}{r_\lambda} = \csc\left(\left(\frac{\lambda-1}{2\lambda}\right)\pi\right).$$

(3) Let A, B be two random points on the plane, $r_e$ be the expected Euclidean distance between A and B, and $r_\lambda$ be the expected length of the shortest interconnect to connect AB in λ-geometry, then $$r_\lambda = \frac{2\lambda(1-\cos(\pi/\lambda))}{\pi\sin(\pi/\lambda)} r_e.$$

Rule (1) provides that, in order to connect two pins with the shortest interconnect, there is at most one turn on the path, and it is desirable to maximize the angle between two segments of the path for the given interconnect architecture. For different interconnection architectures, Rule (2) determines the worst-case amount of additional interconnect length cost versus the Euclidean distance. For example, for Manhattan architecture, in the worst case, the interconnect length is 41.2% longer that the Euclidean distance. For Y-architecture and X-architecture, respectively, the additional interconnect length is at most 15.47% and 8.23%.

Rule (3) determines the average interconnect length of a two pin net using different interconnection architectures. For Manhattan architecture, the average interconnect length is 27.32% longer than its Euclidean distance. For Y-architecture, the average interconnect length is 10.27% longer than its Euclidean distance. The X-architecture further reduces the average interconnect length to be within 5.48% of the Euclidean optimum and it produces 4.3% interconnect length reduction over Y-architecture, but with the added cost of one more routing direction.

A novel non-blocking hierarchical interconnect architecture, Y-architecture, has been shown and described herein. The hexagonal cell arrays employed in Y-architecture have the property of hierarchical expansion and therefore non-blocking hierarchical interconnect architectures can be set up on them. According to an objective function also provided herein to balance interconnects resources and performance, it is shown that Y-architecture preferably is only 7% less effective than X-architecture. Because the distribution of hexagonal cells has the same pattern as that of the base stations of wireless communication systems, the architecture provided herein can also be used to optimize wireless systems, for example.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the invention are set forth in the appended claims.

The invention claimed is:

1. A chip comprising:
an array of hexagonal cells;
a plurality of interconnects including a plurality of Y's, each of the Y's respectively connecting the cells in clusters of three cells each, wherein the cells within the clusters are interconnected;
wherein the Y connecting each cluster has a node and three interconnects, each of the three interconnects having an end that connects the node to a respective one of the cells within a cluster;
wherein each Y connects each cell of its respective cell group to the node.

2. A chip comprising:
an array of hexagonal cells;
a plurality of interconnects including a plurality of Y's, each of the Y's respectively connecting the cells in clusters of three cells each, wherein the cells within the clusters are interconnected;
wherein the Y connecting each cluster has a node and three interconnects connecting the node to respective ones of the cells within a cluster;
wherein each Y connects each cell of its respective cell group to the node;
wherein the plurality of interconnects are formed on a plurality of levels, wherein nodes of Y's connecting clusters of a lower level are interconnected by Y's of a higher level.

3. The chip of claim 2 wherein each of the Y's on a particular level is oriented in a direction that is rotated by 90° from the Y's on a next lower level and is rotated by 90° from the Y's on a next higher level.

4. The chip of claim 1 wherein the chip has a shape of a convex polygon having at least five sides.

5. The chip of claim 4 wherein the polygon is symmetrical to directions of the interconnect.

6. The chip of claim 1 wherein each of the clusters comprises three cells arranged and routed in three symmetrical directions.

7. The chip of claim 3 wherein all cells are interconnected to other cells.

8. A chip comprising:
an array of hexagonal cells;
a plurality of interconnects including a plurality of Y's, each of the Y's respectively connecting the cells in clusters of thee cells each, wherein the cells within the clusters are interconnected;
wherein each of the array of hexagonal cells includes a terminal for connecting to another cell;
wherein the Y connecting each cluster includes a node and three interconnects, each of the interconnects respectively connecting the node to a separate terminal in each of the thee cells within the cluster;
wherein each Y connects each cell of its respective cluster of thee cells to the node.

9. The chip of claim 1 wherein said array of hexagonal cells provides a hexagonal flow congestion pattern that does not include the center of the hexagonal pattern.

10. A chip comprising:
an array of hexagonal cells;
a plurality of interconnects including Y's connecting the cells in clusters of three adjacent cells each, wherein the cells in the clusters are interconnected; wherein the Y connecting each cluster has a node and three interconnects each of the interconnects having an end connecting the node to a respective one of the cells within a cluster;
wherein each Y connects each cell of its respective cell group to the node.

11. A chip comprising:
an array of hexagonal cells;
a plurality of interconnects including Y's connecting the cells in clusters of three adjacent cells each, wherein the cells in the clusters are interconnected;
wherein the Y connecting each cluster has a node and three interconnects connecting the node to respective ones of the cells within a cluster;
wherein each Y connects each cell of its respective cell group to the node;
wherein the plurality of interconnects are formed on a plurality of levels, wherein nodes of Y's connecting clusters of a lower level are interconnected by Y's of a higher level.

12. The chip of claim 11 wherein each of the Y's on a particular level is oriented in a direction that is rotated by 90° from the Y's on a next lower level and is rotated by 90° from the Y's on a next higher level.

* * * * *

UNITED STATES PATENT AND TRADEMARK OFFICE
CERTIFICATE OF CORRECTION

PATENT NO. : 7,622,779 B2
APPLICATION NO. : 10/526523
DATED : November 24, 2009
INVENTOR(S) : Cheng et al.

It is certified that error appears in the above-identified patent and that said Letters Patent is hereby corrected as shown below:

In the Specification:

| | |
|---|---|
| Col. 10, line 6 | Delete "(0,3)" and insert --(0,-3)-- in its place. |
| Col. 12, line 5 | After "adjust)" insert on a new blank line: |

-- $C = \hat{1}01110011011110101101$ --

| | |
|---|---|
| Col. 13, line 18 | Delete "its own, 90°" and insert --its own 90°-- in its place. |
| Col. 15, line 25 | Delete "αin the table" and insert --α in the table-- in its place. |
| Col. 17, line 4 | Delete "450" and insert --45°-- in its place. |
| Col. 20, ll. 21-22 | Delete "1 (n, n-2)" and insert --I (n, n-2)-- in its place. |
| Col. 22, line 22 | Delete " $(f\check{i}\check{j} - f\check{i}\check{j})$ " and insert -- $(f\;\check{j}\check{i} - f\check{i}\check{j})$ -- in its place. |
| Col. 23, line 18 | Delete "$\epsilon$, a" and insert --$\varepsilon$, a-- in its place. |
| Col. 23, line 19 | Delete "(1+$\epsilon$)" and insert --(1+$\varepsilon$)-- in its place. |
| Col. 23, line 37 | Delete "1 - $\epsilon$" and insert --1 - $\varepsilon$-- in its place. |
| Col. 23, line 38 | Delete "(1+$\Delta^{30}$" and insert --(1+$\Delta^{+}$-- in its place. |
| Col. 23, line 39 | Delete "$\epsilon$/2N" and insert --$\varepsilon$/2N-- in its place. |
| Col. 23, line 40 | Delete " $\Delta + (1/\hat{z}\epsilon, /2N)$ " and insert -- $\Delta^{*}(1/\hat{z}\varepsilon, /2N)$ -- in its place. |
| Col. 23, line 42 | Delete "$\epsilon$/2N" and insert --$\varepsilon$/2N-- in its place. |
| Col. 24, line 17 | Delete "$c_{vk} = n$" and insert --$c_{Vk} = n$-- in its place. |
| Col. 24, line 49 | Delete "$e_{ij}=1$" and insert --$e_{ij}=1$-- in its place. |
| Col. 26, line 9 | Delete "cost de" and insert --cost $d_e$-- in its place. |
| Col. 26, line 15 | Delete "(1+$\epsilon$)" and insert --(1+$\varepsilon$)-- in its place. |
| Col. 26, line 17 | Delete "preffered" and insert --preferred-- in its place. |
| Col. 26, line 32 | Delete "error $\epsilon$." and insert --error $\varepsilon$.-- in its place. |
| Col. 26, line 52 | Delete "Node na" and insert --Node $n_a$-- in its place. |
| Col. 27, line 4 | Delete "seven-by-seven" and insert --7 × 7-- in its place. |

Signed and Sealed this

Thirteenth Day of July, 2010

David J. Kappos
*Director of the United States Patent and Trademark Office*

CERTIFICATE OF CORRECTION (continued)
U.S. Pat. No. 7,622,779 B2

| | |
|---|---|
| Col. 27, ll. 6-7 | Delete "seven-by-seven" and insert --7 × 7-- in its place. |
| Col. 27, line 9 | Delete "seven-by-seven" and insert --7 × 7-- in its place. |
| Col. 31, line 30 | Delete "x feasible" and insert --$\lambda$ feasible-- in its place. |

<u>In the Claims</u>:

| | |
|---|---|
| Col. 33, line 7, Claim 8 | Delete "thee cells" and insert --three cells-- in its place. |
| Col. 33, line 14, Claim 8 | Delete "thee cells" and insert --three cells-- in its place. |
| Col. 33, line 16, Claim 8 | Delete "thee cells" and insert --three cells-- in its place. |
| Col. 33, line 24, Claim 10 | After "interconnected;" and before "wherein the Y" insert an indented paragraph. |
| Col. 34, ll. 1-2, Claim 10 | After "interconnects" and before "each" insert --,--. |